US00RE51062E

(19) United States
(12) Reissued Patent
Uzoh et al.

(10) Patent Number: US RE51,062 E
(45) **Date of Reissued Patent: *Oct. 6, 2026**

(54) MULTIPLE PLATED VIA ARRAYS OF DIFFERENT WIRE HEIGHTS ON A SAME SUBSTRATE

(71) Applicant: Adeia Semiconductor Technologies LLC, San Jose, CA (US)

(72) Inventors: Cyprian Emeka Uzoh, San Jose, CA (US); Rajesh Katkar, Milpitas, CA (US)

(73) Assignee: Adeia Semiconductor Technologies LLC, San Jose, CA (US)

( * ) Notice: This patent is subject to a terminal disclaimer.

(21) Appl. No.: 18/617,350

(22) Filed: Mar. 26, 2024

Related U.S. Patent Documents

Reissue of:
(64) Patent No.: 10,629,567
Issued: Apr. 21, 2020
Appl. No.: 16/245,116
Filed: Jan. 10, 2019

U.S. Applications:
(63) Continuation of application No. 17/725,442, filed on Apr. 20, 2022, now Pat. No. Re. 49,987, which is an
(Continued)

(51) Int. Cl.
*H10W 90/00* (2026.01)
*B81B 7/00* (2006.01)
(Continued)

(52) U.S. Cl.
CPC ..... *H10W 90/00* (2026.01); *B81B 7/0074* (2013.01); *B81C 1/0023* (2013.01); *H10D 1/20* (2025.01);
(Continued)

(58) Field of Classification Search
CPC ..... H01L 24/85; H01L 25/0657
See application file for complete search history.

(56) References Cited

U.S. PATENT DOCUMENTS 2,230,663 A 2/1941 Alden
3,289,452 A 12/1966 Koellner
(Continued)

FOREIGN PATENT DOCUMENTS

CN 1352804 A 6/2002
CN 1641832 A 7/2005
(Continued)

OTHER PUBLICATIONS

European Search Report for Appin. No. EP12712792, dated Feb. 27, 2018, 2 pages.
(Continued)

*Primary Examiner* — Christina Y. Leung
(74) *Attorney, Agent, or Firm* — HG Law LLP

(57) ABSTRACT

Apparatus(es) and method(s) relate generally to via arrays on a substrate. In one such apparatus, the substrate has a conductive layer. First plated conductors are in a first region extending from a surface of the conductive layer. Second plated conductors are in a second region extending from the surface of the conductive layer. The first plated conductors and the second plated conductors are external to the first substrate. The first region is disposed at least partially within the second region. The first plated conductors are of a first height. The second plated conductors are of a second height greater than the first height. A second substrate is coupled to first ends of the first plated conductors. The second substrate has at least one electronic component coupled thereto. A die is coupled to second ends of the second plated conductors. The die is located over the at least one electronic component.

20 Claims, 20 Drawing Sheets

Related U.S. Application Data application for the reissue of Pat. No. 10,629,567, which is a continuation of application No. 16/008,531, filed on Jun. 14, 2018, now Pat. No. 10,290,613, which is a continuation of application No. 15/430,943, filed on Feb. 13, 2017, now Pat. No. 10,026,717, which is a continuation of application No. 14/841,381, filed on Aug. 31, 2015, now Pat. No. 9,583,456, which is a continuation-in-part of application No. 14/087,252, filed on Nov. 22, 2013, now Pat. No. 9,263,394.

(51) Int. Cl.

| | |
|---|---|
| ***B81C 1/00*** | (2006.01) |
| ***H10D 1/20*** | (2025.01) |
| ***H10D 1/47*** | (2025.01) |
| ***H10D 1/68*** | (2025.01) |
| ***H10W 20/20*** | (2026.01) |
| ***H10W 20/40*** | (2026.01) |
| ***H10W 40/22*** | (2026.01) |
| ***H10W 40/70*** | (2026.01) |
| ***H10W 70/05*** | (2026.01) |
| ***H10W 70/60*** | (2026.01) |
| ***H10W 70/63*** | (2026.01) |
| ***H10W 70/652*** | (2026.01) |
| ***H10W 70/66*** | (2026.01) |
| ***H10W 70/685*** | (2026.01) |
| ***H10W 72/00*** | (2026.01) |
| ***H10W 72/20*** | (2026.01) |
| ***H10W 72/29*** | (2026.01) |
| ***H10W 72/59*** | (2026.01) |
| *H10W 72/30* | (2026.01) |
| *H10W 72/50* | (2026.01) |
| *H10W 72/90* | (2026.01) |
| *H10W 74/00* | (2026.01) |
| *H10W 90/20* | (2026.01) |
| *H10W 90/22* | (2026.01) |
| *H10W 90/24* | (2026.01) |
| *H10W 90/28* | (2026.01) |

(52) U.S. Cl.

CPC ..... *H10D 1/47* (2025.01); *H10D 1/68* (2025.01); *H10W 20/20* (2026.01); *H10W 20/40* (2026.01); *H10W 40/22* (2026.01); *H10W 40/70* (2026.01); *H10W 70/093* (2026.01); *H10W 70/611* (2026.01); *H10W 70/685* (2026.01); *H10W 90/701* (2026.01); *H10W 70/63* (2026.01); *H10W 70/6528* (2026.01); *H10W 70/66* (2026.01); *H10W 72/012* (2026.01); *H10W 72/01225* (2026.01); *H10W 72/01235* (2026.01); *H10W 72/01255* (2026.01); *H10W 72/019* (2026.01); *H10W 72/01923* (2026.01); *H10W 72/01925* (2026.01); *H10W 72/01935* (2026.01); *H10W 72/01938* (2026.01); *H10W 72/01953* (2026.01); *H10W 72/01955* (2026.01); *H10W 72/0198* (2026.01); *H10W 72/072* (2026.01); *H10W 72/07236* (2026.01); *H10W 72/07254* (2026.01); *H10W 72/07352* (2026.01); *H10W 72/07354* (2026.01); *H10W 72/07552* (2026.01); *H10W 72/222* (2026.01); *H10W 72/227* (2026.01); *H10W 72/241* (2026.01); *H10W 72/242* (2026.01); *H10W 72/244* (2026.01); *H10W 72/245* (2026.01); *H10W 72/247* (2026.01); *H10W 72/248* (2026.01); *H10W 72/252* (2026.01); *H10W 72/255* (2026.01); *H10W 72/29* (2026.01); *H10W 72/327* (2026.01); *H10W 72/347* (2026.01); *H10W 72/527* (2026.01); *H10W 72/5525* (2026.01); *H10W 72/59* (2026.01); *H10W 72/823* (2026.01); *H10W 72/853* (2026.01); *H10W 72/877* (2026.01); *H10W 72/884* (2026.01); *H10W 72/923* (2026.01); *H10W 72/9415* (2026.01); *H10W 72/942* (2026.01); *H10W 72/952* (2026.01); *H10W 74/00* (2026.01); *H10W 90/22* (2026.01); *H10W 90/24* (2026.01); *H10W 90/28* (2026.01); *H10W 90/297* (2026.01); *H10W 90/722* (2026.01); *H10W 90/724* (2026.01); *H10W 90/728* (2026.01); *H10W 90/732* (2026.01); *H10W 90/752* (2026.01); *H10W 90/754* (2026.01)

(56) References Cited

U.S. PATENT DOCUMENTS

| | | | |
|---|---|---|---|
| 3,358,897 | A | 12/1967 | Christensen |
| 3,430,835 | A | 3/1969 | Grable et al. |
| 3,623,649 | A | 11/1971 | Keisling |
| 3,795,037 | A | 3/1974 | Luttmer |
| 3,900,153 | A | 8/1975 | Beerwerth et al. |
| 4,067,104 | A | 1/1978 | Tracy |
| 4,072,816 | A | 2/1978 | Gedney et al. |
| 4,213,556 | A | 7/1980 | Persson et al. |
| 4,327,860 | A | 5/1982 | Kirshenboin et al. |
| 4,422,568 | A | 12/1983 | Elles et al. |
| 4,437,604 | A | 3/1984 | Razon et al. |
| 4,604,644 | A | 8/1986 | Beckham et al. |
| 4,642,889 | A | 2/1987 | Grabbe |
| 4,667,267 | A | 5/1987 | Hernandez et al. |
| 4,695,870 | A | 9/1987 | Patraw |
| 4,716,049 | A | 12/1987 | Patraw |
| 4,725,692 | A | 2/1988 | Ishii et al. |
| 4,771,930 | A | 9/1988 | Gillotti et al. |
| 4,793,814 | A | 12/1988 | Zifcak et al. |
| 4,804,132 | A | 2/1989 | DiFrancesco |
| 4,845,354 | A | 7/1989 | Gupta et al. |
| 4,902,600 | A | 2/1990 | Tamagawa et al. |
| 4,924,353 | A | 5/1990 | Patraw |
| 4,925,083 | A | 5/1990 | Farassat et al. |
| 4,955,523 | A | 9/1990 | Carlommagno et al. |
| 4,975,079 | A | 12/1990 | Beaman et al. |
| 4,982,265 | A | 1/1991 | Watanabe et al. |
| 4,998,885 | A | 3/1991 | Beaman et al. |
| 4,999,472 | A | 3/1991 | Neinast et al. |
| 5,067,007 | A | 11/1991 | Otsuka et al. |
| 5,067,382 | A | 11/1991 | Zimmerman et al. |
| 5,083,697 | A | 1/1992 | DiFrancesco |
| 5,095,187 | A | 3/1992 | Gliga |
| 5,133,495 | A | 7/1992 | Angulas et al. |
| 5,138,438 | A | 8/1992 | Masayuki et al. |
| 5,148,265 | A | 9/1992 | Khandros et al. |
| 5,148,266 | A | 9/1992 | Khandros et al. |
| 5,186,381 | A | 2/1993 | Kim |
| 5,189,505 | A | 2/1993 | Bartelink |
| 5,196,726 | A | 3/1993 | Nishiguchi et al. |
| 5,203,075 | A | 4/1993 | Angulas et al. |
| 5,214,308 | A | 5/1993 | Nishiguchi et al. |
| 5,220,489 | A | 6/1993 | Barreto et al. |
| 5,222,014 | A | 6/1993 | Lin |
| 5,238,173 | A | 8/1993 | Ura et al. |
| 5,241,454 | A | 8/1993 | Ameen et al. |
| 5,241,456 | A | 8/1993 | Marcinkiewicz et al. |
| 5,316,788 | A | 5/1994 | Dibble et al. |
| 5,340,771 | A | 8/1994 | Rostoker |
| 5,346,118 | A | 9/1994 | Degani et al. |
| 5,371,654 | A | 12/1994 | Beaman et al. |
| 5,397,997 | A | 3/1995 | Tuckerman et al. |
| 5,438,224 | A | 8/1995 | Papageorge et al. |
| 5,455,390 | A | 10/1995 | DiStefano et al. |

(56) References Cited

U.S. PATENT DOCUMENTS 5,468,995 A 11/1995 Higgins, III
5,476,211 A 12/1995 Khandros
5,494,667 A 2/1996 Uchida et al.
5,495,667 A 3/1996 Farnworth et al.
5,518,964 A 5/1996 DiStefano et al.
5,531,022 A 7/1996 Beaman et al.
5,536,909 A 7/1996 DiStefano et al.
5,541,567 A 7/1996 Fogel et al.
5,571,428 A 11/1996 Nishimura et al.
5,578,869 A 11/1996 Hoffman et al.
5,608,265 A 3/1997 Kitano et al.
5,615,824 A 4/1997 Fjelstad et al.
5,616,952 A 4/1997 Nakano et al.
5,635,846 A 6/1997 Beaman et al.
5,656,550 A 8/1997 Tsuji et al.
5,659,952 A 8/1997 Kovac et al.
5,679,977 A 10/1997 Khandros et al.
5,688,716 A 11/1997 DiStefano et al.
5,718,361 A 2/1998 Braun et al.
5,726,493 A 3/1998 Yamashita et al.
5,731,709 A 3/1998 Pastore et al.
5,736,780 A 4/1998 Murayama
5,736,785 A 4/1998 Chiang et al.
5,766,987 A 6/1998 Mitchell et al.
5,787,581 A 8/1998 DiStefano et al.
5,801,441 A 9/1998 DiStefano et al.
5,802,699 A 9/1998 Fjelstad et al.
5,811,982 A 9/1998 Beaman et al.
5,821,763 A 10/1998 Beaman et al.
5,830,389 A 11/1998 Capote et al.
5,831,836 A 11/1998 Long et al.
5,839,191 A 11/1998 Economy et al.
5,854,507 A 12/1998 Miremadi et al.
5,874,781 A 2/1999 Fogal et al.
5,898,991 A 5/1999 Fogel et al.
5,908,317 A 6/1999 Heo
5,912,505 A 6/1999 Itoh et al.
5,948,533 A 9/1999 Gallagher et al.
5,953,624 A 9/1999 Bando et al.
5,971,253 A 10/1999 Gilleo et al.
5,973,391 A 10/1999 Bischoff et al.
5,977,618 A 11/1999 DiStefano et al.
5,977,640 A 11/1999 Bertin et al.
5,980,270 A 11/1999 Fjelstad et al.
5,989,936 A 11/1999 Smith et al.
5,994,152 A 11/1999 Khandros et al.
6,000,126 A 12/1999 Pai
6,002,168 A 12/1999 Bellaar et al.
6,032,359 A 3/2000 Carroll
6,038,136 A 3/2000 Weber
6,052,287 A 4/2000 Palmer et al.
6,054,337 A 4/2000 Solberg
6,054,756 A 4/2000 DiStefano et al.
6,077,380 A 6/2000 Hayes et al.
6,117,694 A 9/2000 Smith et al.
6,121,676 A 9/2000 Solberg
6,124,546 A 9/2000 Hayward et al.
6,133,072 A 10/2000 Fjelstad
6,145,733 A 11/2000 Streckfuss et al.
6,157,080 A 12/2000 Tamaki et al.
6,158,647 A 12/2000 Chapman et al.
6,164,523 A 12/2000 Fauty et al.
6,168,965 B1 1/2001 Malinovich et al.
6,177,636 B1 1/2001 Fjelstad
6,180,881 B1 1/2001 Isaak
6,194,250 B1 2/2001 Melton et al.
6,194,291 B1 2/2001 DiStefano et al.
6,202,297 B1 3/2001 Faraci et al.
6,206,273 B1 3/2001 Beaman et al.
6,208,024 B1 3/2001 DiStefano
6,211,572 B1 4/2001 Fjelstad et al.
6,211,574 B1 4/2001 Tao et al.
6,215,670 B1 4/2001 Khandros
6,218,728 B1 4/2001 Kimura
6,225,688 B1 5/2001 Kim et al.
6,238,949 B1 5/2001 Nguyen et al.
6,258,625 B1 7/2001 Brofman et al.
6,260,264 B1 7/2001 Chen et al.
6,262,482 B1 7/2001 Shiraishi et al.
6,268,662 B1 7/2001 Test et al.
6,295,729 B1 10/2001 Beaman et al.
6,300,780 B1 10/2001 Beaman et al.
6,303,997 B1 10/2001 Lee et al.
6,313,528 B1 11/2001 Solberg
6,316,838 B1 11/2001 Ozawa et al.
6,329,224 B1 12/2001 Nguyen et al.
6,332,270 B2 12/2001 Beaman et al.
6,334,247 B1 1/2002 Beaman et al.
6,358,627 B2 3/2002 Benenati et al.
6,362,520 B2 3/2002 DiStefano
6,362,525 B1 3/2002 Rahim
6,376,769 B1 4/2002 Chung
6,388,333 B1 5/2002 Taniguchi et al.
6,395,199 B1 5/2002 Krassowski et al.
6,399,426 B1 6/2002 Capote et al.
6,407,448 B2 6/2002 Chun
6,407,456 B1 6/2002 Ball
6,410,431 B2 6/2002 Bertin et al.
6,413,850 B1 7/2002 Ooroku et al.
6,439,450 B1 8/2002 Chapman et al.
6,458,411 B1 10/2002 Goossen et al.
6,469,260 B2 10/2002 Horiuchi et al.
6,469,373 B2 10/2002 Funakura et al.
6,472,743 B2 10/2002 Huang et al.
6,476,503 B1 11/2002 Imamura et al.
6,476,506 B1 11/2002 O'Connor
6,476,583 B2 11/2002 McAndrews
6,486,545 B1 11/2002 Glenn et al.
6,489,182 B2 12/2002 Kwon
6,489,676 B2 12/2002 Taniguchi et al.
6,495,914 B1 12/2002 Sekine et al.
6,507,104 B2 1/2003 Ho et al.
6,509,639 B1 1/2003 Lin
6,514,847 B1 2/2003 Ohsawa et al.
6,515,355 B1 2/2003 Jiang et al.
6,522,018 B1 2/2003 Tay et al.
6,526,655 B2 3/2003 Beaman et al.
6,531,784 B1 3/2003 Shim et al.
6,538,336 B1 3/2003 Secker et al.
6,545,228 B2 4/2003 Hashimoto
6,550,666 B2 4/2003 Chew et al.
6,555,918 B2 4/2003 Masuda et al.
6,560,117 B2 5/2003 Moon
6,563,205 B1 5/2003 Fogal et al.
6,563,217 B2 5/2003 Corisis et al.
6,573,458 B1 6/2003 Matsubara et al.
6,578,754 B1 6/2003 Tung
6,581,276 B2 6/2003 Chung
6,581,283 B2 6/2003 Sugiura et al.
6,624,653 B1 9/2003 Cram
6,630,730 B2 10/2003 Grigg
6,639,303 B2 10/2003 Siniaguine
6,647,310 B1 11/2003 Yi et al.
6,650,013 B2 11/2003 Yin et al.
6,653,170 B1 11/2003 Lin
6,684,007 B2 1/2004 Yoshimura et al.
6,686,268 B2 2/2004 Farnworth et al.
6,687,988 B1 2/2004 Sugiura et al.
6,693,363 B2 2/2004 Tay et al.
6,696,305 B2 2/2004 Kung et al.
6,699,730 B2 3/2004 Kim et al.
6,708,403 B2 3/2004 Beaman et al.
6,720,783 B2 4/2004 Satoh et al.
6,730,544 B1 5/2004 Yang
6,733,711 B2 5/2004 Durocher et al.
6,734,539 B2 5/2004 Degani et al.
6,734,542 B2 5/2004 Nakatani et al.
6,740,980 B2 5/2004 Hirose
6,740,981 B2 5/2004 Hosomi
6,741,085 B1 5/2004 Khandros et al.
6,746,894 B2 6/2004 Fee et al.
6,754,407 B2 6/2004 Chakravorty et al.
6,756,252 B2 6/2004 Nakanishi
6,756,663 B2 6/2004 Shiraishi et al.

(56) References Cited

U.S. PATENT DOCUMENTS 6,759,738 B1 7/2004 Fallon et al.
6,762,078 B2 7/2004 Shin et al.
6,765,287 B1 7/2004 Lin
6,774,317 B2 8/2004 Fjelstad
6,774,467 B2 8/2004 Horiuchi et al.
6,774,473 B1 8/2004 Shen
6,774,494 B2 8/2004 Arakawa
6,777,787 B2 8/2004 Shibata
6,777,797 B2 8/2004 Egawa
6,778,406 B2 8/2004 Eldridge et al.
6,780,746 B2 8/2004 Kinsman et al.
6,787,926 B2 9/2004 Chen et al.
6,790,757 B1 9/2004 Chittipeddi et al.
6,800,941 B2 10/2004 Lee et al.
6,812,575 B2 11/2004 Furusawa
6,815,257 B2 11/2004 Yoon et al.
6,825,552 B2 11/2004 Light et al.
6,828,665 B2 12/2004 Pu et al.
6,828,668 B2 12/2004 Smith et al.
6,844,619 B2 1/2005 Tago
6,856,235 B2 2/2005 Fjelstad
6,864,166 B1 3/2005 Yin et al.
6,867,499 B1 3/2005 Tabrizi
6,874,910 B2 4/2005 Sugimoto et al.
6,897,565 B2 5/2005 Pflughaupt et al.
6,900,530 B1 5/2005 Tsai
6,902,869 B2 6/2005 Appelt et al.
6,902,950 B2 6/2005 Ma et al.
6,906,408 B2 6/2005 Cloud et al.
6,908,785 B2 6/2005 Kim
6,909,181 B2 6/2005 Aiba et al.
6,917,098 B1 7/2005 Yamunan
6,930,256 B1 8/2005 Huemoeller et al.
6,933,598 B2 8/2005 Kamezos
6,933,608 B2 8/2005 Fujisawa
6,939,723 B2 9/2005 Corisis et al.
6,946,380 B2 9/2005 Takahashi
6,951,773 B2 10/2005 Ho et al.
6,962,282 B2 11/2005 Manansala
6,962,864 B1 11/2005 Jeng et al.
6,977,440 B2 12/2005 Pflughaupt et al.
6,979,599 B2 12/2005 Silverbrook
6,987,032 B1 1/2006 Fan et al.
6,989,122 B1 1/2006 Pham et al.
7,009,297 B1 3/2006 Chiang et al.
7,017,794 B2 3/2006 Nosaka
7,021,521 B2 4/2006 Sakurai et al.
7,045,884 B2 5/2006 Standing
7,051,915 B2 5/2006 Mutaguchi
7,052,935 B2 5/2006 Pai et al.
7,053,477 B2 5/2006 Kamezos et al.
7,053,485 B2 5/2006 Bang et al.
7,061,079 B2 6/2006 Weng et al.
7,061,097 B2 6/2006 Yokoi
7,067,911 B1 6/2006 Lin et al.
7,071,028 B2 7/2006 Koike et al.
7,071,547 B2 7/2006 Kang et al.
7,071,573 B1 7/2006 Lin
7,078,788 B2 7/2006 Vu et al.
7,078,822 B2 7/2006 Dias et al.
7,095,105 B2 8/2006 Cherukuri et al.
7,112,520 B2 9/2006 Lee et al.
7,115,986 B2 10/2006 Moon et al.
7,119,427 B2 10/2006 Kim
7,121,891 B2 10/2006 Cherian
7,138,722 B2 11/2006 Miyamoto et al.
7,170,185 B1 1/2007 Hogerton et al.
7,176,043 B2 2/2007 Haba et al.
7,176,506 B2 2/2007 Beroz et al.
7,176,559 B2 2/2007 Ho et al.
7,185,426 B1 3/2007 Hiner et al.
7,187,072 B2 3/2007 Fukutomi et al.
7,190,061 B2 3/2007 Lee
7,198,980 B2 4/2007 Jiang et al.
7,198,987 B1 4/2007 Warren et al.
7,205,670 B2 4/2007 Oyama
7,215,033 B2 5/2007 Lee et al.
7,216,794 B2 5/2007 Lange et al.
7,225,538 B2 6/2007 Eldridge et al.
7,227,095 B2 6/2007 Roberts et al.
7,229,906 B2 6/2007 Baninetz et al.
7,233,057 B2 6/2007 Hussa
7,242,081 B1 7/2007 Lee
7,246,431 B2 7/2007 Bang et al.
7,256,069 B2 8/2007 Akram et al.
7,259,445 B2 8/2007 Lau et al.
7,262,124 B2 8/2007 Fujisawa
7,262,506 B2 8/2007 Mess et al.
7,268,421 B1 9/2007 Lin
7,276,785 B2 10/2007 Bauer et al.
7,276,799 B2 10/2007 Lee et al.
7,287,322 B2 10/2007 Mathieu et al.
7,290,448 B2 11/2007 Shirasaka et al.
7,294,920 B2 11/2007 Chen et al.
7,294,928 B2 11/2007 Bang et al.
7,298,033 B2 11/2007 Yoo
7,301,770 B2 11/2007 Campbell et al.
7,307,348 B2 12/2007 Wood et al.
7,321,164 B2 1/2008 Hsu
7,323,767 B2 1/2008 James et al.
7,327,038 B2 2/2008 Kwon et al.
7,342,803 B2 3/2008 Inagaki et al.
7,344,917 B2 3/2008 Gautham
7,345,361 B2 3/2008 Malik et al.
7,355,289 B2 4/2008 Hess et al.
7,365,416 B2 4/2008 Kawabata et al.
7,368,924 B2 5/2008 Beaman et al.
7,371,676 B2 5/2008 Hembree
7,372,151 B1 5/2008 Fan et al.
7,378,726 B2 5/2008 Punzalan et al.
7,390,700 B2 6/2008 Gerber et al.
7,391,105 B2 6/2008 Yeom
7,391,121 B2 6/2008 Otremba
7,416,107 B2 8/2008 Chapman et al.
7,425,758 B2 9/2008 Corisis et al.
7,453,157 B2 11/2008 Haba et al.
7,456,091 B2 11/2008 Kuraya et al.
7,456,495 B2 11/2008 Pohl et al.
7,459,348 B2 12/2008 Saeki
7,462,936 B2 12/2008 Haba et al.
7,476,608 B2 1/2009 Craig et al.
7,476,962 B2 1/2009 Kim
7,485,562 B2 2/2009 Chua et al.
7,485,969 B2 2/2009 Corisis et al.
7,495,179 B2 2/2009 Kubota et al.
7,495,342 B2 2/2009 Beaman et al.
7,495,644 B2 2/2009 Hirakata
7,504,284 B2 3/2009 Ye et al.
7,504,716 B2 3/2009 Abbott
7,517,733 B2 4/2009 Camacho et al.
7,527,505 B2 5/2009 Murata
7,528,474 B2 5/2009 Lee
7,535,090 B2 5/2009 Furuyama et al.
7,537,962 B2 5/2009 Jang et al.
7,538,565 B1 5/2009 Beaman et al.
7,547,624 B2 6/2009 Tanaka
7,550,836 B2 6/2009 Chou et al.
7,560,360 B2 7/2009 Cheng et al.
7,564,116 B2 7/2009 Ahn et al.
7,576,415 B2 8/2009 Cha et al.
7,576,439 B2 8/2009 Craig et al.
7,578,422 B2 8/2009 Lange et al.
7,582,963 B2 9/2009 Gerber et al.
7,589,394 B2 9/2009 Kawano
7,592,638 B2 9/2009 Kim
7,595,548 B2 9/2009 Shirasaka et al.
7,605,479 B2 10/2009 Mohammed
7,612,638 B2 11/2009 Chung et al.
7,621,436 B2 11/2009 Mii et al.
7,625,781 B2 12/2009 Beer
7,629,695 B2 12/2009 Yoshimura et al.
7,633,154 B2 12/2009 Dai et al.
7,633,765 B1 12/2009 Scanlan et al.
7,642,133 B2 1/2010 Wu et al.

(56) References Cited

U.S. PATENT DOCUMENTS

| | | | |
|---|---|---|---|
| 7,646,102 | B2 | 1/2010 | Boon |
| 7,659,612 | B2 | 2/2010 | Hembree et al. |
| 7,659,617 | B2 | 2/2010 | Kang et al. |
| 7,663,226 | B2 | 2/2010 | Cho et al. |
| 7,670,940 | B2 | 3/2010 | Mizukoshi et al. |
| 7,671,457 | B1 | 3/2010 | Hiner et al. |
| 7,671,459 | B2 | 3/2010 | Corisis et al. |
| 7,675,152 | B2 | 3/2010 | Gerber et al. |
| 7,677,429 | B2 | 3/2010 | Chapman et al. |
| 7,682,960 | B2 | 3/2010 | Wen |
| 7,682,962 | B2 | 3/2010 | Hembree |
| 7,683,460 | B2 | 3/2010 | Heitzer et al. |
| 7,683,482 | B2 | 3/2010 | Nishida et al. |
| 7,692,931 | B2 | 4/2010 | Chong et al. |
| 7,696,631 | B2 | 4/2010 | Beaulieu et al. |
| 7,706,144 | B2 | 4/2010 | Lynch |
| 7,709,968 | B2 | 5/2010 | Damberg et al. |
| 7,719,122 | B2 | 5/2010 | Tsao et al. |
| 7,723,839 | B2 | 5/2010 | Yano et al. |
| 7,728,443 | B2 | 6/2010 | Hembree |
| 7,737,545 | B2 | 6/2010 | Fjelstad et al. |
| 7,750,483 | B1 | 7/2010 | Lin et al. |
| 7,757,385 | B2 | 7/2010 | Hembree |
| 7,759,782 | B2 | 7/2010 | Haba et al. |
| 7,777,238 | B2 | 8/2010 | Nishida et al. |
| 7,777,328 | B2 | 8/2010 | Enomoto |
| 7,777,351 | B1 | 8/2010 | Berry et al. |
| 7,780,064 | B2 | 8/2010 | Wong et al. |
| 7,781,877 | B2 | 8/2010 | Jiang et al. |
| 7,795,717 | B2 | 9/2010 | Goller |
| 7,800,233 | B2 | 9/2010 | Kawano et al. |
| 7,807,512 | B2 | 10/2010 | Lee et al. |
| 7,808,093 | B2 | 10/2010 | Kagaya et al. |
| 7,808,439 | B2 | 10/2010 | Yang et al. |
| 7,815,323 | B2 | 10/2010 | Saeki |
| 7,834,464 | B2 | 11/2010 | Meyer et al. |
| 7,838,334 | B2 | 11/2010 | Yu et al. |
| 7,842,541 | B1 | 11/2010 | Rusli et al. |
| 7,850,087 | B2 | 12/2010 | Hwang et al. |
| 7,851,259 | B2 | 12/2010 | Kim |
| 7,855,462 | B2 | 12/2010 | Boon et al. |
| 7,855,464 | B2 | 12/2010 | Shikano |
| 7,857,190 | B2 | 12/2010 | Takahashi et al. |
| 7,859,033 | B2 | 12/2010 | Brady |
| 7,872,335 | B2 | 1/2011 | Khan et al. |
| 7,876,180 | B2 | 1/2011 | Uchimura |
| 7,880,290 | B2 | 2/2011 | Park |
| 7,892,889 | B2 | 2/2011 | Howard et al. |
| 7,898,083 | B2 | 3/2011 | Castro |
| 7,901,989 | B2 | 3/2011 | Haba et al. |
| 7,902,644 | B2 | 3/2011 | Huang et al. |
| 7,902,652 | B2 | 3/2011 | Seo et al. |
| 7,910,385 | B2 | 3/2011 | Kweon et al. |
| 7,911,805 | B2 | 3/2011 | Haba |
| 7,919,846 | B2 | 4/2011 | Hembree |
| 7,919,871 | B2 | 4/2011 | Moon et al. |
| 7,923,295 | B2 | 4/2011 | Shim et al. |
| 7,923,304 | B2 | 4/2011 | Choi et al. |
| 7,928,552 | B1 | 4/2011 | Cho et al. |
| 7,932,170 | B1 | 4/2011 | Huemoeller et al. |
| 7,934,313 | B1 | 5/2011 | Lin et al. |
| 7,939,934 | B2 | 5/2011 | Haba et al. |
| 7,943,436 | B2 | 5/2011 | McElvain |
| 7,944,034 | B2 | 5/2011 | Gerber et al. |
| 7,956,456 | B2 | 6/2011 | Gurrum et al. |
| 7,960,843 | B2 | 6/2011 | Hedler et al. |
| 7,964,956 | B1 | 6/2011 | Bet-Shliemoun |
| 7,967,062 | B2 | 6/2011 | Campbell et al. |
| 7,974,099 | B2 | 7/2011 | Grajcar |
| 7,977,597 | B2 | 7/2011 | Roberts et al. |
| 7,990,711 | B1 | 8/2011 | Andry et al. |
| 7,994,622 | B2 | 8/2011 | Mohammed et al. |
| 8,004,074 | B2 | 8/2011 | Mori et al. |
| 8,004,093 | B2 | 8/2011 | Oh et al. |
| 8,008,121 | B2 | 8/2011 | Choi et al. |
| 8,012,797 | B2 | 9/2011 | Shen et al. |
| 8,017,437 | B2 | 9/2011 | Yoo et al. |
| 8,017,452 | B2 | 9/2011 | Ishihara et al. |
| 8,018,033 | B2 | 9/2011 | Moriya |
| 8,018,065 | B2 | 9/2011 | Lam |
| 8,020,290 | B2 | 9/2011 | Sheats |
| 8,021,907 | B2 | 9/2011 | Pagaila et al. |
| 8,035,213 | B2 | 10/2011 | Lee et al. |
| 8,039,316 | B2 | 10/2011 | Chi et al. |
| 8,039,960 | B2 | 10/2011 | Lin |
| 8,039,970 | B2 | 10/2011 | Yamamori et al. |
| 8,048,479 | B2 | 11/2011 | Hedler et al. |
| 8,053,814 | B2 | 11/2011 | Chen et al. |
| 8,053,879 | B2 | 11/2011 | Lee et al. |
| 8,053,906 | B2 | 11/2011 | Chang et al. |
| 8,058,101 | B2 | 11/2011 | Haba et al. |
| 8,063,475 | B2 | 11/2011 | Choi et al. |
| 8,071,424 | B2 | 12/2011 | Kang et al. |
| 8,071,431 | B2 | 12/2011 | Hoang et al. |
| 8,071,470 | B2 | 12/2011 | Khor et al. |
| 8,076,765 | B2 | 12/2011 | Chen et al. |
| 8,076,770 | B2 | 12/2011 | Kagaya et al. |
| 8,080,445 | B1 | 12/2011 | Pagaila |
| 8,084,867 | B2 | 12/2011 | Tang et al. |
| 8,092,734 | B2 | 1/2012 | Jiang et al. |
| 8,093,697 | B2 | 1/2012 | Haba et al. |
| 8,106,498 | B2 | 1/2012 | Shin et al. |
| 8,115,283 | B1 | 2/2012 | Bolognia et al. |
| 8,119,516 | B2 | 2/2012 | Endo |
| 8,120,054 | B2 | 2/2012 | Seo et al. |
| 8,120,186 | B2 | 2/2012 | Yoon |
| 8,138,584 | B2 | 3/2012 | Wang et al. |
| 8,143,141 | B2 | 3/2012 | Sun et al. |
| 8,143,710 | B2 | 3/2012 | Cho |
| 8,158,888 | B2 | 4/2012 | Shen et al. |
| 8,169,065 | B2 | 5/2012 | Kohl et al. |
| 8,174,119 | B2 | 5/2012 | Pendse |
| 8,183,682 | B2 | 5/2012 | Groenhuis et al. |
| 8,183,684 | B2 | 5/2012 | Nakazato |
| 8,193,034 | B2 | 6/2012 | Pagaila et al. |
| 8,194,411 | B2 | 6/2012 | Leung et al. |
| 8,198,716 | B2 | 6/2012 | Periaman et al. |
| 8,207,604 | B2 | 6/2012 | Haba et al. |
| 8,213,184 | B2 | 7/2012 | Knickerbocker |
| 8,217,502 | B2 | 7/2012 | Ko |
| 8,225,982 | B2 | 7/2012 | Pirkle et al. |
| 8,232,141 | B2 | 7/2012 | Choi et al. |
| 8,237,257 | B2 | 8/2012 | Yang |
| 8,258,010 | B2 | 9/2012 | Pagaila et al. |
| 8,258,015 | B2 | 9/2012 | Chow et al. |
| 8,263,435 | B2 | 9/2012 | Choi et al. |
| 8,264,091 | B2 | 9/2012 | Cho et al. |
| 8,269,335 | B2 | 9/2012 | Osumi |
| 8,278,746 | B2 | 10/2012 | Ding et al. |
| 8,288,854 | B2 | 10/2012 | Weng et al. |
| 8,293,580 | B2 | 10/2012 | Kim et al. |
| 8,299,368 | B2 | 10/2012 | Endo |
| 8,304,900 | B2 | 11/2012 | Jang et al. |
| 8,314,492 | B2 | 11/2012 | Egawa |
| 8,315,060 | B2 | 11/2012 | Morikita et al. |
| 8,318,539 | B2 | 11/2012 | Cho et al. |
| 8,319,338 | B1 | 11/2012 | Berry et al. |
| 8,324,633 | B2 | 12/2012 | McKenzie et al. |
| 8,330,272 | B2 | 12/2012 | Haba |
| 8,349,735 | B2 | 1/2013 | Pagaila et al. |
| 8,354,297 | B2 | 1/2013 | Pagaila et al. |
| 8,362,620 | B2 | 1/2013 | Pagani |
| 8,372,741 | B1 | 2/2013 | Co et al. |
| 8,390,108 | B2 | 3/2013 | Cho et al. |
| 8,390,117 | B2 | 3/2013 | Shimizu et al. |
| 8,395,259 | B2 | 3/2013 | Eun |
| 8,399,972 | B2 | 3/2013 | Hoang et al. |
| 8,404,520 | B1 | 3/2013 | Chau et al. |
| 8,409,922 | B2 | 4/2013 | Camacho et al. |
| 8,415,704 | B2 | 4/2013 | Ivanov et al. |
| 8,419,442 | B2 | 4/2013 | Horikawa et al. |
| 8,420,430 | B2 | 4/2013 | Chiu et al. |
| 8,435,899 | B2 | 5/2013 | Miyata et al. |
| 8,450,839 | B2 | 5/2013 | Corisis et al. |

(56) References Cited

U.S. PATENT DOCUMENTS 8,476,115 B2 7/2013 Choi et al.
8,476,770 B2 7/2013 Shao et al.
8,482,111 B2 7/2013 Haba
8,487,421 B2 7/2013 Sato et al.
8,492,201 B2 7/2013 Pagaila et al.
8,502,387 B2 8/2013 Choi et al.
8,507,297 B2 8/2013 Iida et al.
8,508,045 B2 8/2013 Khan et al.
8,518,746 B2 8/2013 Pagaila et al.
8,520,396 B2 8/2013 Schmidt et al.
8,525,214 B2 9/2013 Lin et al.
8,525,314 B2 9/2013 Haba et al.
8,525,318 B1 9/2013 Kim et al.
8,552,556 B1 10/2013 Kim et al.
8,558,379 B2 10/2013 Kwon
8,558,392 B2 10/2013 Chua et al.
8,564,141 B2 10/2013 Lee et al.
8,567,051 B2 10/2013 Val
8,569,892 B2 10/2013 Mori et al.
8,580,607 B2 11/2013 Haba
8,598,717 B2 12/2013 Masuda
8,618,646 B2 12/2013 Sasaki et al.
8,618,659 B2 12/2013 Sato et al.
8,624,374 B2 1/2014 Ding et al.
8,633,059 B2 1/2014 Do et al.
8,637,991 B2 1/2014 Haba
8,642,393 B1 2/2014 Yu et al.
8,646,508 B2 2/2014 Kawada
8,653,626 B2 2/2014 Lo et al.
8,653,668 B2 2/2014 Uno et al.
8,653,676 B2 2/2014 Kim et al.
8,659,164 B2 2/2014 Haba
8,664,780 B2 3/2014 Han et al.
8,669,646 B2 3/2014 Tabatabai et al.
8,670,261 B2 3/2014 Crisp et al.
8,680,662 B2 3/2014 Haba et al.
8,680,677 B2 3/2014 Wyland
8,680,684 B2 3/2014 Haba et al.
8,685,792 B2 4/2014 Chow et al.
8,686,570 B2 4/2014 Semmelmeyer et al.
8,697,492 B2 4/2014 Haba et al.
8,723,307 B2 5/2014 Jiang et al.
8,728,865 B2 5/2014 Haba et al.
8,729,714 B1 5/2014 Meyer
8,742,576 B2 6/2014 Thacker et al.
8,742,597 B2 6/2014 Nickerson
8,766,436 B2 7/2014 Delucca et al.
8,772,152 B2 7/2014 Co et al.
8,772,817 B2 7/2014 Yao
8,785,245 B2 7/2014 Kim
8,791,575 B2 7/2014 Oganesian et al.
8,791,580 B2 7/2014 Park et al.
8,796,135 B2 8/2014 Oganesian et al.
8,796,846 B2 8/2014 Lin et al.
8,802,494 B2 8/2014 Lee et al.
8,810,031 B2 8/2014 Chang et al.
8,811,055 B2 8/2014 Yoon
8,816,404 B2 8/2014 Kim et al.
8,816,505 B2 8/2014 Mohammed et al.
8,835,228 B2 9/2014 Mohammed
8,836,136 B2 9/2014 Chau et al.
8,836,140 B2 9/2014 Ma et al.
8,836,147 B2 9/2014 Uno et al.
8,841,765 B2 9/2014 Haba et al.
8,846,521 B2 9/2014 Sugizaki
8,847,376 B2 9/2014 Oganesian et al.
8,853,558 B2 10/2014 Gupta et al.
8,878,353 B2 11/2014 Haba et al.
8,881,086 B2 11/2014 McElvain
8,884,416 B2 11/2014 Lee et al.
8,893,380 B2 11/2014 Kim et al.
8,907,466 B2 12/2014 Haba
8,907,500 B2 12/2014 Haba et al.
8,912,651 B2 12/2014 Yu et al.
8,916,781 B2 12/2014 Haba et al.
8,922,005 B2 12/2014 Hu et al.
8,923,004 B2 12/2014 Low et al.
8,927,337 B2 1/2015 Haba et al.
8,937,309 B2 1/2015 England et al.
8,940,630 B2 1/2015 Damberg et al.
8,940,636 B2 1/2015 Pagaila et al.
8,946,757 B2 2/2015 Mohammed et al.
8,948,712 B2 2/2015 Chen et al.
8,963,339 B2 2/2015 He et al.
8,970,049 B2 3/2015 Karnezos
8,975,726 B2 3/2015 Chen
8,978,247 B2 3/2015 Yang et al.
8,981,559 B2 3/2015 Hsu et al.
8,987,132 B2 3/2015 Gruber et al.
8,988,895 B2 3/2015 Mohammed et al.
8,993,376 B2 3/2015 Camacho et al.
9,006,031 B2 4/2015 Camacho et al.
9,012,263 B1 4/2015 Mathew et al.
9,041,227 B2 5/2015 Chau et al.
9,054,095 B2 6/2015 Pagaila
9,082,763 B2 7/2015 Yu et al.
9,087,832 B2 7/2015 Huang et al.
9,093,435 B2 7/2015 Sato et al.
9,095,074 B2 7/2015 Haba et al.
9,105,483 B2 8/2015 Chau et al.
9,105,552 B2 8/2015 Yu et al.
9,117,811 B2 8/2015 Zohni
9,123,664 B2 9/2015 Haba
9,128,123 B2 9/2015 Liu et al.
9,136,254 B2 9/2015 Zhao et al.
9,142,586 B2 9/2015 Wang et al.
9,153,562 B2 10/2015 Haba et al.
9,167,710 B2 10/2015 Mohammed et al.
9,171,790 B2 10/2015 Yu et al.
9,177,832 B2 11/2015 Camacho
9,196,586 B2 11/2015 Chen et al.
9,196,588 B2 11/2015 Leal
9,209,081 B2 12/2015 Lim et al.
9,214,434 B1 12/2015 Kim et al.
9,224,647 B2 12/2015 Koo et al.
9,224,717 B2 12/2015 Sato et al.
9,258,922 B2 2/2016 Chen et al.
9,263,394 B2 2/2016 Uzoh et al.
9,263,413 B2 2/2016 Mohammed
9,299,670 B2 3/2016 Yap et al.
9,318,449 B2 4/2016 Hasch et al.
9,318,452 B2 4/2016 Chen et al.
9,324,696 B2 4/2016 Choi et al.
9,330,945 B2 5/2016 Song et al.
9,349,706 B2 5/2016 Co et al.
9,362,161 B2 6/2016 Chi et al.
9,373,527 B2 6/2016 Yu et al.
9,378,982 B2 6/2016 Lin et al.
9,379,074 B2 6/2016 Uzoh et al.
9,379,078 B2 6/2016 Yu et al.
9,401,338 B2 7/2016 Magnus et al.
9,405,064 B2 8/2016 Herbsommer et al.
9,412,661 B2 8/2016 Lu et al.
9,418,940 B2 8/2016 Hoshino et al.
9,418,971 B2 8/2016 Chen et al.
9,437,459 B2 9/2016 Carpenter et al.
9,443,797 B2 9/2016 Marimuthu et al.
9,449,941 B2 9/2016 Tsai et al.
9,461,025 B2 10/2016 Yu et al.
9,484,331 B2 11/2016 Paek et al.
9,496,152 B2 11/2016 Cho et al.
9,502,390 B2 11/2016 Caskey et al.
9,508,622 B2 11/2016 Higgins
9,559,088 B2 1/2017 Gonzalez et al.
9,570,382 B2 2/2017 Haba
9,583,456 B2 * 2/2017 Uzoh ..... H01L 28/40
9,601,454 B2 3/2017 Zhao et al.
9,653,428 B1 5/2017 Hiner
9,653,442 B2 5/2017 Yu et al.
9,659,877 B2 5/2017 Bakalski et al.
9,663,353 B2 5/2017 Ofner et al.
9,685,365 B2 6/2017 Mohammed
9,735,084 B2 8/2017 Katkar et al.
9,788,466 B2 10/2017 Chen

(56) References Cited

U.S. PATENT DOCUMENTS 9,812,402 B2 11/2017 Awujoola et al.
9,842,798 B2 12/2017 Marimuthu et al.
9,859,203 B2 1/2018 Kim et al.
9,871,599 B2 1/2018 Chen et al.
10,026,717 B2 * 7/2018 Uzoh ..... H01L 24/97
10,079,225 B2 9/2018 Lin et al.
10,115,671 B2 10/2018 Shenoy et al.
10,115,678 B2 10/2018 Awujoola et al.
10,181,457 B2 1/2019 Prabhu et al.
RE49,987 E * 5/2024 Uzoh ..... H10D 1/68
2001/0042925 A1 11/2001 Yamamoto et al.
2002/0014004 A1 2/2002 Beaman et al.
2002/0125556 A1 9/2002 Oh et al.
2002/0171152 A1 11/2002 Miyazaki
2003/0006494 A1 1/2003 Lee et al.
2003/0048108 A1 3/2003 Beaman et al.
2003/0057544 A1 3/2003 Nathan et al.
2003/0094666 A1 5/2003 Clayton et al.
2003/0162378 A1 8/2003 Mikami
2004/0041757 A1 3/2004 Yang et al.
2004/0262728 A1 12/2004 Sterrett et al.
2005/0017369 A1 1/2005 Clayton et al.
2005/0062492 A1 3/2005 Beaman et al.
2005/0082664 A1 4/2005 Funaba et al.
2005/0095835 A1 5/2005 Humpston et al.
2005/0161814 A1 7/2005 Mizukoshi et al.
2005/0173807 A1 8/2005 Zhu et al.
2005/0176233 A1 8/2005 Joshi et al.
2006/0087013 A1 4/2006 Hsieh
2006/0216868 A1 9/2006 Yang et al.
2006/0255449 A1 11/2006 Lee et al.
2007/0010086 A1 1/2007 Hsieh
2007/0080360 A1 4/2007 Mirsky et al.
2007/0164457 A1 7/2007 Yamaguchi et al.
2007/0190747 A1 8/2007 Hup
2007/0254406 A1 11/2007 Lee
2007/0271781 A9 11/2007 Beaman et al.
2007/0290325 A1 12/2007 Wu et al.
2008/0006942 A1 1/2008 Park et al.
2008/0017968 A1 1/2008 Choi et al.
2008/0023805 A1 1/2008 Howard et al.
2008/0042265 A1 2/2008 Merilo et al.
2008/0047741 A1 2/2008 Beaman et al.
2008/0048690 A1 2/2008 Beaman et al.
2008/0048691 A1 2/2008 Beaman et al.
2008/0048697 A1 2/2008 Beaman et al.
2008/0054434 A1 3/2008 Kim
2008/0073769 A1 3/2008 Wu et al.
2008/0100316 A1 5/2008 Beaman et al.
2008/0100317 A1 5/2008 Beaman et al.
2008/0100318 A1 5/2008 Beaman et al.
2008/0100324 A1 5/2008 Beaman et al.
2008/0105984 A1 5/2008 Lee et al.
2008/0106281 A1 5/2008 Beaman et al.
2008/0106282 A1 5/2008 Beaman et al.
2008/0106283 A1 5/2008 Beaman et al.
2008/0106284 A1 5/2008 Beaman et al.
2008/0106285 A1 5/2008 Beaman et al.
2008/0106291 A1 5/2008 Beaman et al.
2008/0106872 A1 5/2008 Beaman et al.
2008/0111568 A1 5/2008 Beaman et al.
2008/0111569 A1 5/2008 Beaman et al.
2008/0111570 A1 5/2008 Beaman et al.
2008/0112144 A1 5/2008 Beaman et al.
2008/0112145 A1 5/2008 Beaman et al.
2008/0112146 A1 5/2008 Beaman et al.
2008/0112147 A1 5/2008 Beaman et al.
2008/0112148 A1 5/2008 Beaman et al.
2008/0112149 A1 5/2008 Beaman et al.
2008/0116912 A1 5/2008 Beaman et al.
2008/0116913 A1 5/2008 Beaman et al.
2008/0116914 A1 5/2008 Beaman et al.
2008/0116915 A1 5/2008 Beaman et al.
2008/0116916 A1 5/2008 Beaman et al.
2008/0117611 A1 5/2008 Beaman et al.
2008/0117612 A1 5/2008 Beaman et al.
2008/0117613 A1 5/2008 Beaman et al.
2008/0121879 A1 5/2008 Beaman et al.
2008/0123310 A1 5/2008 Beaman et al.
2008/0123319 A1 5/2008 Wang
2008/0123320 A1 5/2008 Cheng
2008/0132094 A1 6/2008 Beaman et al.
2008/0156518 A1 7/2008 Honer et al.
2008/0164595 A1 7/2008 Wu et al.
2008/0169548 A1 7/2008 Baek
2008/0217708 A1 9/2008 Reisner et al.
2008/0246126 A1 10/2008 Bowles et al.
2008/0280393 A1 11/2008 Lee et al.
2008/0284045 A1 11/2008 Gerber et al.
2008/0303153 A1 12/2008 Oi et al.
2008/0308305 A1 12/2008 Kawabe
2009/0008796 A1 1/2009 Eng et al.
2009/0014876 A1 1/2009 Youn et al.
2009/0032913 A1 2/2009 Haba
2009/0085185 A1 4/2009 Byun et al.
2009/0091009 A1 4/2009 Corisis et al.
2009/0102063 A1 4/2009 Lee et al.
2009/0127686 A1 5/2009 Yang et al.
2009/0128176 A1 5/2009 Beaman et al.
2009/0140415 A1 6/2009 Furuta
2009/0166664 A1 7/2009 Park et al.
2009/0166873 A1 7/2009 Yang et al.
2009/0189288 A1 7/2009 Beaman et al.
2009/0194829 A1 8/2009 Chung et al.
2009/0256229 A1 10/2009 Ishikawa et al.
2009/0315579 A1 12/2009 Beaman et al.
2010/0032822 A1 2/2010 Liao et al.
2010/0044860 A1 2/2010 Haba et al.
2010/0078795 A1 4/2010 Dekker et al.
2010/0193937 A1 8/2010 Nagamatsu et al.
2010/0200981 A1 8/2010 Huang et al.
2010/0258955 A1 10/2010 Miyagawa et al.
2010/0289142 A1 11/2010 Shim et al.
2010/0314748 A1 12/2010 Hsu et al.
2010/0327419 A1 12/2010 Muthukumar et al.
2011/0042699 A1 2/2011 Park et al.
2011/0068478 A1 3/2011 Pagaila et al.
2011/0157834 A1 6/2011 Wang
2011/0209908 A1 9/2011 Lin et al.
2011/0215472 A1 9/2011 Chandrasekaran
2012/0001336 A1 1/2012 Zeng et al.
2012/0043655 A1 2/2012 Khor et al.
2012/0063090 A1 3/2012 Hsiao et al.
2012/0074585 A1 * 3/2012 Koo ..... H01L 23/147
257/774
2012/0080787 A1 4/2012 Shah et al.
2012/0086111 A1 4/2012 Iwamoto et al.
2012/0126431 A1 5/2012 Kim et al.
2012/0153444 A1 6/2012 Haga et al.
2012/0184116 A1 7/2012 Pawlikowski et al.
2012/0292745 A1 * 11/2012 Park ..... H01L 23/3128
257/E21.705
2013/0001797 A1 1/2013 Choi et al.
2013/0037963 A1 2/2013 Choi et al.
2013/0040423 A1 2/2013 Tung
2013/0049218 A1 2/2013 Gong et al.
2013/0071969 A1 * 3/2013 Vodrahalli ..... H01L 24/17
438/107
2013/0087915 A1 4/2013 Warren et al.
2013/0153646 A1 6/2013 Ho
2013/0200524 A1 8/2013 Han et al.
2013/0234317 A1 9/2013 Chen et al.
2013/0256847 A1 10/2013 Park et al.
2013/0323409 A1 12/2013 Read et al.
2014/0124949 A1 5/2014 Paek et al.
2014/0175657 A1 6/2014 Oka et al.
2014/0225248 A1 8/2014 Henderson et al.
2014/0239479 A1 8/2014 Start
2014/0239490 A1 8/2014 Wang
2014/0312503 A1 10/2014 Seo
2015/0076714 A1 3/2015 Haba et al.
2015/0130054 A1 5/2015 Lee et al.
2015/0340305 A1 11/2015 Lo
2015/0380376 A1 12/2015 Mathew et al.

(56) References Cited

U.S. PATENT DOCUMENTS

2016/0049377 A1* 2/2016 Kim ..... H01L 23/481
257/621
2018/0301436 A1* 10/2018 Uzoh ..... H01L 28/40
2019/0148344 A1* 5/2019 Uzoh ..... H01L 28/40

FOREIGN PATENT DOCUMENTS

| | | | |
|---|---|---|---|
| CN | 1877824 | A | 12/2006 |
| CN | 101409241 | A | 4/2009 |
| CN | 101449375 | A | 6/2009 |
| CN | 101675516 | A | 3/2010 |
| CN | 101819959 | A | 9/2010 |
| CN | 102324418 | A | 1/2012 |
| DE | 102009001461 | A1 | 9/2010 |
| EP | 320058 | | 6/1999 |
| EP | 920058 | | 6/1999 |
| EP | 1449414 | A1 | 8/2004 |
| EP | 2234158 | A1 | 9/2010 |
| JP | S51-050661 | | 5/1976 |
| JP | 59189069 | A | 10/1984 |
| JP | 31125062 | A | 6/1986 |
| JP | 61125062 | A | 6/1986 |
| JP | 362158338 | A | 7/1987 |
| JP | S62158338 | A | 7/1987 |
| JP | 62-226307 | | 10/1987 |
| JP | 32226307 | A | 10/1987 |
| JP | 1012769 | A | 1/1989 |
| JP | 64-71162 | | 3/1989 |
| JP | 3471162 | A | 3/1989 |
| JP | 1118364 | | 5/1989 |
| JP | 1118364 | A | 5/1989 |
| JP | H04-346436 | A | 12/1992 |
| JP | H104-346436 | A | 12/1992 |
| JP | 06268015 | A | 9/1994 |
| JP | H06268101 | A | 9/1994 |
| JP | H106268101 | A | 9/1994 |
| JP | H06333931 | A | 12/1994 |
| JP | H106333931 | A | 12/1994 |
| JP | 07-122787 | A | 5/1995 |
| JP | 09505439 | | 5/1997 |
| JP | H1065054 | A | 3/1998 |
| JP | H11065054 | A | 3/1998 |
| JP | H10135220 | A | 5/1998 |
| JP | H10135221 | A | 5/1998 |
| JP | H110135220 | A | 5/1998 |
| JP | H110135221 | A | 5/1998 |
| JP | 11-074295 | A | 3/1999 |
| JP | 11135663 | A | 5/1999 |
| JP | H11-145323 | A | 5/1999 |
| JP | H111145323 | A | 5/1999 |
| JP | 11251350 | A | 9/1999 |
| JP | H11260856 | A | 9/1999 |
| JP | H111260856 | A | 9/1999 |
| JP | 11317476 | | 11/1999 |
| JP | 2000156461 | A | 6/2000 |
| JP | 2000323516 | A | 11/2000 |
| JP | 3157134 | B2 | 4/2001 |
| JP | 2001196407 | A | 7/2001 |
| JP | 2001326236 | A | 11/2001 |
| JP | 2002050871 | A | 2/2002 |
| JP | 2002289769 | A | 10/2002 |
| JP | 2003122611 | A | 4/2003 |
| JP | 2003-1741124 | A | 6/2003 |
| JP | 2003174124 | A | 6/2003 |
| JP | 2003197668 | A | 7/2003 |
| JP | 2003307897 | A | 10/2003 |
| JP | 2003318327 | A | 11/2003 |
| JP | 2004031754 | A | 1/2004 |
| JP | 2004047702 | A | 2/2004 |
| JP | 2004048048 | A | 2/2004 |
| JP | 2004-172157 | A | 6/2004 |
| JP | 2004-200316 | | 7/2004 |
| JP | 2004281514 | A | 10/2004 |
| JP | 2004327855 | A | 11/2004 |
| JP | 2004327856 | A | 11/2004 |
| JP | 2004343030 | A | 12/2004 |
| JP | 2005011874 | A | 1/2005 |
| JP | 2005033141 | A | 2/2005 |
| JP | 2005093551 | A | 4/2005 |
| JP | 2905993551 | A | 4/2005 |
| JP | 2003377641 | A | 6/2005 |
| JP | 2005142378 | A | 6/2005 |
| JP | 2005175019 | A | 6/2005 |
| JP | 2003426392 | A | 7/2005 |
| JP | 2005183880 | A | 7/2005 |
| JP | 2005183923 | A | 7/2005 |
| JP | 2005203497 | A | 7/2005 |
| JP | 2005302765 | A | 10/2005 |
| JP | 2006108588 | A | 4/2006 |
| JP | 2006186086 | A | 7/2006 |
| JP | 2006344917 | | 12/2006 |
| JP | 2006344917 | A | 12/2006 |
| JP | 2007123595 | A | 5/2007 |
| JP | 2007-208159 | A | 8/2007 |
| JP | 2007194436 | A | 8/2007 |
| JP | 2007234845 | A | 9/2007 |
| JP | 2007287922 | A | 11/2007 |
| JP | 2007-335464 | | 12/2007 |
| JP | 2007335464 | A | 12/2007 |
| JP | 200834534 | A | 2/2008 |
| JP | 2008166439 | A | 7/2008 |
| JP | 2008171938 | A | 7/2008 |
| JP | 2008235378 | A | 10/2008 |
| JP | 2008251794 | A | 10/2008 |
| JP | 2008277362 | A | 11/2008 |
| JP | 2008306128 | A | 12/2008 |
| JP | 2009004650 | A | 1/2009 |
| JP | 2009044110 | A | 2/2009 |
| JP | 2009506553 | | 2/2009 |
| JP | 2009506553 | A | 2/2009 |
| JP | 2009508324 | A | 2/2009 |
| JP | 2009064966 | A | 3/2009 |
| JP | 2009088254 | A | 4/2009 |
| JP | 2009111384 | A | 5/2009 |
| JP | 2009528706 | A | 8/2009 |
| JP | 2009260132 | A | 11/2009 |
| JP | 2010103129 | A | 5/2010 |
| JP | 2010135671 | A | 6/2010 |
| JP | 2010192928 | A | 9/2010 |
| JP | 2010199528 | A | 9/2010 |
| JP | 2010206007 | A | 9/2010 |
| JP | 2011514015 | A | 4/2011 |
| JP | 2011166051 | A | 8/2011 |
| JP | 2004-319892 | A | 11/2014 |
| KR | 100265563 | A1 | 9/2000 |
| KR | 20010061849 | A | 7/2001 |
| KR | 2001-0094894 | A | 11/2001 |
| KR | 10-0393102 | | 7/2002 |
| KR | 20020058216 | A | 7/2002 |
| KR | 20060064291 | A | 6/2006 |
| KR | 10-2007-0058680 | A | 6/2007 |
| KR | 20070058680 | A | 6/2007 |
| KR | 20080020069 | A | 3/2008 |
| KR | 100865125 | B1 | 10/2008 |
| KR | 20080094251 | A | 10/2008 |
| KR | 100886100 | B1 | 2/2009 |
| KR | 20090033605 | A | 4/2009 |
| KR | 20090123680 | A | 12/2009 |
| KR | 20100033012 | A | 3/2010 |
| KR | 10-2010-0050750 | A | 5/2010 |
| KR | 20100050750 | A | 5/2010 |
| KR | 20100062315 | | 6/2010 |
| KR | 20100062315 | A | 6/2010 |
| KR | 101011863 | B1 | 1/2011 |
| KR | 20120075855 | A | 7/2012 |
| KR | 101215271 | B1 | 12/2012 |
| KR | 20130048810 | A | 5/2013 |
| KR | 20150012285 | A | 2/2015 |
| TW | 200539406 | A | 12/2005 |
| TW | 200721327 | A | 6/2007 |
| TW | 200810079 | A | 2/2008 |
| TW | 200849551 | A | 12/2008 |
| TW | 200933760 | A | 8/2009 |

(56) References Cited

FOREIGN PATENT DOCUMENTS

| | | | |
|---|---|---|---|
| TW | 201023277 | A | 6/2010 |
| TW | 201250979 | A | 12/2012 |
| TW | I605558 | B | 11/2017 |
| WO | 9615458 | A1 | 5/1996 |
| WO | 02-13256 | A1 | 2/2002 |
| WO | WO3213256 | A1 | 2/2002 |
| WO | 03-045123 | A1 | 5/2003 |
| WO | WO33045123 | A1 | 5/2003 |
| WO | 2004077525 | A2 | 9/2004 |
| WO | 2006050691 | A2 | 5/2006 |
| WO | WO2006050691 | A | 5/2006 |
| WO | 2007101251 | A2 | 9/2007 |
| WO | 2007116544 | A1 | 10/2007 |
| WO | 2008065896 | A1 | 6/2008 |
| WO | 2008120755 | A1 | 10/2008 |
| WO | 2009096950 | A1 | 8/2009 |
| WO | 2009158098 | A2 | 12/2009 |
| WO | 2010014103 | A1 | 2/2010 |
| WO | 2010041630 | A1 | 4/2010 |
| WO | 2010101163 | A1 | 9/2010 |
| WO | 2012067177 | A1 | 5/2012 |
| WO | 2013059181 | A1 | 4/2013 |
| WO | 2013065895 | A1 | 5/2013 |
| WO | 2014107301 | A1 | 7/2014 |

OTHER PUBLICATIONS

International Search Report and Written Opinion for Appin. No. PCT/US2017/064437, dated Mar. 29, 2018.
U.S. Appl. No. 13/477,532, mailed May 22, 2012.
US Office Action for U.S. Appl. No. 12/769,930, mailed May 5, 2011.
Written Opinion for Appin. No. PCT/US2014/050125, dated Jul. 15, 2015.
Yoon, PhD, Seung Wook, "Next Generation Wafer Level Packaging Solution for 3D Integration," May 2010, Stats 0hipPAC Ltd.
International Search Report and Written Opinion for Appin. No. PCT/US2016/056526, dated Jan. 20, 2017.
International Search Report and Written Opinion for Appin. No. PCT/US2016/056402, dated Jan. 31, 2017.
International Search Report and Written Opinion for Appin. No. PCT/US2016/068297, dated Apr. 17, 2017.
Japanese Office Action for Appin. No. 2013-509325, dated Oct. 18, 2013.
Japanese Office Action for Appin. No. 2013-520776, dated Apr. 21, 2015.
Japanese Office Action for Appin. No. 2013-520777, dated May 22, 2015.
Meiser, S., "Klein Und Komplex," Elektronik Id Press Ltd, DE, vol. 41, No. 1, Jan. 7, 1992 (Jan. 7, 1992) pp. 72-77, XP000277326, [ISR Appin. No. PCT/US2012/060402, dated Feb. 21, 2013 provides concise stmt. Of relevance).
North Corporation, Processed intra-Layer Interconnection Material for PWBs [Etched Copper Bump with Copper Foil], IMBITM, Version 2001.6, 1 p.
Partial International Search Report from Invitation to Pay Additional Fees for Appin. No. PCT/US2012/028738, dated Jun. 6, 2012.
Partial International Search Report for Appin. No. PCT/US2012/060402, dated Feb. 21, 2013.
Partial International Search Report for Appin. No. PCT/US2013/026126, dated Jun. 17, 2013.
Partial International Search Report for Appin. No. PCT/US2013/075672, dated Mar. 12, 2014.
Partial International Search Report for Appin. No. PCT/US2014/014181, dated May 8, 2014.
Partial International Search Report for Appin. No. PCT/US2015/032679, dated Sep. 4, 2015.
Partial International Search Report for Appin. No. PCT/US2015/033004, dated Sep. 9, 2015.
Brochure, "Invensas BVA PoP for Mobile Computing: Ultra High 1O Without TSVs," Invensas Corporation, Jun. 26, 2012,4 pages.
EE Times Asia "3D Plus Wafer Level Stack" [online] [Retrieved Aug. 5, 2010] Retrieved from intemet: <http://www. aetasia.com/ART_8800428222_280300_NT_DEC52276.htm>, 2 pages.
Extended European Search Report for Appin. No. EP13162975, dated Sep. 5, 2013.
Ghaffarian Ph.D., Reza et al., "Evaluation Methodology Guidance for Stack Packages," Jet Propulsion Laboratory, Califomia Institute of Technology, Pasadena, CA, NASA, Oct. 2009, 44 pages.
IBM et al., "Method of Producing Thin-Film Wirings with Vias," IBM Technical Disclosure Bulletin, Apr. 1, 1989, IBM 7,orp., (Thornwood), US-ISSN 0018-8689, vol. 31, No. 11, pp. 209-210, https://priorart.ip.com.
International Search Report for Appin. No. PCT/US2005/039716, dated Apr. 5, 2006.
International Search Report and Written Opinion for Appin. No. PCT/US2011/024143, dated Sep. 14, 2011.
International Search Report and Written Opinion for Appin. No. PCT/US2011/024143, dated Jan. 17, 2012.
International Search Report and Written Opinion for Appin. No. PCT/US2011/060551, dated Apr. 18, 2012.
International Search Report and Written Opinion for Appin. No. PCT/US2011/044342, dated May 7, 2012.
International Search Report and Written Opinion for Appin. No. PCT/US2011/044346, dated May 11, 2012.
International Search Report and Written Opinion for Appin. No. PCT/US2012/060402, dated Apr. 2, 2013.
International Search Report and Written Opinion for Appin. No. PCT/US2013/026126, dated Jul. 25, 2013.
International Search Report and Written Opinion for Appin. No. PCT/US2013/052883, dated Oct. 21, 2013.
International Search Report and Written Opinion for Appin. No. PCT/US2013/041981, dated Nov. 13, 2013.
International Search Report and Written Opinion for Appin. No. PCT/US2013/053437, dated Nov. 25, 2013.
International Search Report and Written Opinion for Appin. No. PCT/US2013/075672, dated Apr. 22, 2014.
International Search Report and Written Opinion for Appin. No. PCT/US2014/014181, dated Jun. 13, 2014.
International Search Report and Written Opinion for Appin. No. PCT/US2014/050125, dated Feb. 4, 2015.
International Search Report and Written Opinion for Appin. No. PCT/US2014/050148, dated Feb. 9, 2015.
International Search Report and Written Opinion for Appin. No. PCT/US2014/055695, dated Mar. 20, 2015.
International Search Report and Written Opinion for Appin. No. PCT/US2015/011715, dated Apr. 20, 2015.
International Search Report and Written Opinion for Appin. No. PCT/US2015/032679, dated Nov. 11, 2015.
International Search Report and Written Opinion for Appin. No. PCT/US2014/055695, dated Dec. 15, 2015.
International Search Report and Written Opinion for Appln. No. PCT/US2016/056526, dated Jan. 20, 2017.
International Search Report and Written Opinion for Appln. No. PCT/US2016/056402, dated Jan. 31, 2017.
International Search Report and Written Opinion for Appln. No. PCT/US2016/068297, dated Apr. 17, 2017.
Japanese Office Action for Appln. No. 2013-509325, dated Oct. 18, 2013.
Japanese Office Action for Appln. No. 2013-520776, dated Apr. 21, 2015.
Japanese Office Action for Appln. No. 2013-520777, dated May 22, 2015.
Jin, Yonggang et al., "STM 3D-IC Package and 3D eWLB Development," STMicroelectronics Singapore/ STMicroelectronics France, May 21, 2010.
Kim et al., "Application of Through Mold Via (TMV) as PoP Base Package," 2008, 6 pages.
Korean Office Action for Appn. 10-2011-0041843, dated Jun. 20, 2011.
Korean Office Action for Appn. 2014-7025992, dated Feb. 5, 2015.
Korean Search Report KR10-2010-0113271, dated Jan. 12, 2011.

(56) References Cited

OTHER PUBLICATIONS

Korean Search Report KR10-2011-0041843, dated Feb. 24, 2011.
Meiser, S., "Klein Und Komplex," Elektronik Irl Press Ltd, DE, vol. 41, No. 1, Jan. 7, 1992 (Jan. 7, 1992) pp. 72-77, XP000277326, [ISR Appln. No. PCT/US2012/060402, dated Feb. 21, 2013 provides concise stmt. of relevance).
Neo-Manhattan Technology, A Novel HDI Manufacturing Process, "High-Density Interconnects for Advanced Flex Substrates and 3-D Package Stacking," IPC Flex & Chips Symposium, Tempe, AZ, Feb. 11-12, 2003.
North Corporation, Processed intra-Layer Interconnection Material for PWBs [Etched Copper Bump with Copper Foil], NMBITM, Version 2001.6, 1 p.
NTK HTCC Package General Design Guide, Communication Media Components Group, NGK Spark Plug Co., Ltd., Komaki, Aichi, Japan, Apr. 2010, 32 pages.
Partial International Search Report from Invitation to Pay Additional Fees for Appln. No. PCT/US2012/028738, dated Jun. 6, 2012.
Partial International Search Report for Appln. No. PCT/US2012/060402, dated Feb. 21, 2013.
Partial International Search Report for Appln. No. PCT/US2013/026126, dated Jun. 17, 2013.
Partial International Search Report for Appln. No. PCT/US2013/075672, dated Mar. 12, 2014.
Partial International Search Report for Appln. No. PCT/US2014/014181, dated May 8, 2014.
Partial International Search Report for Appln. No. PCT/US2015/032679, dated Sep. 4, 2015.
Partial International Search Report for Appln. No. PCT/US2015/033004, dated Sep. 9, 2015.
Redistributed Chip Package (RCP) Technology, Freescale Semiconductor, 2005, 6 pages.
Taiwan Office Action for 100125521, dated Dec. 20, 2013.
Taiwan Office Action for 100125522, dated Jan. 27, 2014.
Taiwan Office Action for 100141695, dated Mar. 19, 2014.
Taiwan Office Action for 100138311, dated Jun. 27, 2014.
Taiwan Office Action for 100140428, dated Jan. 26, 2015.
Taiwan Office Action for 102106326, dated Sep. 8, 2015.
Chinese Office Action Search Report for Application No. 2014800551784 dated Jan. 23, 2018.
European Search Report for Appln. No. EP12712792, dated Feb. 27, 2018, 2 pages.
International Search Report and Written Opinion for Appln. No. PCT/US2017/064437, dated Mar. 29, 2018.
Taiwan Office Action for 103103350, dated Mar. 21, 2016.
Taiwan Search Report for 105128420, dated Sep. 26, 2017.
U.S. Appl. No. 13/477,532, dated May 22, 2012.
U.S. Office Action for U.S. Appl. No. 12/769,930, dated May 5, 2011.
"Wafer Level Stack—WDoD", [online] [Retrieved Aug. 5, 2010] Retrieved from internet: <http://www.3d-plus.com/techno-wafer-level-stack-wdod.php>, 2 pages.
Written Opinion for Appln. No. PCT/US2014/050125, dated Jul. 15, 2015.
Yoon, PhD, Seung Wook, "Next Generation Wafer Level Packaging Solution for 3D Integration," May 2010, STATS ChipPAC Ltd.
Brochure, "High Performance BVA PoP Package for Mobile Systems," Invensas Corporation, May 2013, 20 pages.
Brochure, "Invensas BVA PoP for Mobile Computing: Ultra High IO Without TSVs," Invensas Corporation, Jun. 26, 2012, 4 pages.
Brochure, "Invensas BVA PoP for Mobile Computing: 100+ GB/s BVA PoP," Invensas Corporation, c. 2012, 2 pages.
Campos et al., "System in Package Solutions Using Fan-Out Wafer Level Packaging Technology," SEMI Networking Day, Jun. 27, 2013, 31 pages.
Chinese Office Action for Application No. 201180022247.8 dated Sep. 16, 2014.
Chinese Office Action for Application No. 201180022247.8 dated Apr. 14, 2015.
Chinese Office Action for Application No. 201310264264.3 dated May 12, 2015.
EE Times Asia "3D Plus Wafer Level Stack" [online] [Retrieved Aug. 5, 2010] Retrieved from internet: <http://www.eetasia.com/ART_8800428222_280300_NT_DEC52276.htm>, 2 pages.
Extended European Search Report for Appln. No. EP13162975, dated Sep. 5, 2013.
Ghaffarian Ph.D., Reza et al., "Evaluation Methodology Guidance for Stack Packages," Jet Propulsion Laboratory, California Institute of Technology, Pasadena, CA, NASA, Oct. 2009, 44 pages.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report for Appln. No. PCT/US2005/039716, dated Apr. 5, 2006.
International Search Report and Written Opinion for Appln. No. PCT/US2011/024143, dated Sep. 14, 2011.
International Search Report and Written Opinion for Appln. No. PCT/US2011/024143, dated Jan. 17, 2012.
International Search Report and Written Opinion for Appln. No. PCT/US2011/060551, dated Apr. 18, 2012.
International Search Report and Written Opinion for Appln. No. PCT/US2011/044342, dated May 7, 2012.
International Search Report and Written Opinion for Appln. No. PCT/US2011/044346, dated May 11, 2012.
International Search Report and Written Opinion for Appln. No. PCT/US2012/060402, dated Apr. 2, 2013.
International Search Report and Written Opinion for Appln. No. PCT/US2013/026126, dated Jul. 25, 2013.
International Search Report and Written Opinion for Appln. No. PCT/US2013/052883, dated Oct. 21, 2013.
International Search Report and Written Opinion for Appln. No. PCT/US2013/041981, dated Nov. 13, 2013.
International Search Report and Written Opinion for Appln. No. PCT/US2013/053437, dated Nov. 25, 2013.
International Search Report and Written Opinion for Appln. No. PCT/US2013/075672, dated Apr. 22, 2014.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2015/011715, dated Apr. 20, 2015.
International Search Report and Written Opinion for Appln. No. PCT/US2015/032679, dated Nov. 11, 2015.
International Search Report and Written Opinion for Appln. No. PCT/US2014/055695, dated Dec. 15, 2015.

* cited by examiner

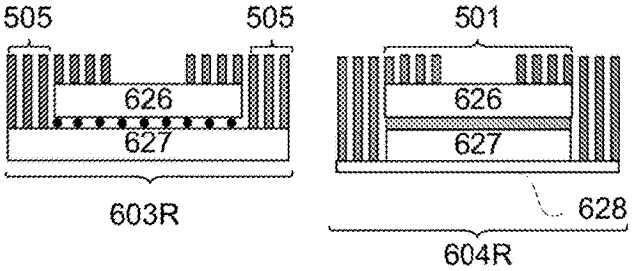
FIG. 6E-1
FIG. 6E-2
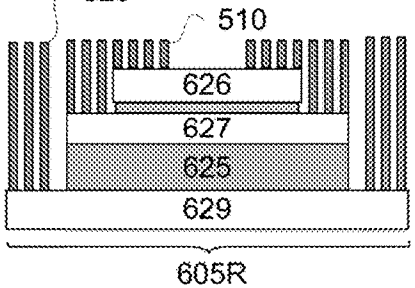
FIG. 6E-3
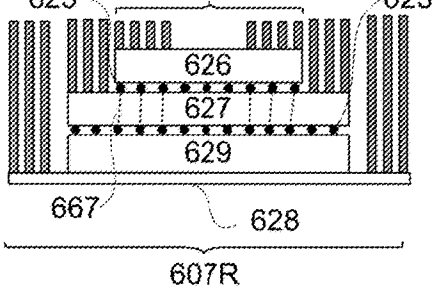
FIG. 6E-4
FIG. 6E-5
FIG. 6E-6
FIG. 6E-7
FIG. 6E-8
FIG. 6E-9

MULTIPLE PLATED VIA ARRAYS OF DIFFERENT WIRE HEIGHTS ON A SAME SUBSTRATE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION(S)

This application *is a broadening reissue continuation application, meaning it* is a continuation of, and hereby claims priority to[, pending] *broadening U.S. Reissue application Ser. No. 17/725,442, filed Apr. 20, 2022, which is a reissue of U.S. Pat. No. 10,629,567, issued Apr. 21, 2020, filed as U.S. application Ser. No. 16/245,116 on Jan. 10, 2019 which is a continuation of* U.S. patent application Ser. No. 16/008,531, filed on Jun. 14, 2018 (now U.S. Pat. No. 10,290,613), which is a continuation of U.S. patent application Ser. No. 15/430,943, filed on Feb. 13, 2017 (now U.S. Pat. No. 10,026,717), which is a continuation of U.S. patent application Ser. No. 14/841,381, filed on Aug. 31, 2015 (now U.S. Pat. No. 9,583,456), which is a continuation-in-part of U.S. patent application Ser. No. 14/087,252, filed on Nov. 22, 2013 (now U.S. Pat. No. 9,263,394), *and is also a broadening reissue of U.S. Pat. No. 10,629,567, which is a continuation of U.S. patent application Ser. No. 16/008,531, which is a continuation of U.S. patent application Ser. No. 15/430,943, which is a continuation of U.S. patent application Ser. No. 14/841,381, which is a continuation in part of U.S. patent application Ser. No. 14/087,252,* the entirety of each of which is hereby incorporated by reference herein for all purposes.

FIELD

The following description relates to integrated circuits ("ICs"). More particularly, the following description relates to multiple plated via arrays of different wire heights on a same substrate for an IC package.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC or other type of electronic component, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example. Conventional interconnecting of an IC to another IC or to a circuit platform has issues with solder bridging.

Accordingly, it would be desirable and useful to provide a structure for interconnection of an IC that mitigates against solder bridging.

BRIEF SUMMARY

An apparatus relates generally to via arrays on a substrate. In such an apparatus, the substrate has a conductive layer. First plated conductors are in a first region extending from a surface of the conductive layer. Second plated conductors are in a second region extending from the surface of the conductive layer. The first plated conductors and the second plated conductors are external to the first substrate. The first region is disposed at least partially within the second region. The first plated conductors are of a first height. The second plated conductors are of a second height greater than the first height. A second substrate is coupled to first ends of the first plated conductors. The second substrate has at least one electronic component coupled thereto. A die is coupled to second ends of the second plated conductors. The die is located over the at least one electronic component.

Another apparatus relates generally to via arrays on a substrate. In such an apparatus, the substrate has a conductive layer. First plated conductors are in a first region extending from a surface of the conductive layer. Second plated conductors are in a second region extending from the surface of the conductive layer. The first plated conductors and the second plated conductors are external to the first substrate. The first region is disposed at least partially within the second region. The first plated conductors are of a first height. The second plated conductors are of a second height greater than the first height. A die is coupled to first ends of the first plated conductors. A second substrate is coupled to second ends of the second plated conductors. The second substrate has at least one electronic component coupled thereto. The second substrate is located over the die.

A method relates generally to forming via arrays on a substrate. In such a method, a first substrate is obtained. A conductive layer is formed on an upper surface of the first substrate. A first resist layer is formed on the conductive layer. The first resist layer is patterned to provide a first mask with first vias from an upper surface of the first resist layer down to an upper surface of the conductive layer. Through-mask plating in the first vias provides first plated conductors in a first region extending from the upper surface of the conductive layer. A second resist layer is formed over the first plated conductors. The second resist layer is patterned to provide a second mask with second vias from an upper surface of the second resist layer down to upper surfaces of a subset of the first plated conductors. Through-mask plating in the second vias provides second plated conductors in a second region extending down to the upper surfaces of and including the subset of the first plated conductors. The first resist layer and the second resist layer are removed. Portions of the conductive layer between the first plated conductors and the second plated conductors are removed. The first plated conductors and the second plated conductors are external to the first substrate. The first region is disposed at least partially within the second region. The first plated conductors are of a first height. The second plated conductors are of a second height greater than the first height. A second substrate is coupled to first ends of the first plated conductors. The second substrate has at least one electronic component coupled thereto. A die is coupled to second ends of the second plated conductors. The die is located over the at least one electronic component.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIGS. 6E-1 through 6E-9 are block diagrams of side views of exemplary package-on-package assemblies ("die stacks"), each of which may have two or more bond via arrays with wires of different heights.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

The following description generally relates to two or more bond via arrays (BVAs") on a same surface of a substrate. At least two of these bond via arrays have wires of distinctly different heights for accommodation of die stacking within at least one of such bond via arrays and in some applications vias or wires may have different electrical resistivities and/or elastic moduli.

Figure 1A:
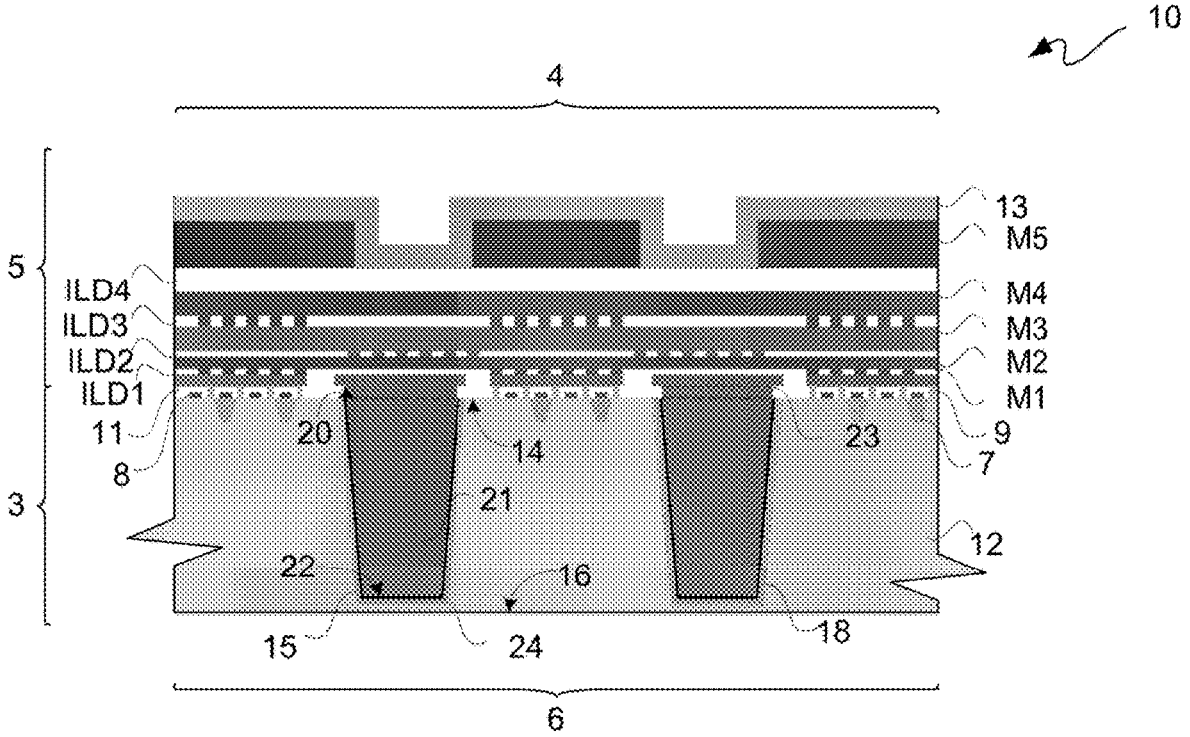
FIG. 1A is a schematic diagram of a cross-sectional view depicting an exemplary portion of an in-process wafer for providing an integrated circuit ("IC").

FIG. 1A is a schematic diagram of a cross-sectional view depicting an exemplary portion of an in-process wafer for providing an IC 10 component. IC 10 includes a substrate 12 of a semiconductor material such as silicon (Si), gallium arsenide (GaAs), polymeric, ceramic, carbon-based substrates such as diamond, a silicon carbon (SiC), germanium (Ge), $Si_{1-x}Ge_x$, or the like. Even though a semiconductor substrate 12 as provided from an in-process wafer is generally described below, any sheet or layer semiconductor material or dielectric material, such as ceramic or glass for example, may be used as a substrate. Furthermore, even though an IC 10 is described, any microelectronic component that includes one or more through-substrate via structures may be used.

Substrate 12 includes an upper surface 14 and a lower surface 16 that extend in lateral directions and are generally parallel to each other at a thickness of substrate 12. Use of terms such as "upper" and "lower" or other directional terms is made with respect to the reference frame of the figures and is not meant to be limiting with respect to potential alternative orientations, such as in further assemblies or as used in various systems.

Upper surface 14 may generally be associated with what is referred to as a "front side" 4 of an in-process wafer, and lower surface 16 may generally be associated with what is referred to as a "backside" 6 of an in-process wafer. Along those lines, a front-side 4 of an in-process wafer may be used for forming what is referred to as front-end-of-line ("FEOL") structures 3 and back-end-of-line ("BEOL") structures 5. Generally, FEOL structures 3 may include shallow trench isolations ("STI") 7, transistor gates 8, transistor source/drain regions (not shown), transistor gate dielectrics (not shown), contact etch stop layer ("CESL"; not shown), a pre-metallization dielectric or pre-metal dielectric ("PMD") 11, and contact plugs 9, among other FEOL structures. A PMD 11 may be composed of one or more layers. Generally, BEOL structures 5 may include one or more inter-level dielectrics ("ILDs") and one or more levels of metallization ("M"). In this example, there are four ILDs, namely ILD1, ILD2, ILD3, and ILD4; however, in other configurations there may be fewer or more ILDs. Furthermore, each ILD may be composed of one or more dielectric layers. In this example, there are five levels of metallization, namely M1, M2, M3, M4, and M5; however, in other configurations there may be fewer or more levels of metallization. Additionally, metal from a metallization level may extend through one or more ILDs, as is known. Furthermore, each level of metallization may be composed of one or more metal layers. A passivation level 13 may be formed on a last metallization layer. Such passivation level 13 may include one or more dielectric layers, and further may include an anti-reflective coating ("ARC"). Furthermore, a redistribution layer ("RDL") may be formed on such passivation level. Conventionally, an RDL may include: a dielectric layer, such as a polyimide layer for example; another metal layer on such dielectric layer and connected to a bond pad of a metal layer of a last metallization level; and another dielectric layer, such as another polyimide layer for example, over such RDL metal layer while leaving a portion thereof exposed to provide another bond pad. A terminal opening may expose such other bond pad of such RDL metal layer. Thereafter, a solder bump or wire bond may be conventionally coupled to such bond pad.

As part of a FEOL or BEOL structure formation, a plurality of via structures 18 may extend within openings formed in substrate 12 which extend into substrate 12. Via structures 18 may be generally in the form of any solid of any shape formed by filling an opening formed in substrate 12. Examples of such solid shapes generally include cylindrical, conical, frustoconical, rectangular prismatic, cubic, or the like. Examples of openings for via structures, vias, and processes for the fabrication thereof, may be found in U.S. patent application Ser. No. 13/193,814 filed Jul. 29, 2011 (now U.S. Pat. No. 8,816,505), and U.S. patent application Ser. Nos. 12/842,717 and 12/842,651 both filed on Jul. 23, 2010 (now U.S. Pat. Nos. 8,791,575 and 8,796,135, respectively), and each of these patent applications (now patents) is hereby incorporated by reference herein for all purposes to the extent same is consistent with the description hereof.

Conventionally, via structures 18 may extend from upper surface 14 down toward lower surface 16, and after a backside reveal, via structures 18 may extend between surfaces 14 and 16, as effectively thickness of substrate 12 may be thinned so as to reveal lower end surfaces of via structures 18, as described below in additional detail. Via structures 18 extending through substrate 12 between surfaces 14 and 16, though they may extend above or below such surfaces, respectively, may be referred to as through-substrate-vias. As substrates are often formed of silicon, such through-substrate-vias are commonly referred to as TSVs, which stands for through-silicon-vias.

Such openings formed in substrate 12 may be conformally coated, oxidized, or otherwise lined with a liner or insulator 15. Conventionally, liner 15 is silicon dioxide; however, a silicon oxide, a silicon nitride, or another dielectric material may be used to electrically isolate via structures 18 from substrate 12. Generally, liner 15 is an insulating or dielectric material positioned between any and all conductive portions of a via structure 18 and substrate 12 such that an electronic signal, a ground, a supply voltage, or the like carried by such via structure 18 is not substantially leaked into substrate 12, which may cause signal loss or attenuation, shorting, or other circuit failure.

Overlying a liner 15 may be a barrier layer 24. Generally, barrier layer 24 is to provide a diffusion barrier with respect to a metallic material used to generally fill a remainder of an opening in which a via structure 18 is formed. Barrier layer 24 may be composed of one or more layers. Furthermore, a barrier layer 24 may provide a seed layer for subsequent electroplating or other deposition, and thus barrier layer 24 may be referred to as a barrier/seed layer. Moreover, barrier layer 24 may provide an adhesion layer for adherence of a subsequently deposited metal. Thus, barrier layer 24 may be a barrier/adhesion layer, a barrier/seed layer, or a barrier/adhesion/seed layer. Examples of materials that may be used for barrier layer 24 include tantalum (Ta), tantalum nitride (TaN), palladium (Pd), titanium nitride (TiN), TaSiN, compounds of Ta, compounds of Ti, compounds of nickel (Ni), compounds of copper (Cu), compounds of cobalt (Co), or compounds of tungsten (W), among others.

Via structures 18 may generally consist of a metallic or other conductive material generally filling a remaining void in an opening formed in substrate 12 to provide a via conductor 21. In various examples, a via conductor 21 of a via structure 18 may generally consist of copper or a copper alloy. However, a via conductor 21 may additionally or alternatively include one or more other conductive materials such as tantalum, nickel, titanium, molybdenum, tungsten, aluminum, gold, or silver, including various alloys or compounds of one or more of the these materials, and the like. A via conductor 21 may include non-metallic additives to control various environmental or operational parameters of a via structure 18.

Via structures 18 may each include an upper end contact surface 20 which may be level with upper surface 14 of substrate 12 and a lower end contact surface 22 which may be level with lower surface 16 of substrate 12 after a backside reveal. End surfaces 20 and 22 may be used to interconnect via structures 18 with other internal or external components, as below described in additional detail.

In this example, upper end contact surface 20 of via conductors 21 are interconnected to M1 through a respective contact pad 23. Contact pads 23 may be formed in respective openings formed in PMD 11 in which M1 extends. However, in other configurations, one or more via conductors 21 may extend to one or more other higher levels of metallization through one or more ILDs. Furthermore, via structure 18 is what may be referred to as a front side TSV, as an opening used to form via structure is initially formed by etching from a front side of substrate 12.

Figure 1B:
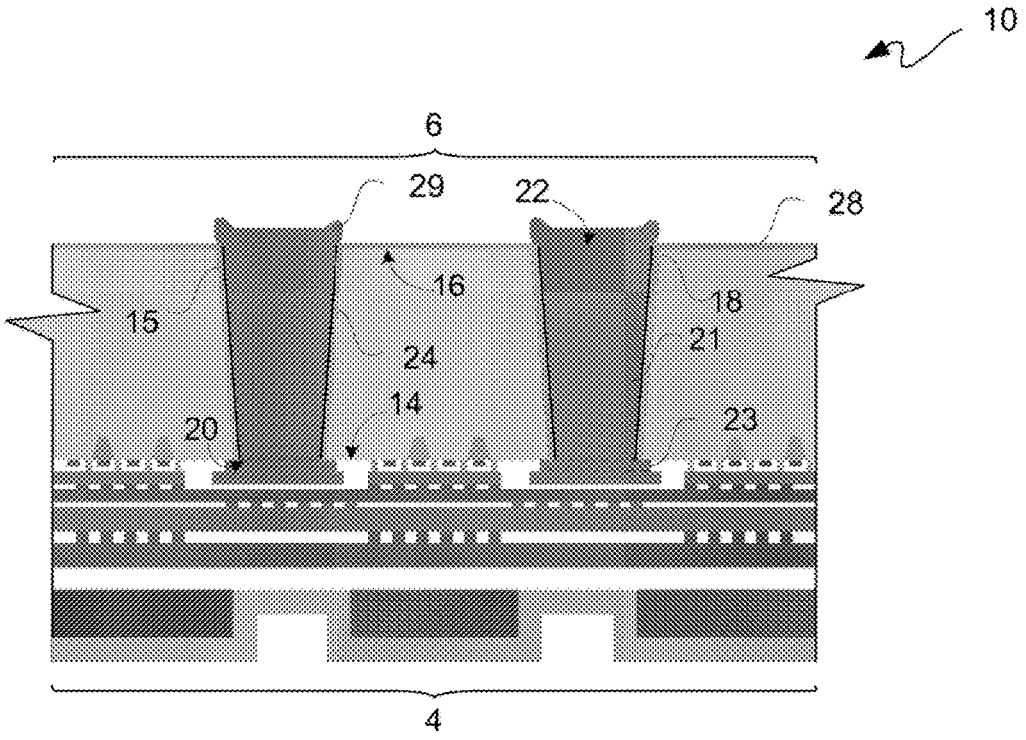
FIG. 1B is a schematic diagram of a cross-sectional view depicting an exemplary portion of an in-process wafer for providing another IC.

However, a via structure may be a backside TSV, as generally indicated in FIG. 1B, where there is shown a schematic diagram of a cross-sectional view depicting an exemplary portion of an in-process wafer for providing another IC 10. Fabrication of a backside TSV is generally referred to as a "via last approach," and accordingly fabrication of a front side TSV is generally referred to as a "via first approach."

IC 10 of FIG. 1B includes a plurality of via structures 18, which are backside TSVs. For a backside TSV for via structure 18, liner 15 may be a deposited polymer into a "donut" silicon trench etch and deposited on lower surface 16 as a passivation layer 28, followed by a central silicon trench etch to remove an inner portion of the "donut" silicon trench, and followed by a seed layer deposition before patterning and electroplating to provide via conductors 21 having respective solder bump pads or landings 29. Optionally, a conventional anisotropic silicon etch may be used prior to depositing and patterning a polymer isolation layer as liner 15.

For purposes of clarity by way of example and not limitation, it shall be assumed that front side TSVs are used, as the following description is generally equally applicable to backside TSVs.

Figure 1C:
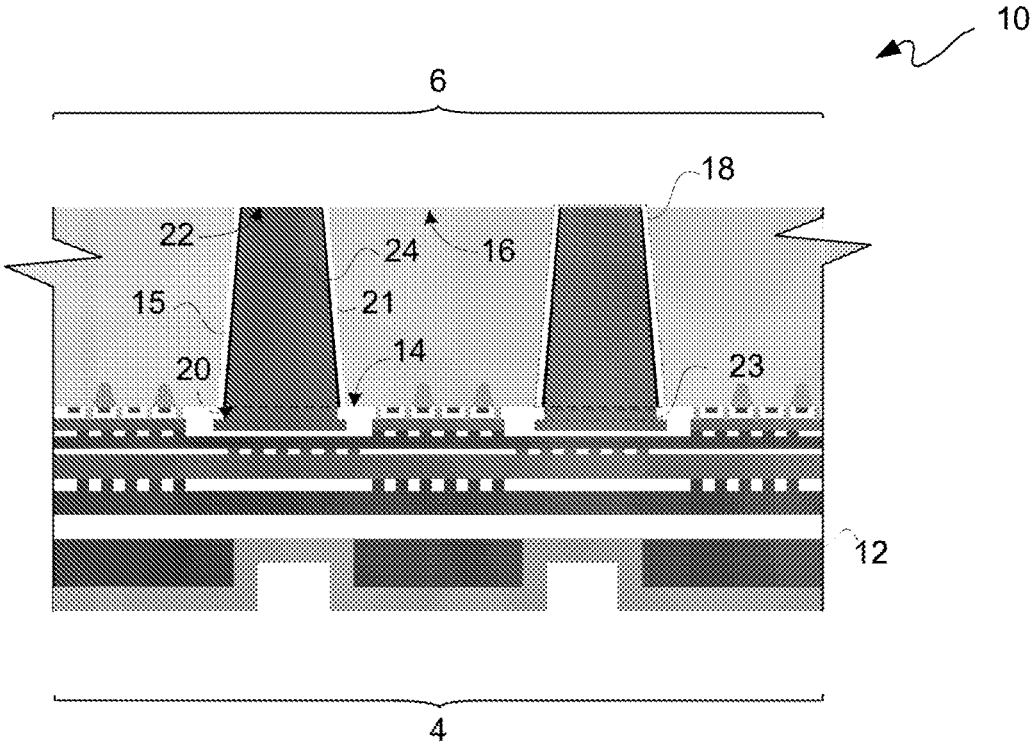
FIG. 1C is the diagram of FIG. 1A with the IC vertically flipped after chemical-mechanical-polishing of a lower surface of a substrate of the IC.

FIG. 1C is the diagram of FIG. 1A with IC 10 after a chemical-mechanical-polishing ("CMP") of a lower surface 16 of a substrate 12. Such CMP may be performed to temporarily reveal lower end contact surface 22, and thus portions of liner 15 and barrier layer 24 previously underlying lower end contact surface 22 may be removed by CMP. Thus, in this example, lower end contact surface 22 may be coplanar and level with lower surface 16.

Figure 1D:
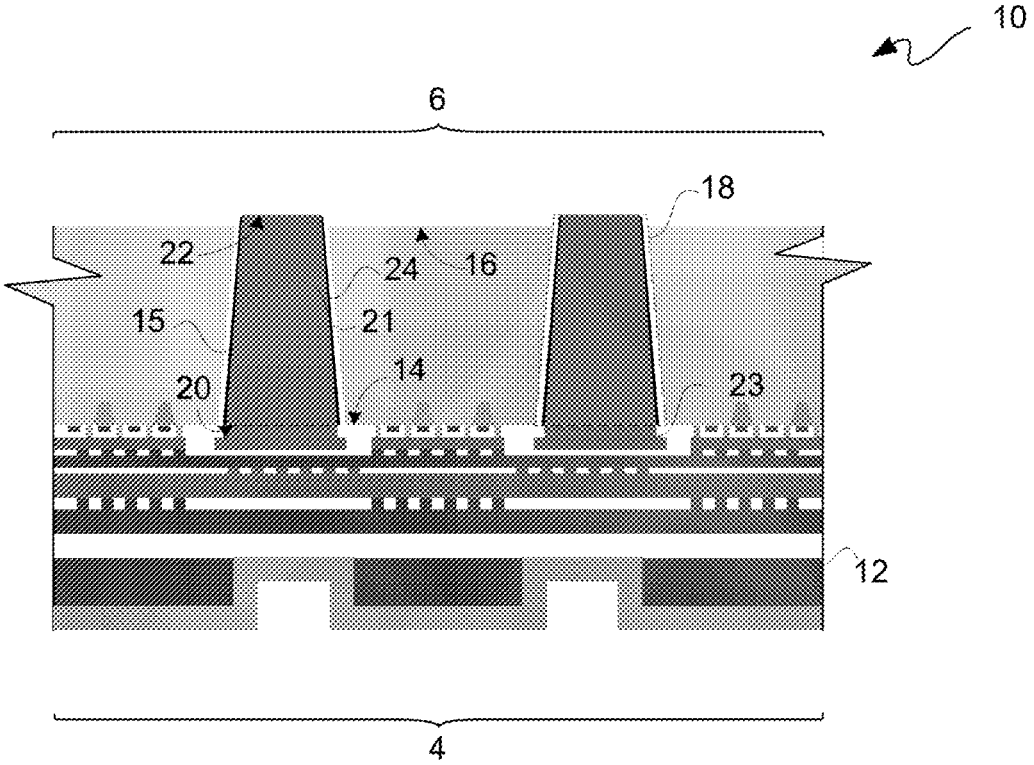
FIG. 1D is the diagram of FIG. 1A with the IC vertically flipped after a backside etch of a lower surface of a substrate of the IC to reveal a lower end contact surface of a via conductor thereof.

FIG. 1D is the diagram of FIG. 1A with IC 10 after a backside etch of a lower surface 16 of substrate 12 to temporarily reveal a lower end contact surface 22 of a via conductor 21. In this example, lower end contact surface 22 may be coplanar with lower surface 16; however, as via conductor 21, and optionally barrier layer 24, may protrude from substrate 12 after a backside reveal etch, lower end contact surface 22 in this example is not level with lower surface 16. For purposes of clarity and not limitation, IC 10 of FIG. 1D shall be further described, as the following description may likewise apply to IC 10 of FIG. 1C.

Figure 1E:
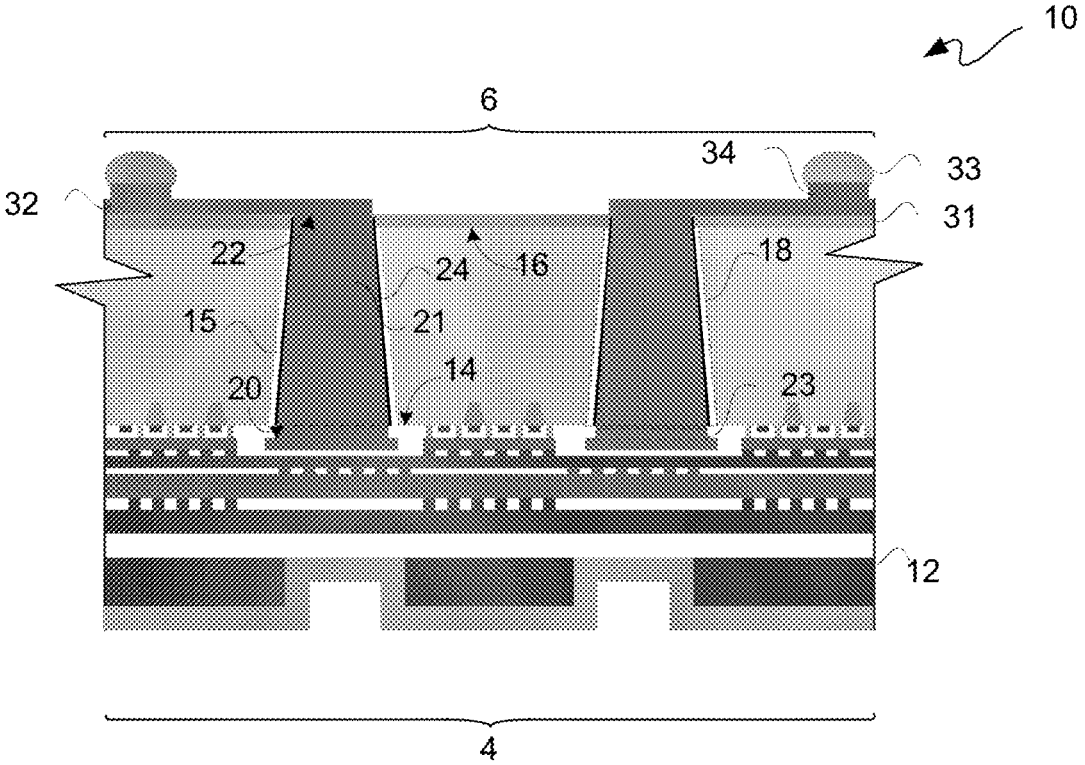
FIG. 1E is the diagram of FIG. 1D with a lower surface of the IC having formed thereon a passivation layer, which may be formed of one or more dielectric layers.

FIG. 1E is the diagram of FIG. 1D with a lower surface 16 of a substrate 12 having formed thereon a passivation layer 31, which may be formed of one or more dielectric layers. Furthermore, passivation layer 31 may be a polymer layer. For example, passivation layer 31 may be a benzocyclobutene ("BCB") layer or a combination of a silicon nitride layer and a BCB layer. In some applications, passivation layer 31 may be referred to as an inter-die layer. A metal layer 32, such as a copper, copper alloy, or other metal previously described, may be formed on passivation layer 31 and on lower end contact surfaces 22 of via conductors 21. This metal layer 32 may be an RDL metal layer. Balls 33 may be respectively formed on bonding pads 34, where such pads may be formed on or as part of metal layer 32. Balls 33 may be formed of a bonding material, such as solder or other bonding material. Balls 33 may be microbumps, C4 bumps, ball grid array ("BGA") balls, or some other die interconnect structure. In some applications, metal layer 32 may be referred to as a landing pad.

More recently, TSVs have been used to provide what is referred to as three-dimensional ("3D") ICs or "3D ICs." Generally, attaching one die to another using, in part, TSVs may be performed at a bond pad level or an on-chip electrical wiring level. ICs 10 may be diced from a wafer into single dies. Such single dies may be bonded to one another or bonded to a circuit platform, as previously described. For purposes of clarity by way of example and not limitation, it shall be assumed that an interposer is used for such circuit platform.

Interconnection components, such as interposers, may be in electronic assemblies for a variety of purposes, including facilitating interconnection between components with different connection configurations or to provide spacing between components in a microelectronic assembly, among others. Interposers may include a semiconductor layer, such as of silicon or the like, in the form of a sheet or layer of material or other substrate having conductive elements such as conductive vias extending within openings which extend through such layer of semiconductor material. Such conductive vias may be used for signal transmission through such interposer. In some interposers, ends of such vias may be used as contact pads for connection of such interposer to other microelectronics components. In other examples, one or more RDLs may be formed as part of such interposer on one or more sides thereof and connected with one or both ends of such vias. An RDL may include numerous conductive traces extending on or within one or more dielectric sheets or layers. Such traces may be provided in one level or in multiple levels throughout a single dielectric layer, separated by portions of dielectric material within such RDL. Vias may be included in an RDL to interconnect traces in different levels of such RDL.

Figure 2A:
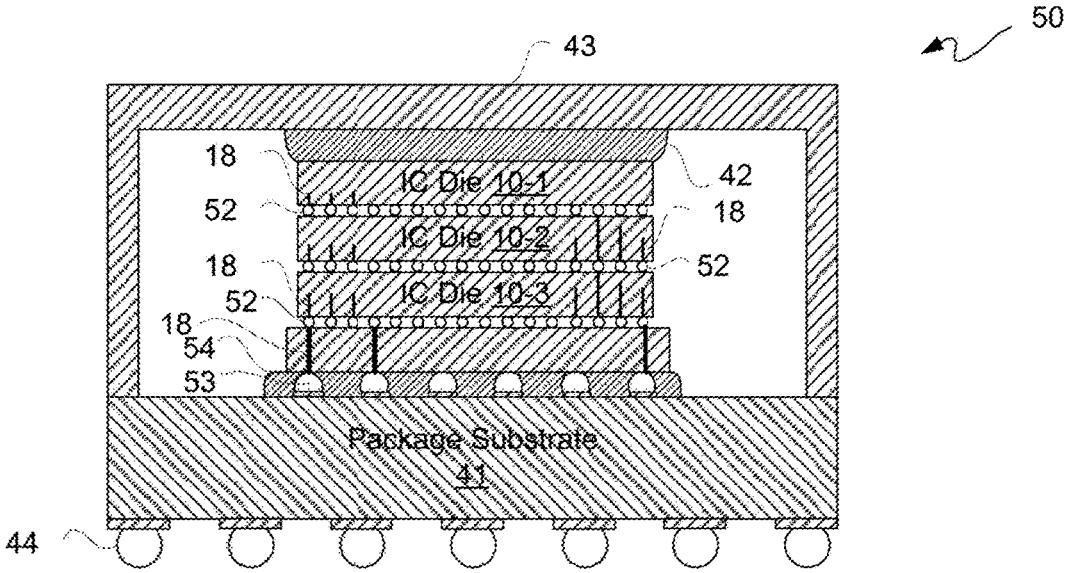
FIG. 2A is a block diagram of a cross-sectional view depicting an exemplary three-dimensional ("3D") IC packaged component with via structures.

FIG. 2A is a block diagram of a cross-sectional view depicting an exemplary 3D IC packaged component 50 with via structures 18. While a stacked die or a package-on-package die may include TSV interconnects, use of via structures 18 for a 3D IC packaged component 50 is described for purposes of clarity by way of example. In this example of a 3D IC packaged component 50, there are three ICs 10, namely ICs 10-1, 10-2, and 10-3, stacked one upon the other. In other implementations, there may be fewer or more than three ICs 10 in a stack. ICs 10 may be bonded to one another using microbumps 52 or flip-chip solder bumps. Optionally, Cu pillars extending from a backside of a die may be used. Some of these microbumps 52 may be interconnected to via structures 18. For example, a Cu/Sn microbump transient liquid phase ("TLP") bonding technology may be used for bonding ICs to one another. Thus, interconnect layers may be on one upper or lower side or both upper and lower sides of an IC 10 of a 3D stack.

A bottom IC 10-3 of such ICs in a 3D stack optionally may be coupled to an interposer or interposer die 40. Interposer 40 may be an active die or a passive die. For purposes of clarity and not limitation, it shall be assumed that interposer 40 is a passive die. IC 10-3 may be coupled to interposer 40 by microbumps 52. Interposer 40 may be coupled to a package substrate. A package substrate may be formed of thin layers called laminates or laminate substrates. Laminates may be organic or inorganic. Examples of materials for "rigid" package substrates include an epoxy-based laminate such as FR4, a resin-based laminate such as bismaleimide-triazine ("BT"), a ceramic substrate, a glass substrate, or other form of package substrate. An under fill 54 for a flip chip attachment may encapsulate C4 bumps or other solder balls 53 used to couple interposer die 40 and package substrate 41. A spreader/heat sink ("heat sink") 43 may be attached to package substrate 41, and such heat sink 43 and substrate package 41 in combination may encase ICs 10 and interposer 40 of such 3D stack. A thermal paste 42 may couple an upper surface of IC 10-1 on top of such 3D stack to an upper internal surface of such heat sink 43. Ball grid array ("BGA") balls or other array interconnects 44 may be used to couple package substrate 41 to a circuit platform, such as a PCB for example.

Figure 2B:
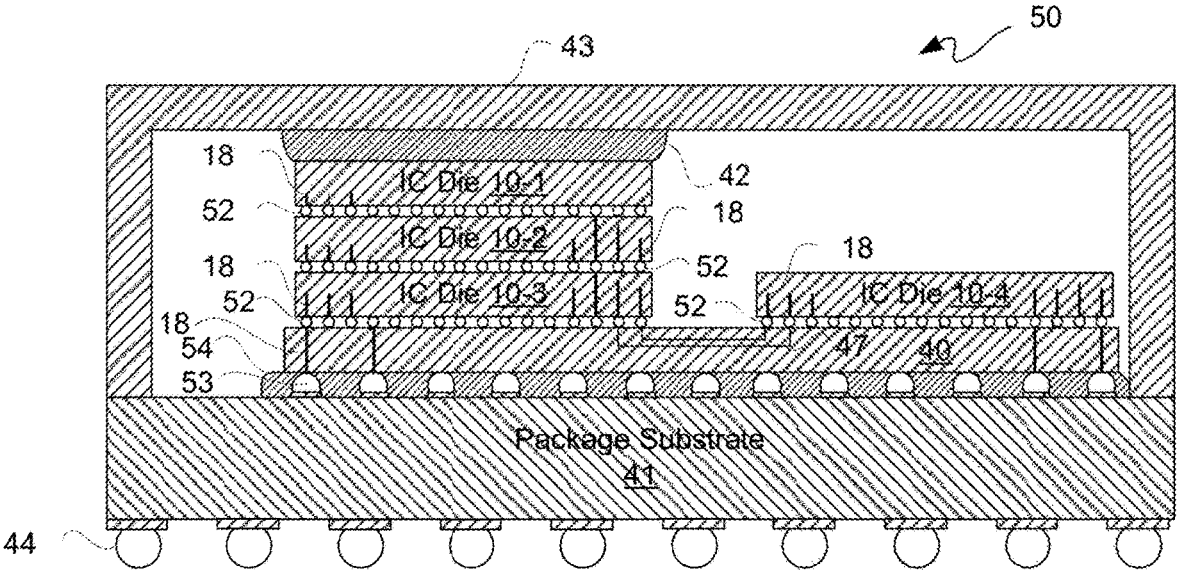
FIG. 2B is a block diagram of a cross-sectional view depicting another exemplary 3D IC packaged component with via structures.

FIG. 2B is a block diagram of a cross-sectional view depicting another exemplary 3D IC packaged component 50 with via structures 18. 3D IC packaged components 50 of FIGS. 2A and 2B are the same except for the following differences; in FIG. 2B, another IC 10-4 is separately coupled via microbumps 52 to interposer 40, where IC 10-4 is not coupled in the stack of ICs 10-1, 10-2, and 10-3. Furthermore, interposer 40 includes metal and via layers for providing wires 47 for interconnecting ICs 10-3 and 10-4. Furthermore, interposer 40 includes via structures 18 coupled to IC 10-4 through microbumps 52.

3D wafer-level packaging ("3D-WLP") may be used for interconnecting two or more ICs, one or more ICs to an interposer, or any combination thereof, where interconnects thereof may use via structures 18. Optionally, ICs may be interconnected die-to-die ("D2D") or chip-to-chip ("C2C"), where interconnects thereof may use via structures 18. Further, optionally, ICs may be interconnected die-to-wafer ("D2W") or chip-to-wafer ("C2W"), where interconnects thereof may use via structures 18. Accordingly, any of a variety of die stacking or chip stacking approaches may be used to provide a 3D stacked IC ("3D-SIC" or "3D-IC").

FIGS. 3A through 3M are respective block diagrams of side views depicting an exemplary portion process flow 300 for processing a substrate 301 to provide a substrate 301 with two or more bond via arrays with wires of different heights. Such wire heights may be sufficiently different for forming package-on-package components with one or more dies stacked within at least one of such bond via arrays. For purposes of clarity by way of example and not limitation, it shall be assumed that substrate 301 includes a fabricated multi-layered structure ("substrate") with generally any and all BEOL and/or FEOL processing operations having been completed. In passive die configurations, such as a passive interposer for example, there may not be any FEOL processing operations. As used above, substrate 12 of FIG. 1A for example was a single layer. However, more generally a substrate 301 may be a single layer or multiple layers used to form a passive or active component. Along those lines, a semiconductor die may be referred to as a substrate 301. Generally, a substrate 301 may be any sheet, wafer or layer of semiconductor material or dielectric material, such as gallium-arsenide, silicon-germanium, ceramic, polymer, polymer composite, glass-epoxy, glass, or other suitable low-cost, rigid or semi-rigid material or bulk semiconductor material for structural support. Furthermore substrate 301 may be a printed circuit board ("PCB") or a package substrate or a semiconductive or non-conductive material. For purposes of clarity by way of example and not limitation, it shall be assumed that substrate 301 is a package substrate, such as a logic package for a stacked die. However, substrate 301 in other examples may be an interposer or other form of substrate for providing an IC, including without limitation a 3D IC.

A conductor seed layer 302 is deposited onto an upper surface of substrate 301. Such seed layer 302 may be an adhesion layer and/or a seed layer ("seed/adhesion layer"). Seed/adhesion layer 302 may be a metal or metal compound, such as for example using one or more of copper (Cu), aluminum (Al), tin (Sn), platinum (Pt), nickel (Ni), gold (Au), tungsten (W), or silver (Ag), or other suitable conductive material. Furthermore, such seed layer may be deposited by plasma vapor deposition (PVD), chemical vapor deposition (CVD), sputtering, printing, plating, or other suitable form of deposition. For purposes of clarity and not limitation, it shall be assumed that seed/adhesion layer 302 is plated. A wet chemistry, such as for electrolytic plating or electroless plating, may be used.

Figure 3A:
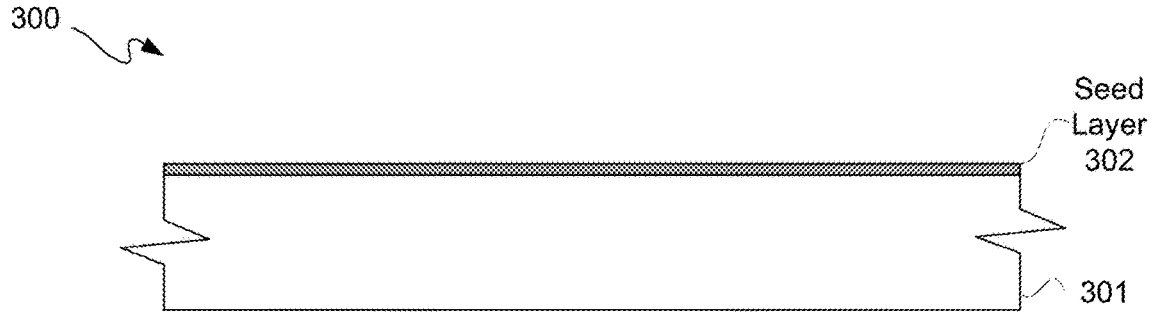
FIGS. 3A through 3M are respective block diagrams of side views depicting an exemplary portion of a process flow for processing a substrate to provide such substrate with two or more bond via arrays with wires of different heights.
Figure 3B:
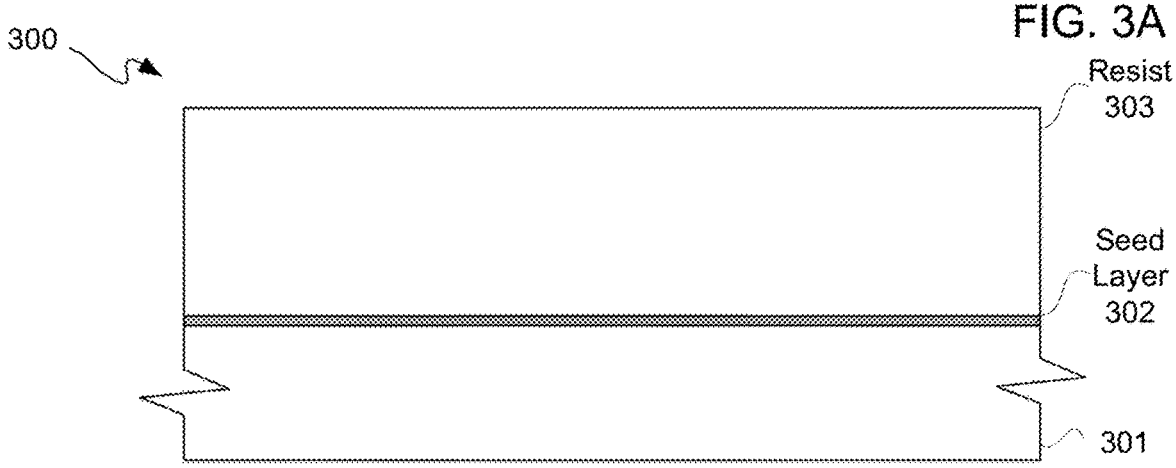
Figure 3C:
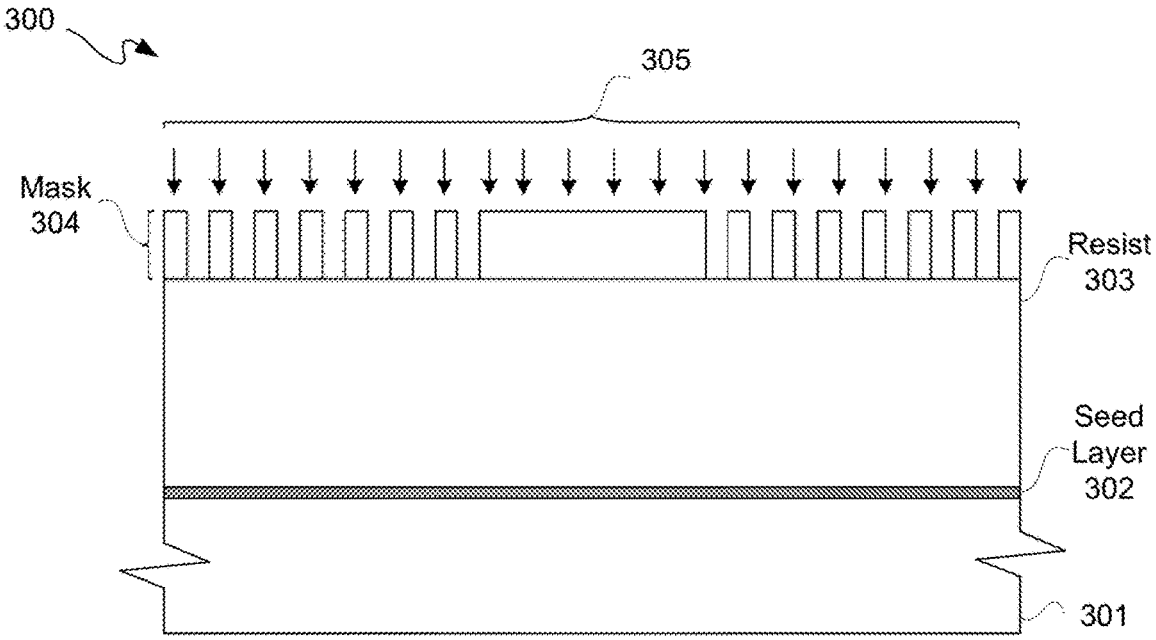
Figure 3D:
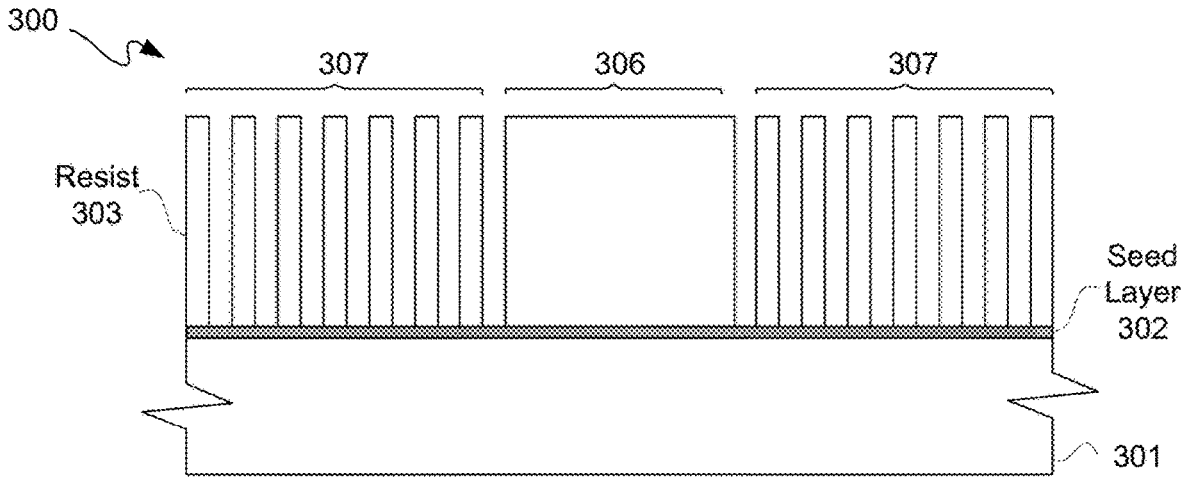

At FIG. 3B, a resist layer 303 is deposited on seed/adhesion layer 302. Resist 303 may be a photoresist or other resist suitable for patterning. At FIG. 3C, a mask 304 is positioned over resist for exposure to light 305, such as in photolithography. Even though the example of a positive resist is used for purposes of clarity, a negative resist may be used in other implementations. For a positive resist 303, portions of such resist 303 exposed to light 305 become soluble to a photoresist developer. At FIG. 3D, such exposed portions of resist 303 are removed. In this example, a central block 306 of resist 303, along with right and left arrays of spaced-apart resist pins 307 to either side of central block 306 are left as disposed on seed/adhesion layer 302.

Figure 3E:
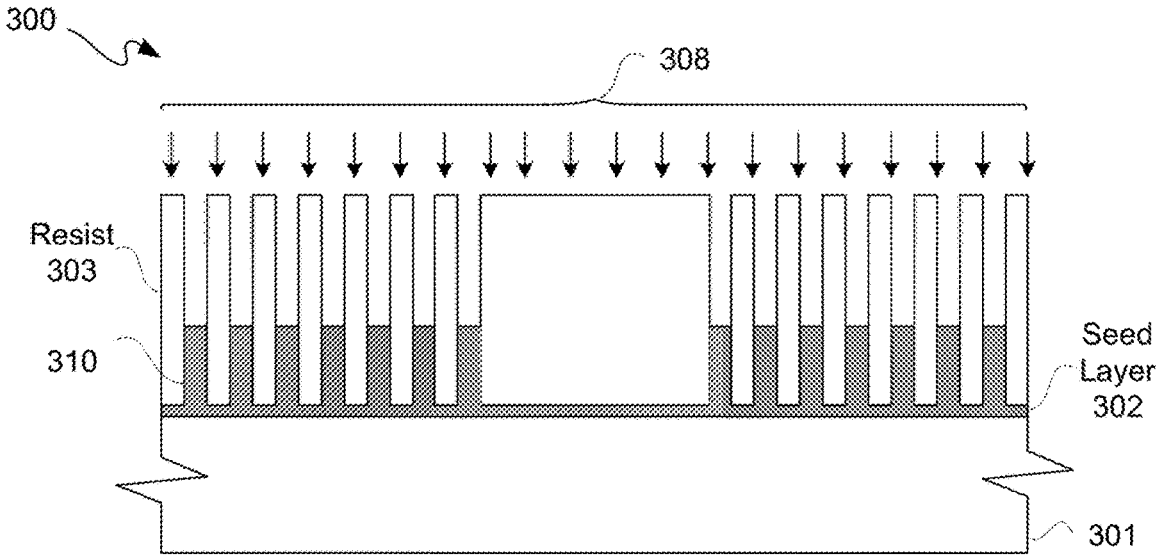

At FIG. 3E, through-mask plating 308 is used to form wires 310, namely "short" wires 310 extending from seed/adhesion layer 302 in gaps between wires of spaced-apart resist pins 307. Plating 308 may be an electrolytic or electroless plating as previously described. Furthermore, another form of conductive material deposition may be used instead of plating 308, such as described elsewhere herein.

As will be appreciated from the following description, alternatively "tall" wires 320 may be formed at FIG. 3E, with a subsequent masking and metal etch back to form "short" wires 310 from a portion of such "tall" wires 320. However, for purposes of clarity by way of example and not limitation, it shall be assumed that short wires 310 are formed at FIG. 3E.

Figure 3F:
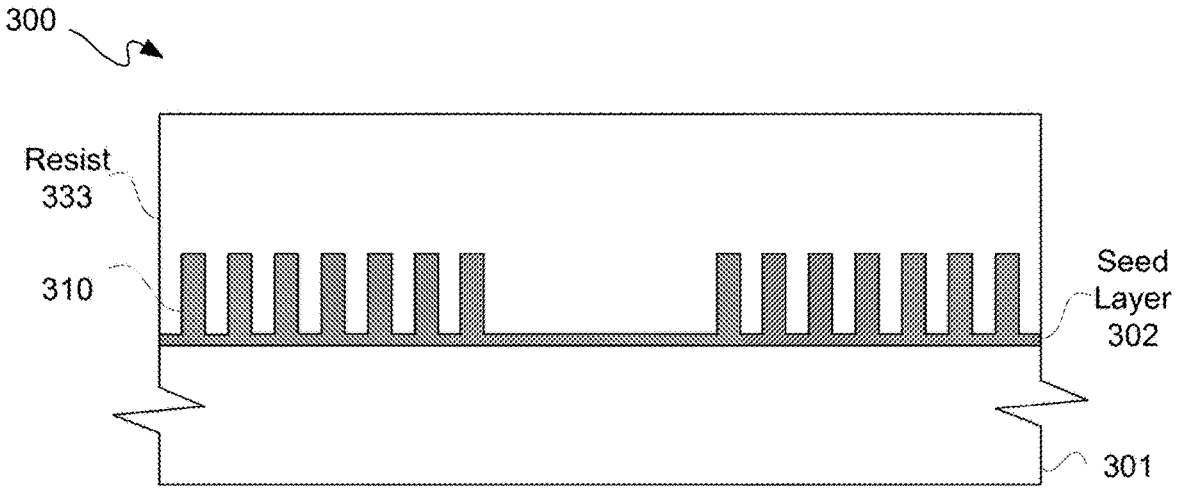

At FIG. 3F, resist 333 is deposited. Optionally, in another implementation, such deposition of resist 333 may not be preceded by a prior removal of resist 303, such as by ashing, after formation of short wires 310. However, in this implementation, resist 303 is removed prior to deposition of resist 333. In one example, an injection printer nozzle maybe used to coat resist or mask at regions to prevent subsequent metal coating in such blocked regions.

Figure 3G:
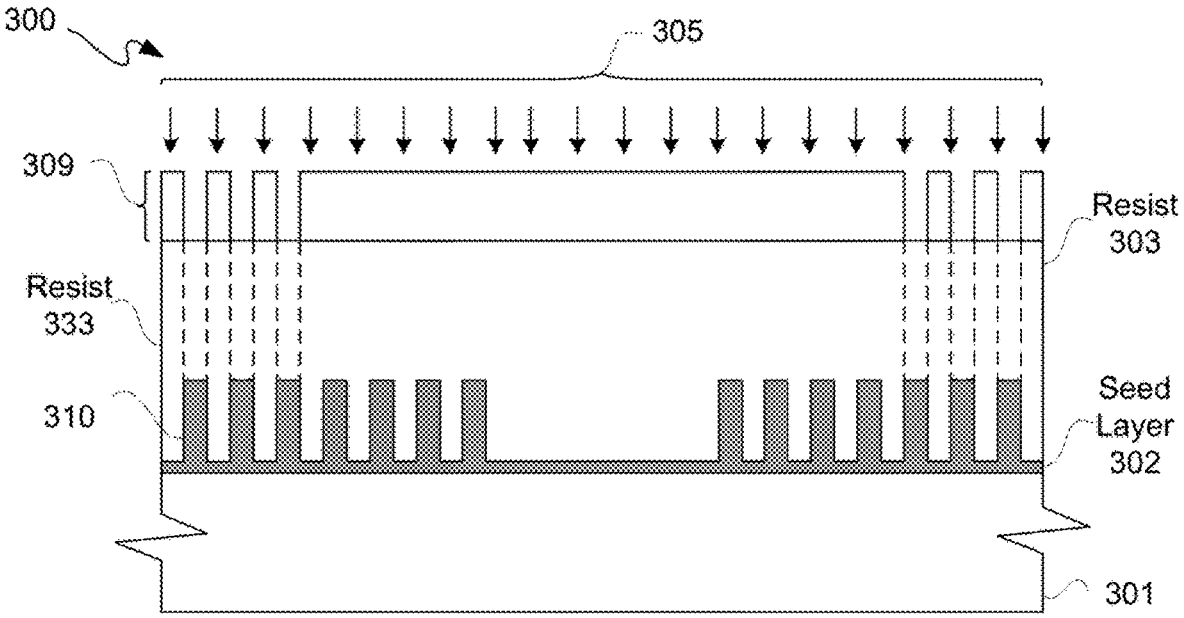
Figure 3H:
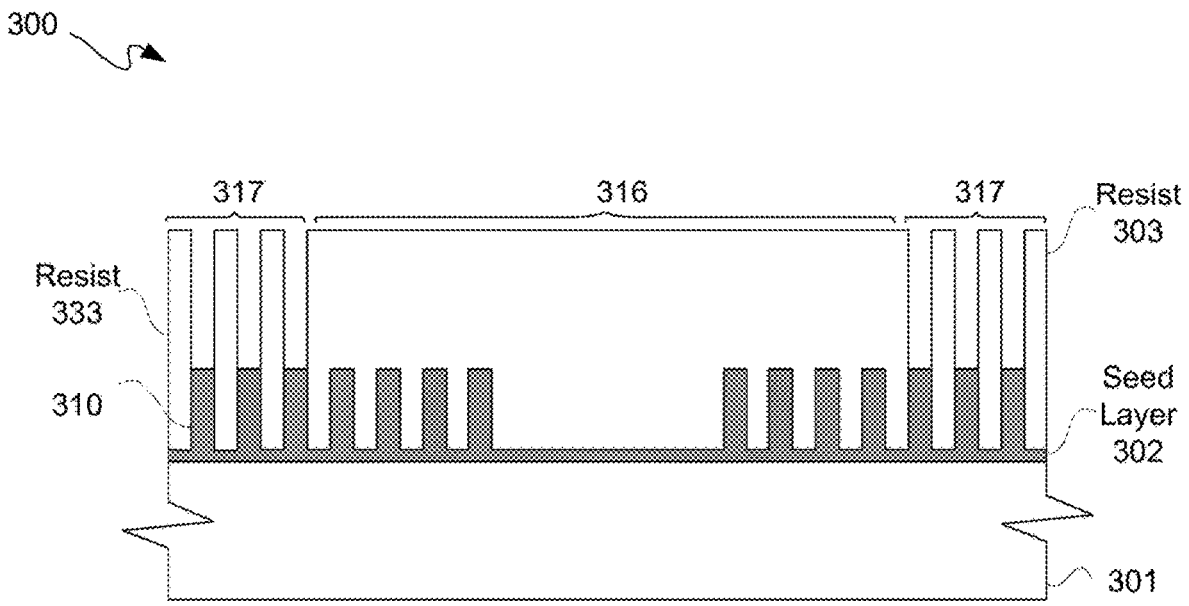

At FIG. 3G, a mask 309 is positioned over resist for exposure to light 305, such as in photolithography. Again, even though the example of a positive resist is used for purposes of clarity, a negative resist may be used in other implementations. At FIG. 3H, such exposed portions of resist 303 are removed. In this example, a central block 316 of resist 303, along with right and left arrays of spaced-apart resist pins 317 to either side of central block 316 are left as disposed on seed/adhesion layer 302 and short wires 310.

Figure 3I:
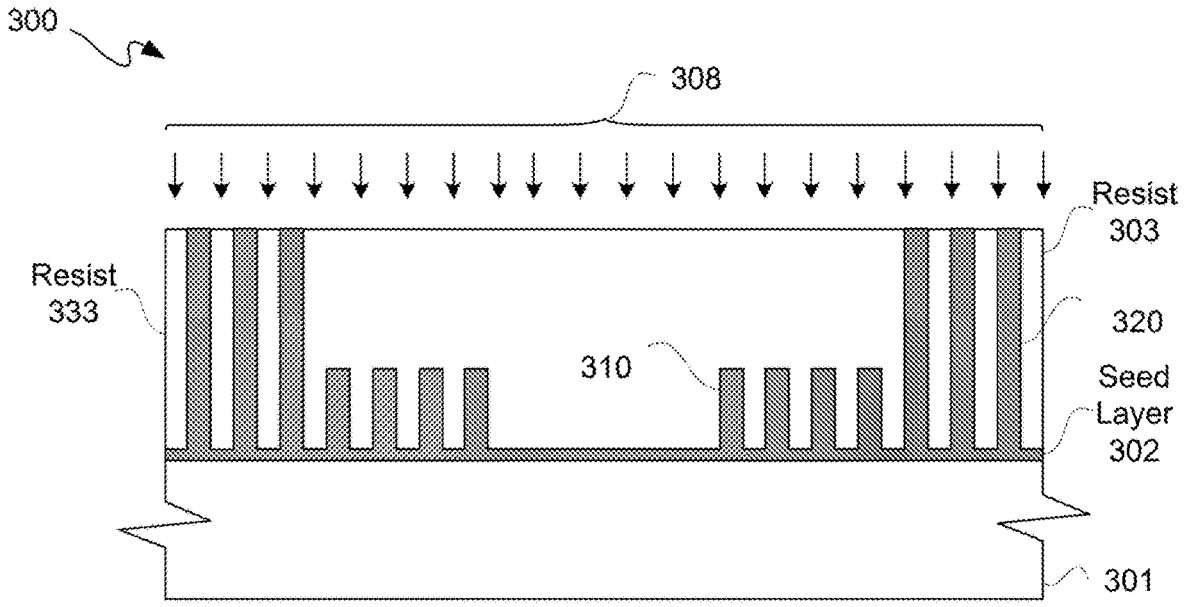

At FIG. 3I, a through-mask plating 308 is used to form tall wires 320 from extending from exposed ends of short wires 310 in gaps between wires of spaced-apart resist pins 317. Again, plating 308 may be an electrolytic or electroless plating as previously described, or another form of conductive material deposition may be used instead of plating 308, such as described elsewhere herein.

Figure 3J:
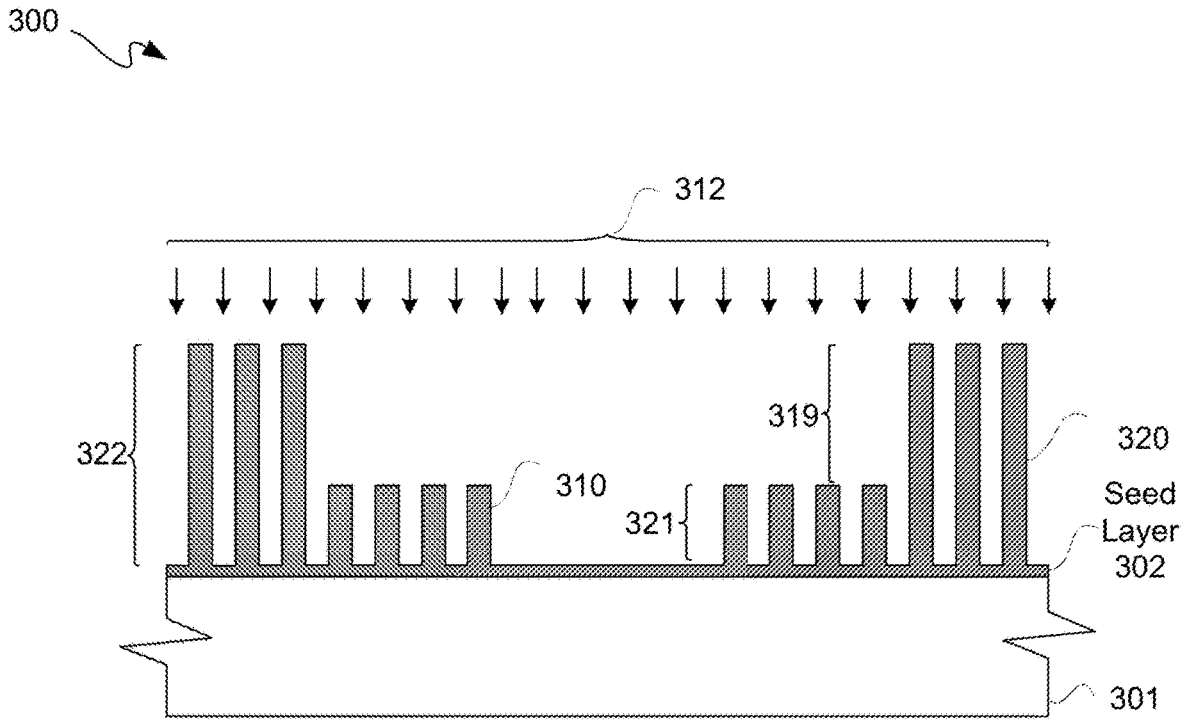

At FIG. 3J, remaining resist 303 may be removed by ashing 312 or by wet resist selectively wet etched or by other known methods. Leaving short wires 310 and tall wires 320 respectively extending from seed/adhesion layer 302. From an upper surface of seed/adhesion layer 302 to distal ends of short wires 310, such short wires 310 may have a height 321. Likewise, from an upper surface of seed/adhesion layer 302 to distal ends of tall wires 320, such tall wires 320 may have a height 322. A difference 319 in heights 321 and 322 from distal ends of short wires 310 to distal ends of tall wires 320 may be at least approximately the thickness of a die to be coupled to such distal ends of short wires 310.

Figure 3K:
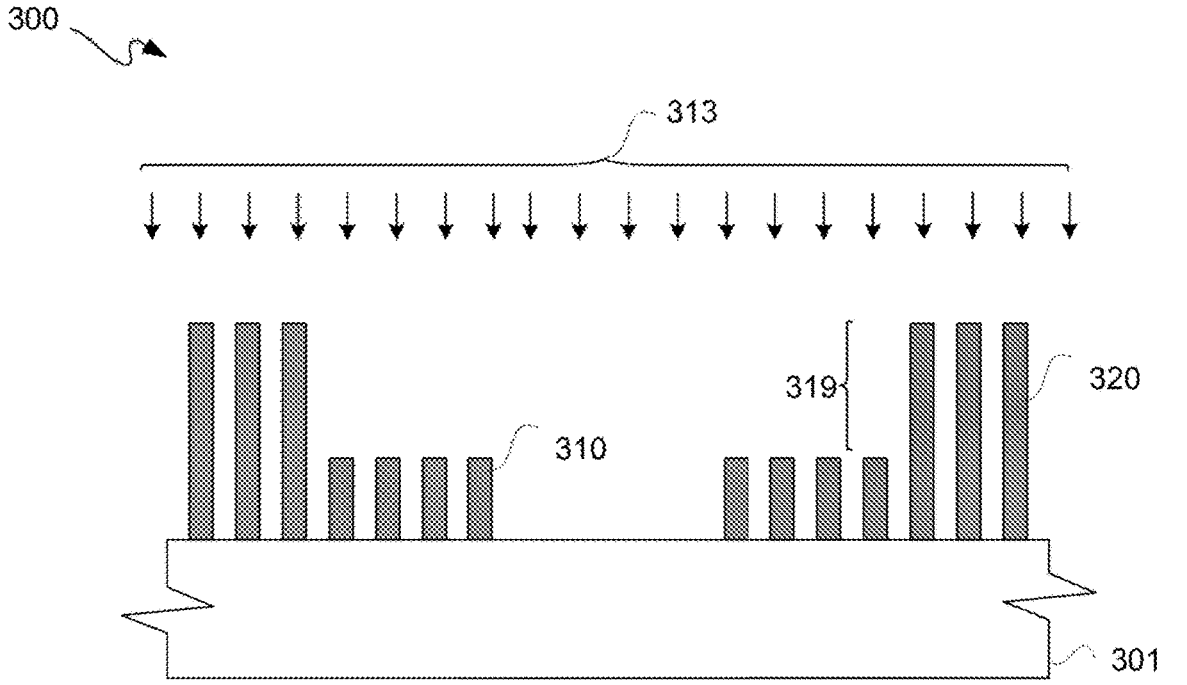

At FIG. 3K, a blanket metal etch 313 may be used to remove seed/adhesion layer 302 not located under and forming part of wires 310 and 320. For example, an anisotropic wet etch may be used. Such etch may remove upper portions of wires 310 and 320. However, a height 319 may be maintained after such blanket metal etch 313. After etching at 313, such assemblage of substrate 301 may be cleaned.

Figure 3L:
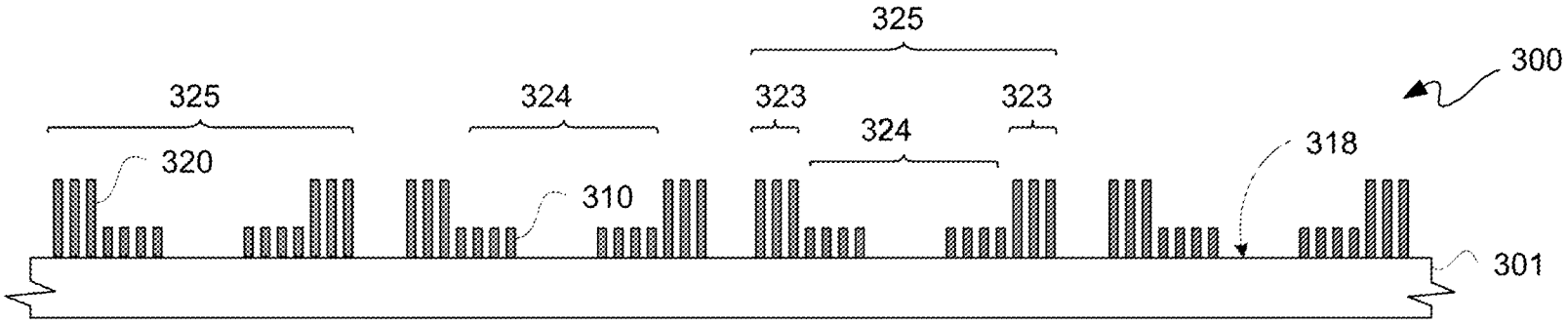

Substrate 301 may have multiple sets of bond via arrays as generally indicated in FIG. 3L. In a set 325, substrate 301 has a first bond via array 324 with short wires 310 extending from a top surface 318 of substrate 301, and a second bond via array 323 with tall wires 320 extending from a top surface 318 of substrate 301. First bond via array 324 is disposed at least partially within second bond via array 323. Short wires 310 of first bond via array 324 are of a first height, such as for example height 321, and tall wires of second bond via array 323 are of a second height, such as for example height 322, greater than such first height for a package-on-package ("PoP") configuration. Attachment of one or more dies may include molding to provide sufficient support for such attachments. Even though generally PoP configurations are described herein, such PoP configurations may include one or more of through mold vias ("TMVs"), TSVs, BGAs, flip-chip interconnects, or other forms of interconnects. Furthermore, configurations other than PoP may be used, including PiP and SiP configurations for example.

Figure 3M:
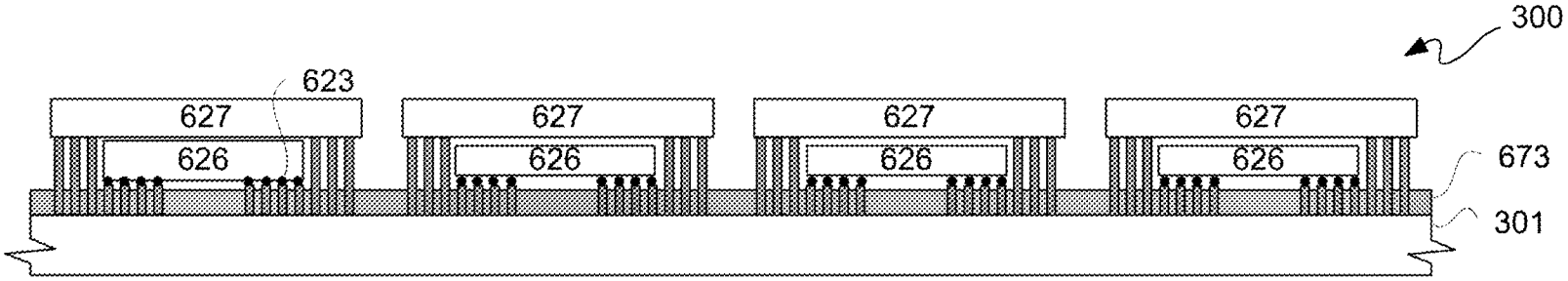

In FIG. 3M, a molding layer 673 may be deposited, such that tips of bond via arrays 324, as well as bond via arrays 323, extend above such molding layer 673. Dies 626 and 627, as described below in additional detail, may be respectively interconnected to bond via arrays 324 and 323 at a wafer-level, such as a silicon wafer for example, or other large substrate 301 level. Dies 626 may be interconnected to tips of corresponding bond via arrays 324 by bumps 623, as described below in additional detail, such as flip-chip bonded for example. Rather than bumps 623, optionally wire bonds may be used. However, for purposes of clarity and not limitation, generally bumps 623 are described hereinbelow. In another configuration, stacked or staggered or progressively larger overlapping dies, such as dies 626 and 627 in DRAM or NAND flash for example, may be interconnected using bond via arrays as described herein. In a staggered stacking, bond via array 324 may extend partially within bond via array 323, as bond via array 324 may extend in at least one direction, such as orthogonally with respect to the sheet of the drawing for example, beyond or outside of bond via array 323. For purposes of clarity by way of example and not limitation, it shall be assumed that bond via array 324 is disposed completely within bond via array 323.

Figure 4A:
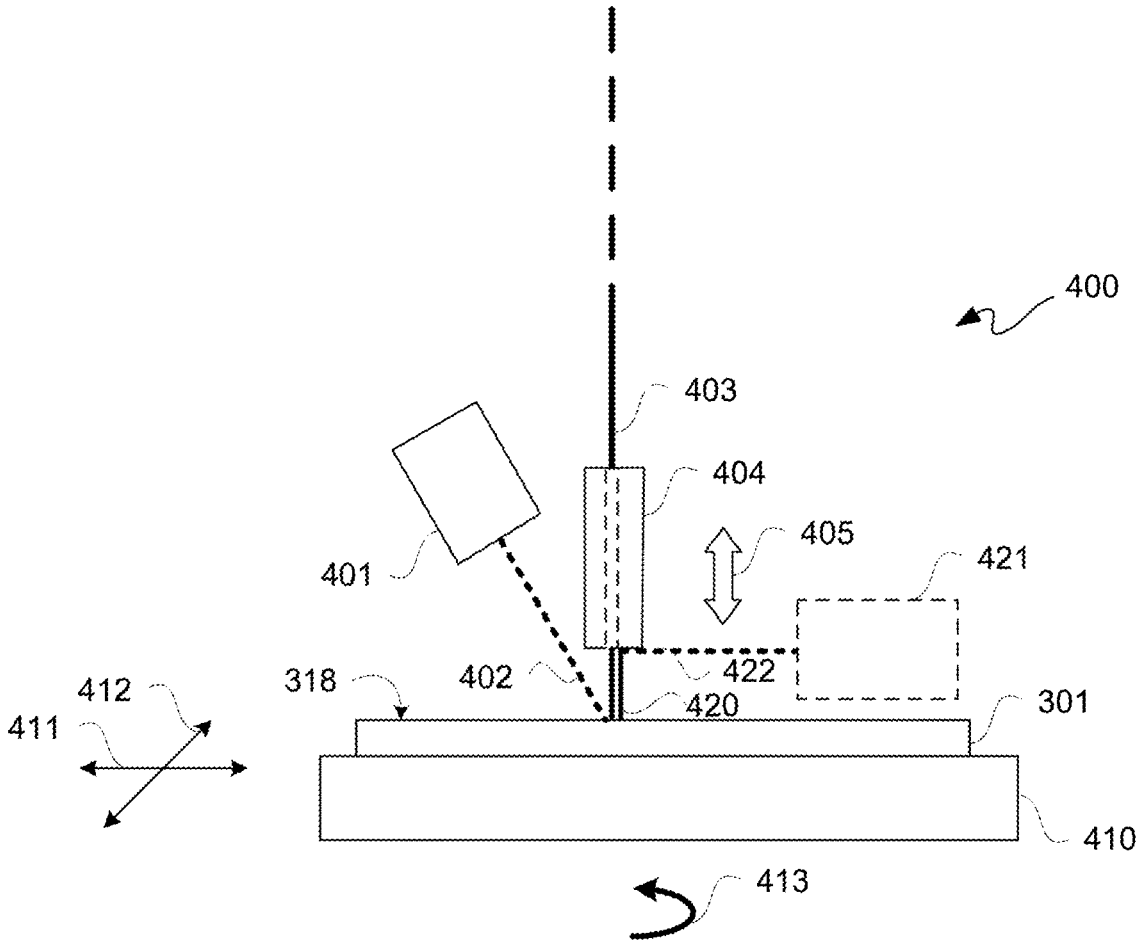
FIG. 4A is a block diagram depicting an exemplary e-beam system.

Optionally, bond via arrays may be formed with e-beam. FIG. 4A is a block diagram depicting an exemplary e-beam system 400. Even though an e-beam is described below, another type of optically provided energy beam may be used, such as a laser beam for example, in other implementations. E-beam system 400 includes an e-beam optical subsystem 401 for controllably generating and projecting an e-beam 402. Wire 403, which may come from a spool housed inside or outside of an e-beam chamber, may be fed into a wire spool control head 404. Wire spool control head 404 may be vertically translated up or down in a z-direction 405 with respect to top surface 318 of substrate 301. Conventionally, e-beam system 400 is computer controlled for determining power level and time to fuse bond wires 420 at a contact zone on top surface 318 of substrate 301. Accordingly, spacing between wires 420 may vary from application to application. Spacing between such wires 420 for a bond via array may be as small as one-diameter of a wire 420 or even smaller.

Wire spool control head 404 may feed wires 403 of various lengths to form bond via arrays of wires 420 of various heights. E-beam 402 may be used to heat ends of such wires 420 for attachment to top surface 318 of substrate 301. Because an e-beam 402 is used for wire bonding, heating is localized so as not to adversely affect other circuitry of substrate 301 or adjacent wire bonds. In other words, a heat affected zone may be so small as to be practically non-existent. Wire spool control head 404 may be configured to precision cut wire 403 for providing such wires 420 of various heights. In this example, a copper wire with a lead (Pb) coating is used for wire 403.

A platen or platform 410, upon which substrate 301 is placed, may be laterally translated in an x-direction 411 and/or y-direction 412. Such translation may be used to provide rows or columns of wires to form bond via arrays with wires of various heights. Furthermore, platform 410 may be rotated 413 for such lateral translation. Optionally, another e-beam optical subsystem 421 or a beam splitting optical subsystem 421 may be used to provide an e-beam 422 for cutting wire 403. With respect to the latter subsystem, such beam splitting optical subsystem 421 may be positioned to split e-beam 402 output from e-beam optical subsystem 401 for providing such optional cutting capability.

Figure 4B:
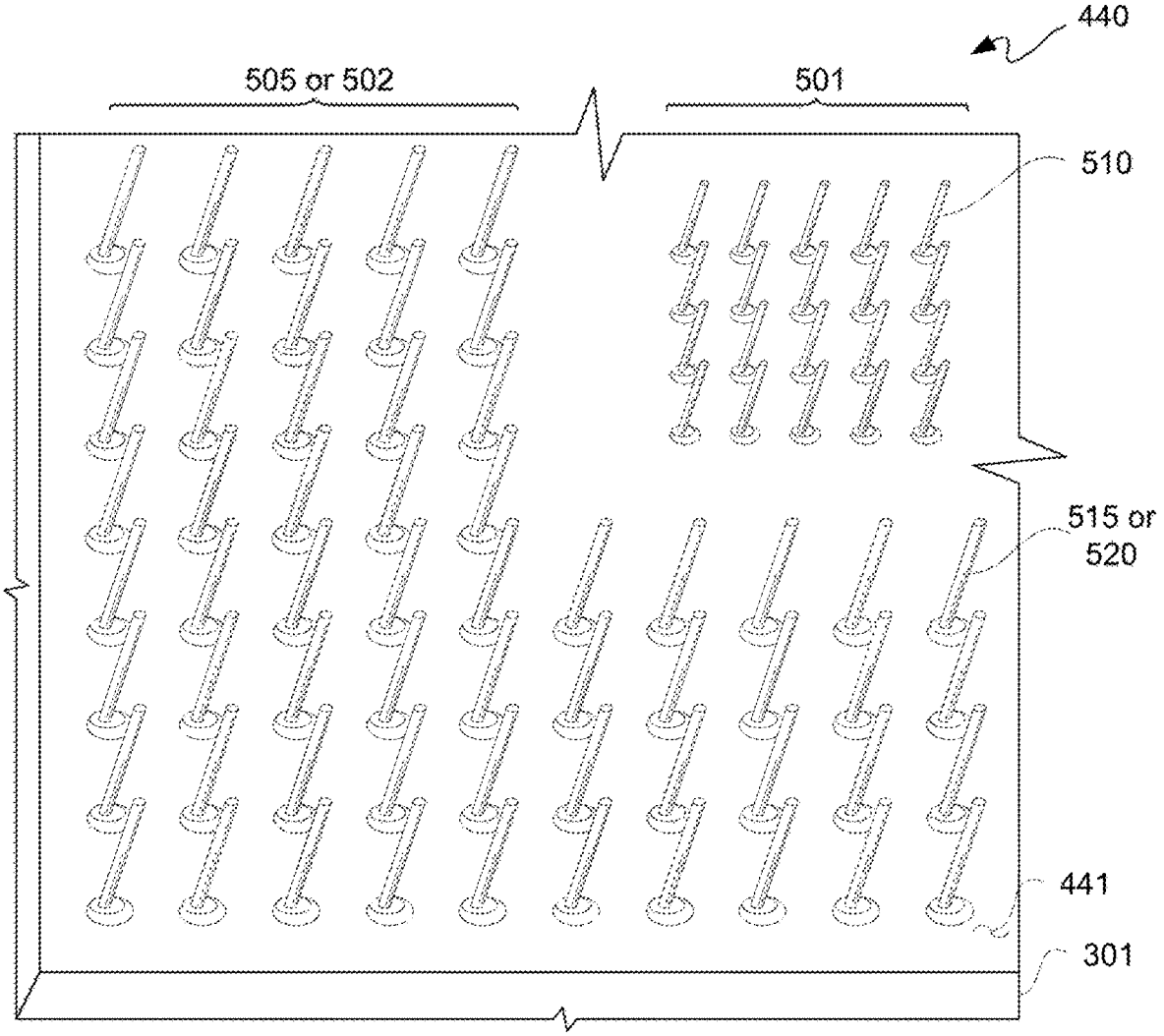
FIG. 4B is a top-down angled perspective view depicting a portion of an exemplary in-process package for a die stack formed using the e-beam system of FIG. 4A.

FIG. 4B is a top-down angled perspective view depicting a portion of an exemplary in-process package 440 for a die stack formed using e-beam system 400 of FIG. 4A. A bond via array 505, or bond via array 502, and 501 may be respectively formed of medium wires 515, or tall wires 520, and short wires 510. In this example, wires 510 and 515 or 520 are fusion bonded to substrate 301 using an e-beam, such as of FIG. 4A. Even though wires 510, 515, and 520 may be at a non-perpendicular angle with respect to surface 441 of a substrate of package 440 to which they are attached or coupled, such as illustratively depicted, in other embodiments such wires may be perpendicular to such surface. Short wires 510 may correspond to short wires 310 of FIG. 3L, and tall wires 520 may correspond to tall wires 320 of FIG. 3L. Medium wires 515 may be between short and tall wires 510 and 520 in height, as described below in additional detail. Wires 510, 515, or 520 may be ball bonded to planar surface 441, such as by EFO wire bonding. Additionally, there may be pads, as well as pad openings, (not shown for purposes of clarity and not limitation) along surface 441.

Even though wire bond wires 510, 515, and 520 are illustratively depicted as being in corresponding arrays, such wires may or may not be in a corresponding array. Accordingly, wire bond wires 510, 515, and/or 520 may be unevenly spaced with respect to corresponding wire bond wires 510, 515, and/or 520. Moreover, wire bond wires 510 and/or wire bonds therefor may have generally different or same dimensions with reference to diameters or widths or cross sections ("cross sectional dimensions") with respect to one another. Likewise, wire bond wires 515 and 520, as well as wire bonds therefor, may have generally different or same diameters or widths or cross sections with respect to one another. Wire bonds of such wire bond wires 510, 515, and/or 520 may be disposed externally on a surface of a substrate and extend away from such surface.

Figure 4C:
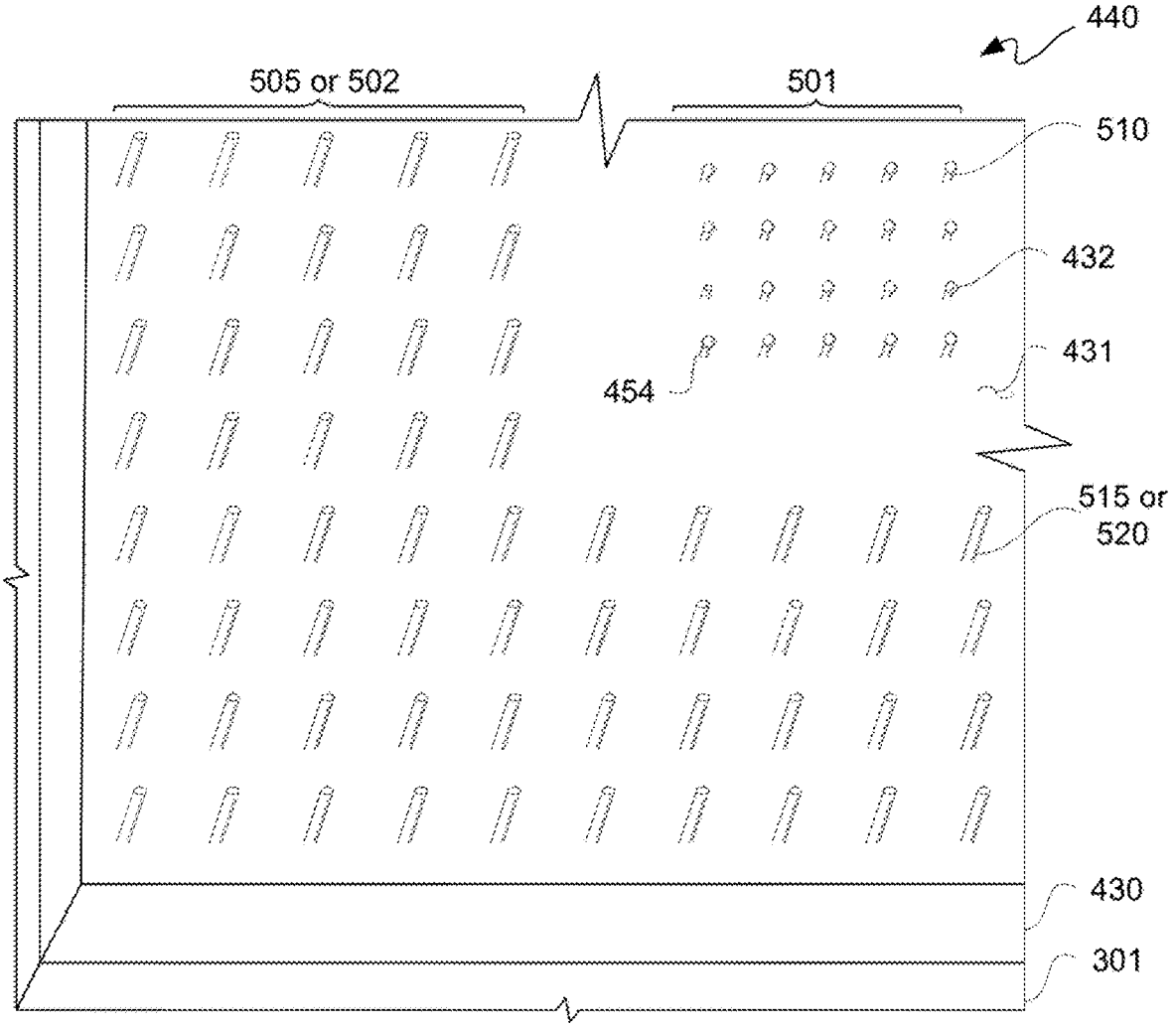
FIG. 4C is the in-process package of FIG. 4B after deposition of a spacer or molding layer onto a top surface of a substrate.

FIG. 4C is the in-process package 440 of FIG. 4B after deposition of a spacer or molding layer 430 onto a top surface of substrate 301. After such deposition, such as described below in additional detail, only top portions of short wires 510, as well as top portions of wires 515 or 520, may extend above a top surface 431 of such spacer layer 430. Along those lines, top ends 432, such as of short wires 510, may be accessible for metallurgical attachment of a die, such as by deposition of solder balls or bumps 454 onto such top ends 432 for reflow for example. In one implementation, a bond structure or structures may be disposed on a die side to be connected or coupled with various wires as described herein.

Figure 5A:
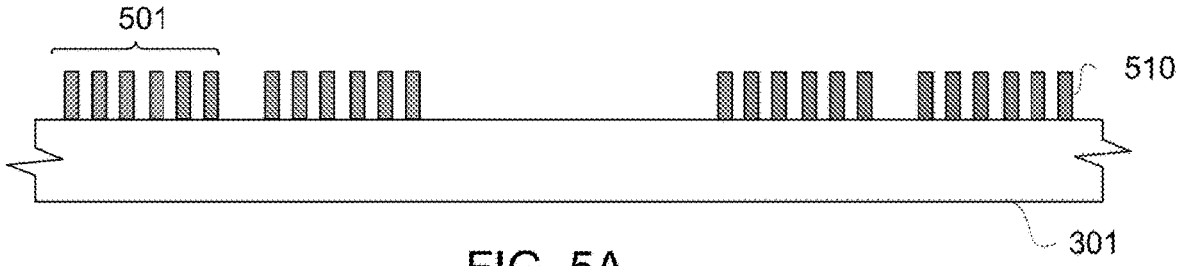
FIGS. 5A through 5D are block diagrams of respective side views of substrates 301 with various exemplary configurations of wires that may be formed using the e-beam system of FIG. 4A or photolithography as generally described with reference to FIGS. 3A through 3M.
Figure 5B:
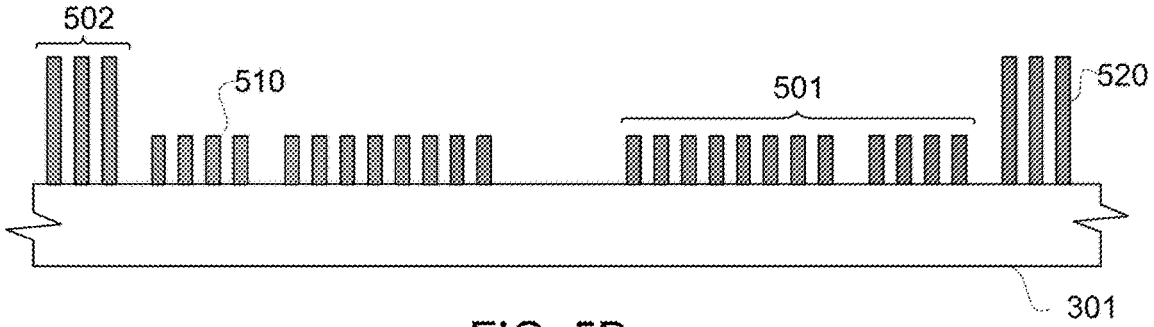

FIGS. 5A through 5D are block diagrams of respective side views of substrates 301 with various exemplary configurations of wires that may be formed using e-beam system 400 of FIG. 4A or photolithography as generally described with reference to FIGS. 3A through 3L. In FIG. 5A, an ultra-high density input/output pitch for a bond via array 501 of short wires 510 extending from substrate 301 is illustratively depicted. Generally, such pitch may be approximately ~0.5 mm or less; though larger pitches than this upper limit may be used in some implementations. Additionally, for example, a pitch as small as 10 microns may be used in some implementations. In FIG. 5B, in addition to bond via arrays 501 as in FIG. 5A, substrate 301 has extending therefrom tall wires 520 to provide a bond via array 502. One or more bond via arrays 501 may be located inside of bond via array 502, which may be used for example by a peripheral I/O. Furthermore, tall wires 520 may be formed of a different material than short wires 510. For example, tall wired 520 may be formed of nickel or tungsten (W) and/or their respective alloys, and short wires may be formed another conductive material as described elsewhere herein.

Figure 5C:
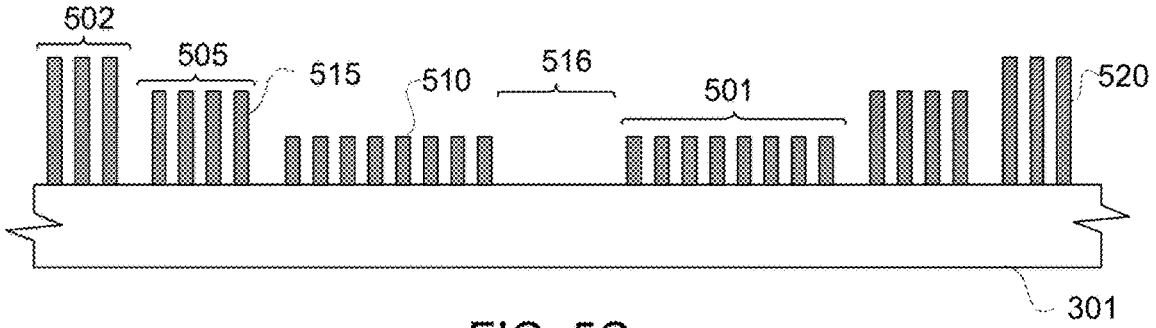
Figure 5D:
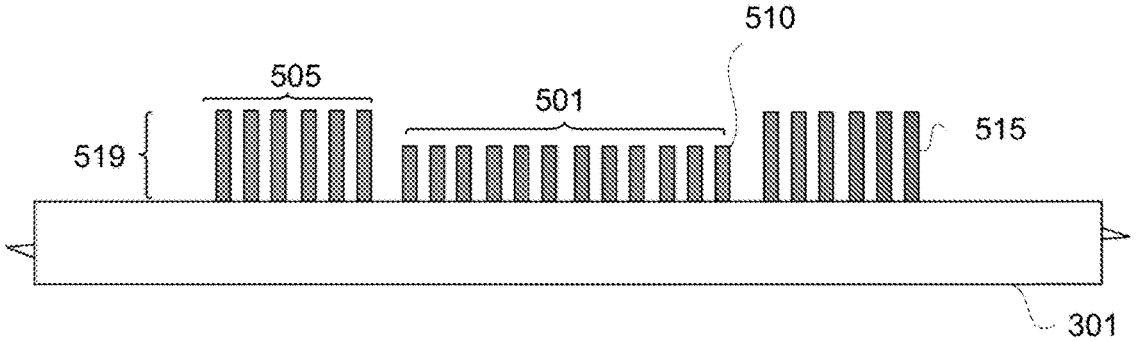
Figure 6A:
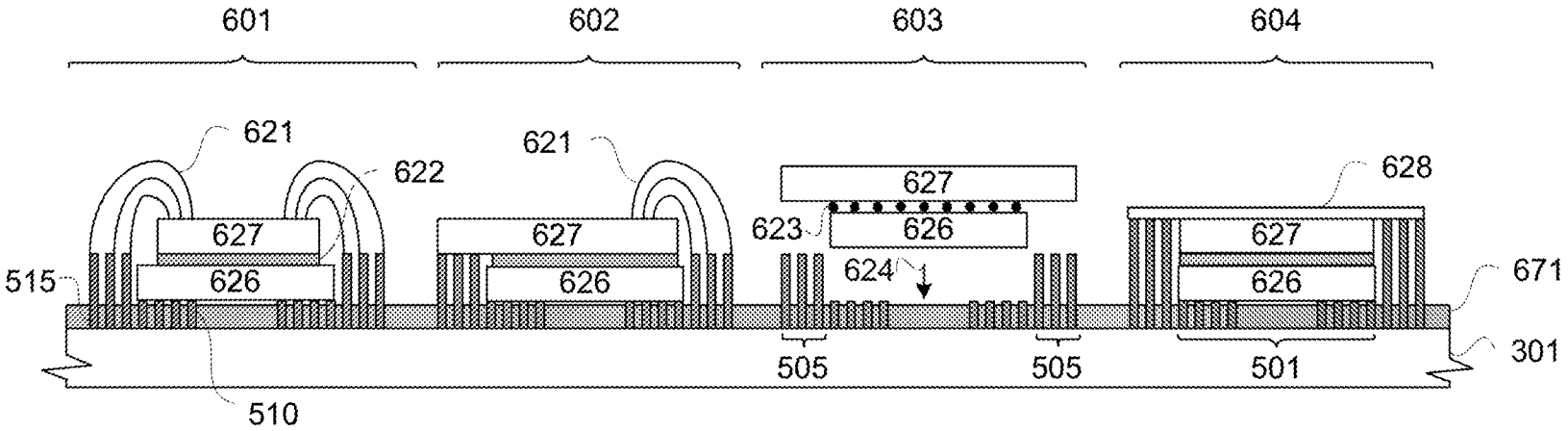
FIGS. 6A through 6D are block diagrams of side views of exemplary package-on-package assemblies ("die stacks") assembled using a substrate having two or more bond via arrays with wires of different heights.
Figure 6B:
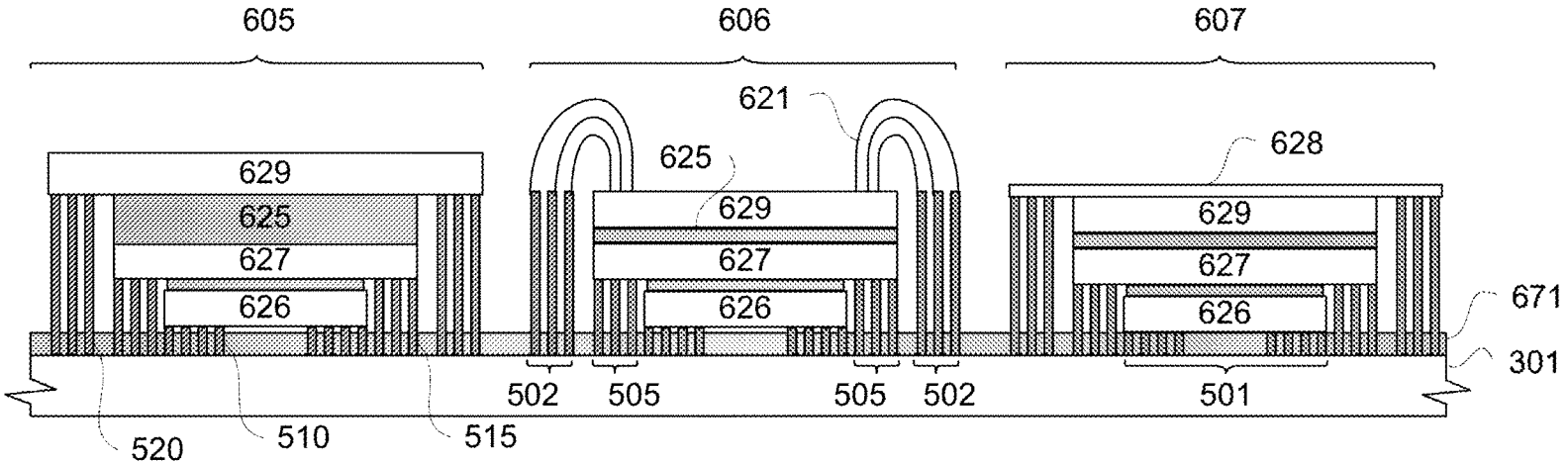
Figure 6C:
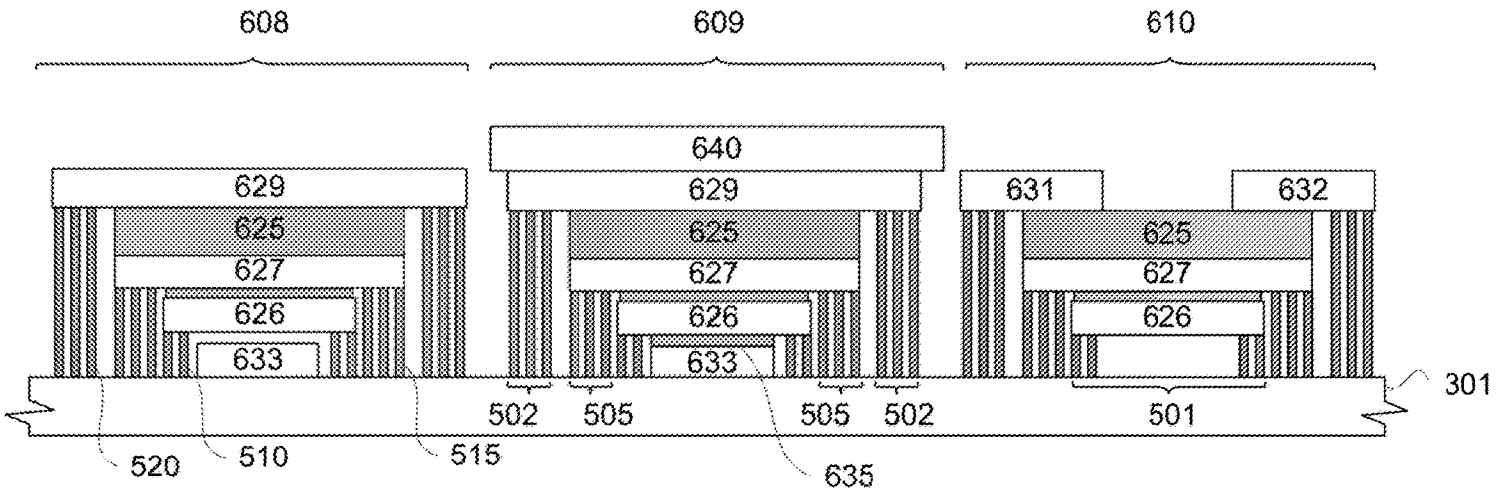
Figure 6D:
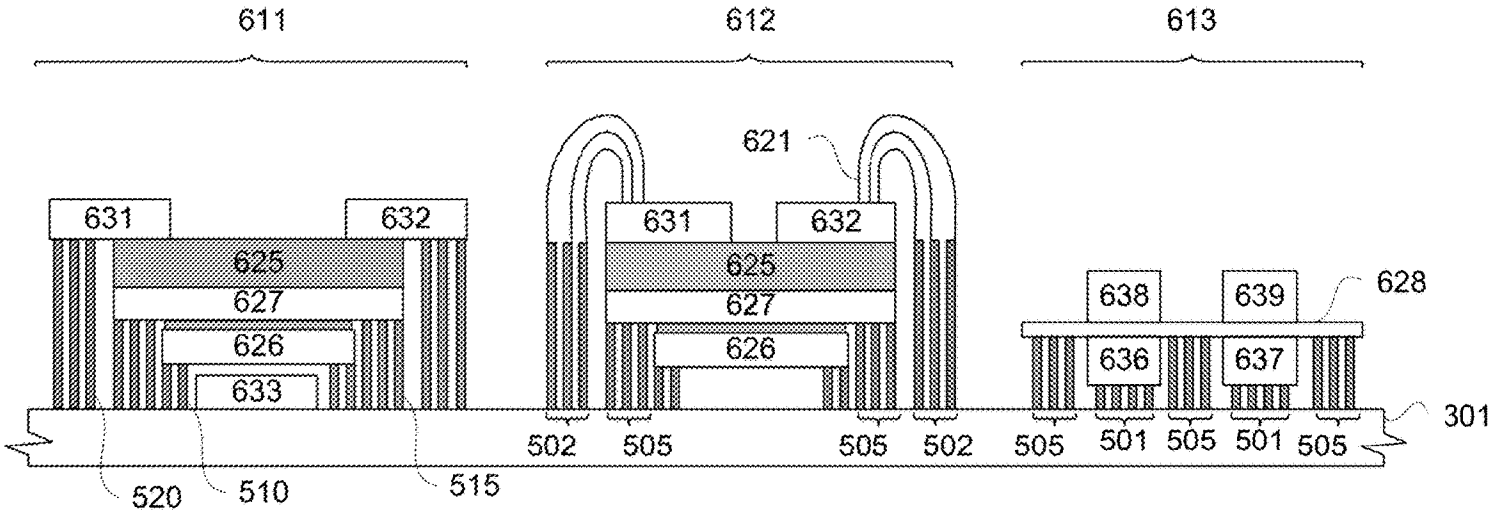

Furthermore, wires of various heights as well as various conductive materials may be used, as generally indicated with reference to FIG. 5C. FIG. 5C includes wires 510 and 520 respectively for bond via arrays 501 and 502 as in FIG. 5B, as well as bond via arrays 505 of "medium" wires 515. Medium wires 515 may have a height 519 which is between heights of wires 510 and 520. Differences in heights as between wires 510, 515, and/or 520 may be to accommodate different thicknesses of one or more dies and/or packages, as well as one or more interfaces therebetween, disposed within an outer bond via array. In the example of FIG. 5C, an inner bond via array 501 has an open middle section 516, and such inner bond via array 501 is within a middle bond via array 505, and such middle bond via array 505 is within an outer bond via array 502. However, bond via arrays may be positioned for close compact stacking too, as illustratively depicted in FIG. 5D, where bond via array 501 has no open middle section 516 and resides within an outer bond via array 505 formed of "middle" wires 515.

FIGS. 6A through 6D are block diagrams of side views of exemplary package-on-package assemblies ("die stacks") 601 through 613 assembled using a substrate 301 having two or more bond via arrays with wires of different heights. Wires of such bond via arrays of die stacks 601 through 613 may be formed using e-beam fusion bonded wires. Optionally, an underfill layer 671 may be deposited on an upper surface of substrate 301 after formation of wires of one or more bond via arrays, as described below in additional detail, such as to provide additional structural support. One or more other underfill layers may follow such underfill layer 671, though they may not be illustratively depicted for purposes of clarity and not limitation. Optionally, underfill layer 671 may be omitted, such as to have a dielectric constant of air and/or to provide for airflow through a package for cooling. FIGS. 6A through 6D are further described with simultaneous reference to FIGS. 5A through 5D, as well as simultaneous reference to FIGS. 6A through 6D.

For die stack 601, short wires 510 of a bond via array 501 coupled to substrate 301 are coupled to a backside surface of a die 626. A front side surface of die 626 may have coupled thereto a spacer layer 622, such as a layer of polymer or an epoxy used for molding and/or encapsulation. A front side surface of a die 627 may be placed on top of such spacer layer 622. A backside surface of die 627 may be wire bonded with wire bonds 621 to top ends of medium wires 515 of a bond via array 505 coupled to substrate 301. In this example, both of dies 626 and 627 are disposed within bond via array 505. In this configuration, die 626 may be referred to as an up or upward facing die, and die 627 may be referred to as a down or downward facing die.

For die stack 602, short wires 510 of a bond via array 501 coupled to substrate 301 are coupled to a backside surface of a die 626. A front side surface of die 626 may have coupled thereto a spacer layer 622. A right side portion of a backside surface of a die 627 may be placed on top of such spacer layer 622 and a left side portion of such backside surface of die 627 may be placed on tops of top ends of a left portion of a bond via array 505 of medium wires 515. A right side portion of a front side surface of die 627 may be wire bonded with wire bonds 621 to top ends of medium wires 515 of a right side portion of bond via array 505 coupled to substrate 301. In this example, both of dies 626 and 627 are upward facing.

For die stack 603, dies 626 and 627 may be attached to one another with intervening bumps or balls ("bumps") 623, such as micro bumps for example. Again, rather than bumps 623, wire bonds may optionally be used. Material for bumps 623 may include one or more of solder, Al, Sn, Ni, Au, Ag, Pb, Bi, Cu, Pt, or the like. For example, bump material may be eutectic Sn/Pb solder, lead-free solder, or high-lead solder. An under bump metallization ("UBM") layer (not shown) and an insulating layer (not shown), as well as other known details for die-to-die interconnect, may be included, though not particularly shown here for purposes of clarity and not limitation. Thus, for example, dies 626 and 627 may be interconnected with a flip-chip, ball grid array ("BGA") or other die-to-die interconnect technology prior to being coupled to substrate 301, as generally indicated by arrow 624. In this example, backside surfaces of dies 626 and 627 face one another. Accordingly, a front side surface of die 626 may be coupled to a bond via array 501, and an un-interconnected portion of such backside surface of die 627 may be coupled to a bond via array 505.

For die stack 604, short wires 510 of a bond via array 501 coupled to substrate 301 are coupled to a backside surface of a die 626. A front side surface of die 626 may have coupled thereto a spacer layer 622. A front side surface of a die 627 may be placed on top of such spacer layer 622. A backside surface of die 627 may be coupled to a redistribution layer ("RDL") 628, which may include one or more metal layers and one or more dielectric layers. Top ends of medium wires 515 of a bond via array 505 coupled to substrate 301 may be coupled to RDL 628 on a same side of die 627 to which RDL 628 is coupled. In this example, both of dies 626 and 627 are disposed within bond via array 505. In this configuration, die 626 is upward facing die, and die 627 is downward facing die.

For die stack 605, short wires 510 of a bond via array 501 coupled to substrate 301 are coupled to a backside surface of a die 626. A front side surface of die 626 may have coupled thereto a spacer layer 622. A backside surface of a die 627 may be placed on top of such spacer layer 622. Top ends of medium wires 515 of a bond via array 505 coupled to substrate 301 may be coupled to such backside surface of die 627, and a front side surface of die 627 may have disposed thereon another spacer layer 625. On top of spacer layer 625 may be disposed a backside surface of a die 629. Top ends of tall wires 520 of a bond via array 502 coupled to substrate 301 may be coupled to such backside surface of die 629. In this example, both of dies 626 and 627 are disposed within bond via array 502. In this configuration, dies 626, 627 and 629 are all upward facing.

Die stack 606 is similar to die stack 605, except generally for the following differences. A backside surface of die 629 may be coupled to RDL 628, and another portion of RDL 628 may be coupled to top ends of tall wires 520 of a bond via array 502 coupled to substrate 301.

Die stack 607 is similar to die stack 606, except generally for the following differences. Rather than wire bonding via wires 621 to top ends of tall wires 520 of a bond via array 502 coupled to substrate 301, and RDL 628 is disposed on an coupled to a top of die 629 and on top ends of wires 520, which coupling may be metallurgical. In this configuration, dies 626 and 627 are upward facing, and die 629 is downward facing.

Die stack 608 is similar to die stack 605, except generally for the following differences. A die 633 is coupled to substrate 301 using a low-profile die-to-die interconnect technology (not shown), such as flip-chip for example. Die 633 is positioned under die 626 and is located within a bond via array 501.

Die stack 609 is similar to die stack 608, except generally for the following differences. A spacer layer 635 is disposed between dies 633 and 626, and a cold plate or other heat sink 640 is coupled to a front side surface of die 629.

Die stack 610 is similar to die stack 608, except generally for the following differences. Die 629 is replaced with dies 631 and 632. A portion of a backside surface of each of dies 631 and 632 is disposed on a spacer layer 625. A left side portion of such backside surface of die 631 is coupled to top ends of tall wires 520 of a left side portion of a bond via array 502, and a right side portion of such backside surface of die 632 is coupled to top ends of tall wires 520 of a right side portion of bond via array 502.

Die stack 611 is similar to die stack 610, except generally for the following differences. A die 633 is added, such as previously described with reference to die stack 608.

Die stack 612 is similar to die stack 610, except generally for the following differences. Dies 631 and 632 have respective front sides thereof on spacer layer 625. Backsides of dies 631 and 632 are respectively wire bonded via wires 621 to top ends of tall wires 520 of a bond via array 502 on left and right side portions respectively thereof.

For die stack 613, separate dies 636 and 637 are coupled to short wires 510 of a bond via array 501. Bond via array 501 is disposed within a bond via array 505; however, in this example a portion of bond via array 505, or a separate bond via array 505, is disposed within bond via array 501. Dies 636 and 637 may have their respective front side surfaces coupled to bond via array 501. An RDL 628 is metallurgically coupled to top ends of bond via array or arrays 505, as well as to respective backside surfaces of dies 636 and 637. A top surface of RDL 628 has metallurgically coupled thereto respective backside surfaces of dies 638 and 639. Dies 638 and 639 may be positioned above dies 636 and 637, respectively.

FIGS. 6E-1 through 6E-9 are block diagrams of side views of exemplary package-on-package assemblies ("die stacks") 603R, 604R, 605R, 607R, 608R, 609R, 610R, 611R, and 613R, each of which may have two or more bond via arrays with wires of different heights. With simultaneous reference to FIGS. 6A through 6D and 6E-1 through 6E-9, die stacks 603R, 604R, 605R, 607R, 608R, 609R, 610R, 611R, and 613R are further described. Generally, die stacks 603R, 604R, 605R, 607R, 608R, 609R, 610R, 611R, and 613R respectively correspond to 603, 604, 605, 607, 608, 609, 610, 611, and 613, except that die stacks 603R, 604R, 605R, 607R, 608R, 609R, 610R, 611R, and 613R may be assembled in a reverse direction or order ("upside down"). Additionally, die stack 607R may have dies 626, 627 and 629 sequentially interconnected using bumps 623, and die stacks 608R and 611R may have dies 633 and 626 interconnected using bumps 623. Additionally, optionally die 627 may include TSVs 667 for interconnect dies 626 and 629 through such TSVs 667. Along those lines, even though bond via arrays or bumps are illustratively depicted in die stacks as described herein, in some implementations such bumps or balls may be switched for bond via arrays, and vice versa. Additionally, in die stack 613R, a bond via array 505 between dies 636 and 637 in die stack 613 may be omitted in die stack 613R. An initial or base die or dies in one or more of die stacks 603R, 604R, 605R, 607R, 608R, 609R, 610R, 611R, and 613R may be an interposer.

Die stacks 603R, 604R, 605R, 607R, 608R, 609R, 610R, 611R, and 613R may be assembled before or after singulation. Furthermore, one or more of die stacks 603R, 604R, 605R, 607R, 608R, 609R, 610R, 611R, and 613R may be coupled to a substrate, such as substrate 301 for example.

FIGS. 7A through 7E-3 are block diagrams of side views depicting several exemplary die stacks 701 through 703, which may in part be commonly formed with reference to FIGS. 7A through 7D. Processing of such die stacks 701 through 703 may be included as part of process flow 300. With simultaneous reference to FIGS. 7A through 7E-3, exemplary die stacks 701 through 703 are further described.

Figure 7A:
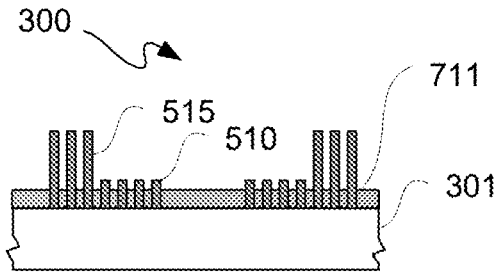
FIGS. 7A through 7E-3 are block diagrams of side views depicting several exemplary die stacks, which may in part be commonly formed with reference to FIGS. 7A through 7D thereof.

At FIG. 7A, to provide a spacer layer 711, an adhesive, encapsulant or molding compound, such as used to provide a spacer layer as previously described, may be deposited, such as by any of a variety of paste printing, transfer molding, liquid encapsulant molding, vacuum laminating, spin coating or other suitable application. Spacer layer 711 may be formed over substrate 301 such that such molding compound surrounds wires 510 and 515, with top portions thereof extending above an upper surface of spacer layer 711. Spacer layer 711 may provide additional support for wires 510, as well as subsequently wires 515, for attachment of a die.

Figure 7B:
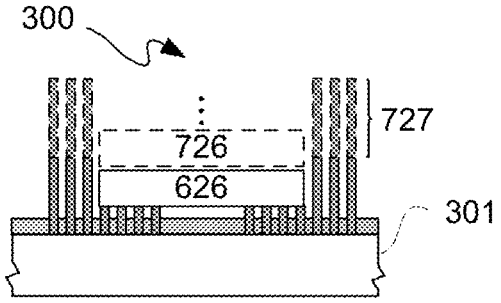

At FIG. 7B, a die 626 may be attached to top ends of short wires 510. Even though attachment of a single die 626 is described below in additional detail, a stack of dies, such as die 626 and another die 726, as well as other die, may optionally be coupled to one another in a stack. In such an implementation, longer outer BVA wires, as generally indicated by optional lengths 727, may be used to accommodate a die stack. In one implementation, the stack of dies over die 626 may be couple to another via through die connectors or electrodes or TSVs.

Figure 7C:
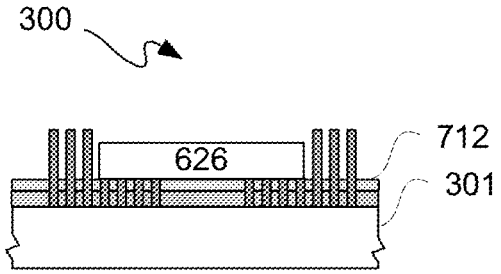

At FIG. 7C, an underfill layer 712 may be deposited so as to be disposed over spacer layer 711, as well as under die 626. Optionally, underfill layer 712 may be deposited after spacer layer 711 is deposited but before attachment of die 626. At FIG. 7D, another spacer layer 713 may be deposited, such as previously described with reference to spacer layer 711, so as to surround a sidewall or sidewalls of die 626, as well as to be disposed around medium wires 515. Top portions of medium wires 515 extend above an upper surface of spacer layer 713.

Figure 7D:
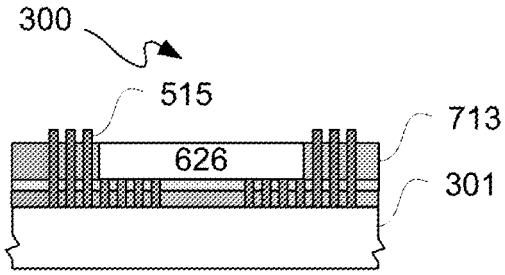
Figures 1, 7E:
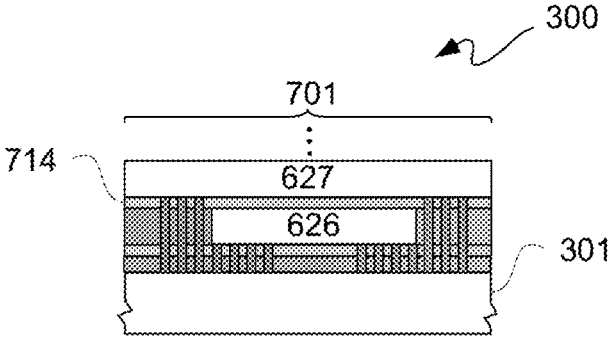

For die stack 701, at FIG. 7E-1 a die 627 may be coupled to such top portions of medium wires of FIG. 7D, and subsequent thereto another underfill layer 714 may be deposited under die 627. Optionally, one or more other dies 627 may be part of such die stack 701.

Figures 2, 7E:
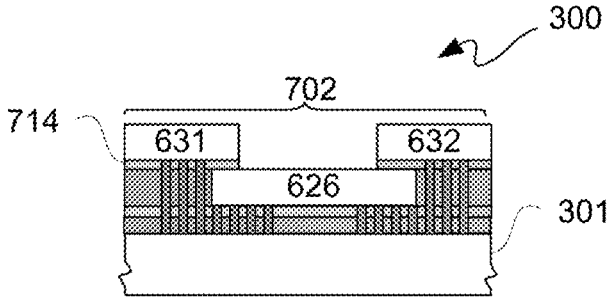

For die stack 702, at FIG. 7E-2 dies 631 and 632 may respectively be coupled to such top portions of medium wires of FIG. 7D, and subsequent thereto an underfill layer 714 may be deposited under dies 631 and 632.

Figures 3, 7E:
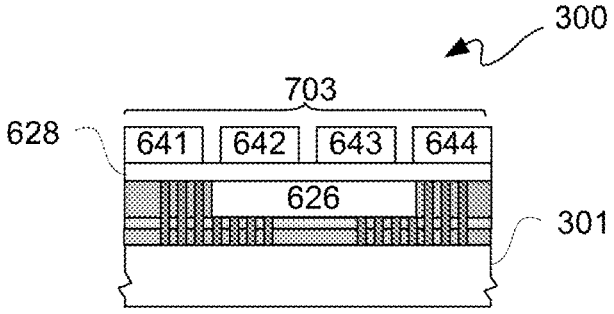

For die stack 703, at FIG. 7E-3 an RDL 628 may respectively be coupled to top portions of medium wires of FIG. 7D, and be metallurgically coupled to die 626. One or more dies 641 through 644 may be metallurgically coupled to a top surface of RDL 628.

Accordingly, it should be understood that substrate 301 may be a wafer for wafer-level packaging, or substrate 301 may be an individual package substrate for chip-level packaging. It should further be understood that multiple wires of varying diameters and lengths may be used. Along those lines, generally short wires may have a length in a range of approximately 0.01 to 0.1 mm, a diameter in a range of approximately 0.01 to 0.1 mm, and a pitch in a range of approximately less than 0.5 mm. Generally medium wires may have a length in a range of approximately 0.05 to 0.5, a diameter in a range of approximately 0.01 to 0.1 mm, and a pitch in a range of approximately 0.01 to 0.5. Generally tall wires may have a length in a range of approximately 0.1 to 1 mm, a diameter in a range of approximately 0.01 to 0.2, and a pitch in a range of approximately 0.01 to 0.5. Additionally, such short, medium and tall wires may be made of different materials for different conductivities and/or varying e-moduli. Such wires may be formed with e-beam may have minimal intermetallic formation with fast fusion bonding, minimal thermal preload on a package, and/or reduced stress in a package. Furthermore, such wires formed with e-beam or with photolithography may be vertical wires for densely packed bond via arrays.

Generally, wires, such as wires 510, 515, and 520 are vertical within +/−3 degrees with respect to being perpendicular to a top surface 318 of substrate 301. However, such wires need not be formed with such verticality in other implementations.

Figure 8A:
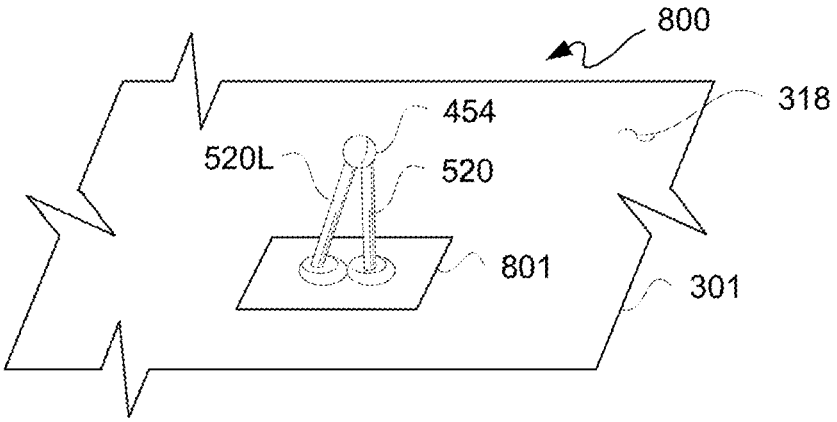
FIGS. 8A and 8B are respective top-down perspective views depicting exemplary angled wire configurations.
Figure 8B:
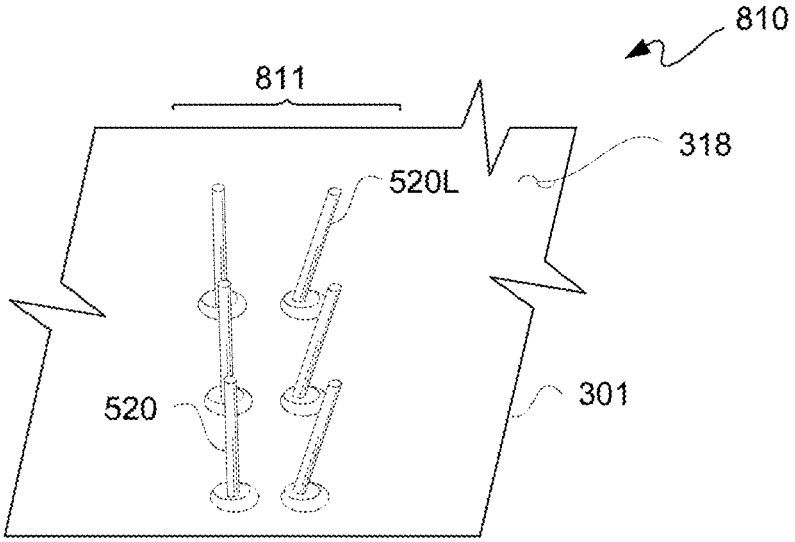

FIGS. 8A and 8B are respective top-down perspective views depicting exemplary angled wire configurations 800 and 810. In angled wire configuration 800, an angled tall wire 520L and a tall wire 520 are fuse bonded to a same landing pad 801 on a top surface 318 of substrate 301. A solder ball or bump 454 may be commonly deposited on top ends of such wires 520L and 520. In this angled wire configuration 800, which may be used for a high-power, a robust ground or supply, or other application, angled tall wire 520L may generally be in a range of approximately less than 90 degrees with respect to top surface 318. In angled wire configuration 810, a bond via array 811 includes angled tall wires 520L, as well as vertical tall wires 520. Angled tall wires 520 may be used to extend to a different die than tall wires 520, to provide a wire bonding surface separate from vertical tall wires 520 which may be coupled to a die or RDL, or other application. Along the above lines, at least one bond via array, whether for tall, medium, or short wires, may have a portion of such wires thereof being angled wires, such as angled wires 520L for example.

Figure 9A:
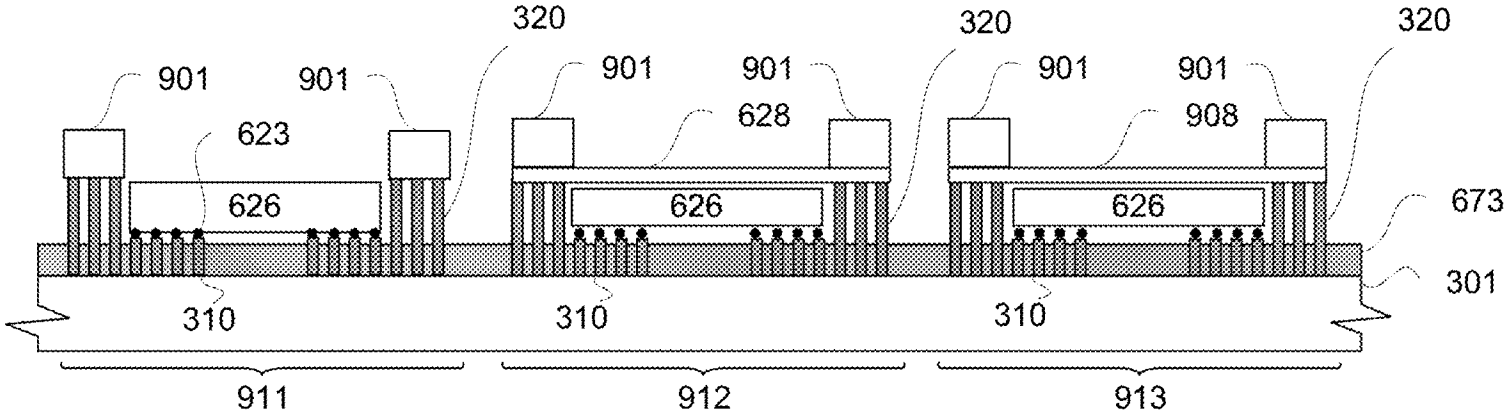
FIGS. 9A and 9B are respective block diagrams of side views of exemplary in-process bond via array configurations.
Figure 9B:
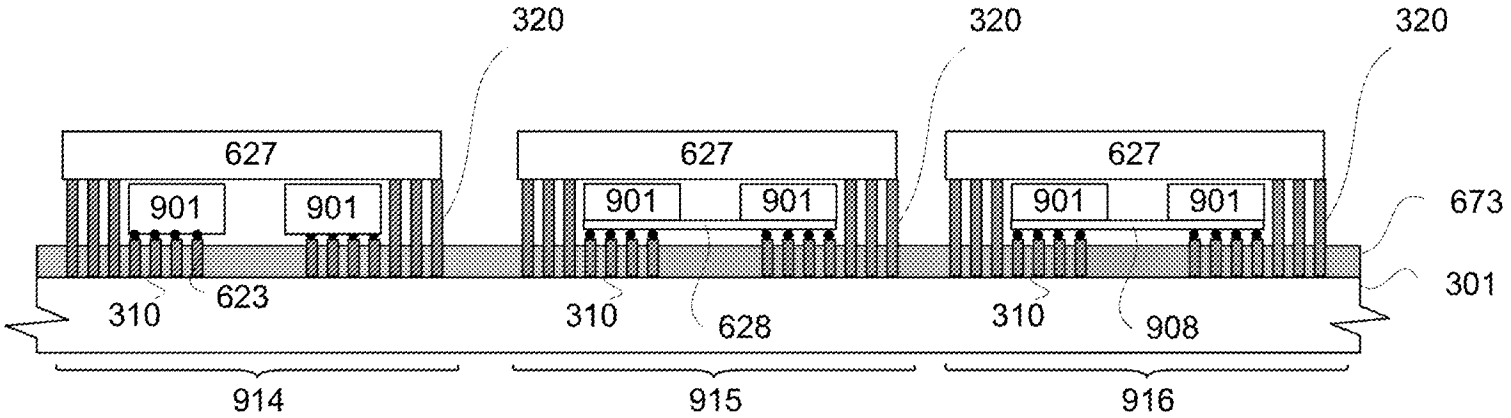

FIGS. 9A and 9B are block diagrams of side views of exemplary in-process bond via array configurations 911 through 913 and 914 through 916, respectively. FIGS. 9A and 9B are described together, as portions of each may be used in a device.

Along those lines, two or more of same instances or combinations of different instances of bond via array configurations 911 through 916 may be disposed on a common substrate 301. Each of bond via array configurations 911 through 916 includes two bond via arrays with wires 310 and 320 of different heights, as previously described. In these examples, short wires 310 and tall wires 320 are used; however, other combinations of wires may be used in other examples in accordance with the above description.

Bond via array configuration 911 includes a die 626 coupled to an inner bond via array formed of wires 310. An outer bond via array formed of wires 320, in which such inner bond via array is located, has coupled thereto one or more electronic components 901. Die 626 may be coupled to one or more electronic components 901 via wires 310 and 320, as well as by bumps 623 and substrate 301 such as previously described. Electronic components 901 may be above die 626.

Electronic components 901 are discrete components or devices. Electronic components 901 may be active, passive, or electromechanical components. For purposes of clarity by way of example and not limitation, it shall be assumed that electronic components 901 are passive components. Examples of passive components include one or more capacitors ("C") including arrays and networks thereof, one or more resistors ("R") including arrays and networks thereof, one or more magnetic devices including inductors ("L"), RC networks, LC networks, RLC networks, transducers, sensors, detectors, and antennas, among others. Examples of active components include transistors, optoelectronic devices, and diodes, among others.

Bond via array configuration 912 includes a die 626 coupled to an inner bond via array formed of wires 310. An outer bond via array formed of wires 320, in which such inner bond via array is located, has coupled thereto an RDL 628. Coupled to RDL 628 may be one or more electronic components 901. Die 626 may be coupled to one or more electronic components 901 via wires 310 and 320 and RDL 628, as well as by bumps 623 and substrate 301 such as previously described. Electronic components 901 may be above die 626, and RDL 628 may be over die 626 by bridging wires 320 of a bond via array thereof.

Bond via array configuration 913 includes a die 626 coupled to an inner bond via array formed of wires 310. An outer bond via array formed of wires 320, in which such inner bond via array is located, has coupled thereto an interposer 908. Coupled to interposer 908 may be one or more electronic components 901. Again, die 626 may be coupled to one or more electronic components 901 via wires 310 and 320 and interposer 908, as well as by bumps 623 and substrate 301 such as previously described. Electronic components 901 may be above die 626, and interposer 908 may be over die 626 by bridging wires 320 of a bond via array thereof.

In bond via array configurations 911 through 913, electronic components 901 are disposed outside of a perimeter of an inner die 626. With respect to bond via array configurations 911 through 913, at least one electronic component 901 is at least partially disposed outside of an inner bond via array, and a die 626 is at least partially disposed within an outer bond via array. However, in bond via array configurations 914 through 916, at least one electronic component 901 is disposed at least partially within an outer bond via array, as well as disposed within an outside perimeter of upper die 627.

Bond via array configuration 914 includes a die 627 coupled to an outer bond via array formed of wires 320. An inner bond via array formed of wires 310, located within such outer bond via array, may have coupled thereto one or more electronic components 901. Die 627 may be coupled to one or more electronic components 901 via wires 310 and 320, as well as by bumps 623 and substrate 301 such as previously described. Electronic components 901 may be below die 627, and die 627 may be over one or more electronic components 901 by bridging wires 320 of a bond via array thereof.

Bond via array configuration 915 includes a die 627 coupled to an outer bond via array formed of wires 320. An inner bond via array formed of wires 310, located within such outer bond via array, may have coupled thereto an RDL 628. RDL 628 may have coupled thereto one or more electronic components 901. Die 627 may be coupled to one or more electronic components 901 via wires 310 and 320 and RDL 628, as well as by bumps 623 and substrate 301 such as previously described. Electronic components 901 may be below die 627, and die 627 may be over one or more electronic components 901 by bridging wires 320 of a bond via array thereof.

Bond via array configuration 916 includes a die 627 coupled to an outer bond via array formed of wires 320. An inner bond via array formed of wires 310, located within such outer bond via array, may have coupled thereto an interposer 908. Interposer 908 may have coupled thereto one or more electronic components 901. Die 627 may be coupled to one or more electronic components 901 via wires 310 and 320 and interposer 908, as well as by bumps 623 and substrate 301 such as previously described. Electronic components 901 may be below die 627, and die 627 may be over one or more electronic components 901 by bridging wires 320 of a bond via array thereof.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

[1. An apparatus, comprising:
a first substrate having a conductive layer;
first plated conductors in a first region extending from a surface of the conductive layer;
second plated conductors in a second region extending from the surface of the conductive layer;
wherein the first plated conductors and the second plated conductors are external to the first substrate;
wherein the first region is disposed at least partially within the second region;
wherein the first plated conductors are of a first height;
wherein the second plated conductors are of a second height greater than the first height;
a second substrate coupled to first ends of the first plated conductors;
the second substrate having at least one electronic component coupled thereto;
a die coupled to second ends of the second plated conductors; and
the die located over the at least one electronic component.]

[2. The apparatus according to claim 1, wherein the at least one electronic component includes a discrete passive component.]

[3. The apparatus according to claim 2, wherein the second substrate includes a redistribution layer.]

[4. The apparatus according to claim 2, wherein the second substrate includes an interposer.]

[5. The apparatus according to claim 1, wherein the second substrate includes a redistribution layer.]

[6. The apparatus according to claim 5, wherein the at least one electronic component includes a network of two discrete passive components selected from a resistor, a capacitor, or an inductor coupled to the redistribution layer.]

[7. The apparatus according to claim 1, wherein the second substrate includes an interposer.]

[8. The apparatus according to claim 7, wherein the at least one electronic component includes a network of two discrete passive components selected from a resistor, a capacitor, or an inductor coupled to the interposer.]

[9. The apparatus according to claim 1, wherein:
the first plated conductors include a first plated layer; and
the second plated conductors include the first plated layer and a second plated layer thereover.]

[10. An apparatus, comprising:
a first substrate having a conductive layer;
first plated conductors in a first region extending from a surface of the conductive layer;
second plated conductors in a second region extending from the surface of the conductive layer;
wherein the first plated conductors and the second plated conductors are external to the first substrate;
wherein the first region is disposed at least partially within the second region;
wherein the first plated conductors are of a first height;
wherein the second plated conductors are of a second height greater than the first height;
a die coupled to first ends of the first plated conductors;
a second substrate coupled to second ends of the second plated conductors;
the second substrate having at least one electronic component coupled thereto; and
the second substrate located over the die.]

[11. The apparatus according to claim 10, wherein the at least one electronic component includes a discrete passive component.]

[12. The apparatus according to claim 11, wherein the second substrate includes a redistribution layer.]

[13. The apparatus according to claim 11, wherein the second substrate includes an interposer.]

[14. The apparatus according to claim 10, wherein the second substrate includes a redistribution layer.]

[15. The apparatus according to claim 14, wherein the at least one electronic component includes a network of two discrete passive components selected from a resistor, a capacitor, or an inductor coupled to the redistribution layer.]

[16. The apparatus according to claim 10, wherein the second substrate includes an interposer.]

[17. The apparatus according to claim 16, wherein the at least one electronic component includes a network of two discrete passive components selected from a resistor, a capacitor, or an inductor coupled to the interposer.]

[18. The apparatus according to claim 10, wherein:
the first plated conductors include a first plated layer; and
the second plated conductors include the first plated layer and a second plated layer thereover.]

[19. A method, comprising:
obtaining a first substrate;
forming a conductive layer on an upper surface of the first substrate;
forming a first resist layer on the conductive layer;
patterning the first resist layer to provide a first mask with first vias from an upper surface of the first resist layer down to an upper surface of the conductive layer;
through-mask plating in the first vias to provide first plated conductors in a first region extending from the upper surface of the conductive layer;
forming a second resist layer over the first plated conductors;
patterning the second resist layer to provide a second mask with second vias from an upper surface of the second resist layer down to upper surfaces of a subset of the first plated conductors;

through-mask plating in the second vias to provide second plated conductors in a second region extending down to the upper surfaces of and including the subset of the first plated conductors;

removing the first resist layer and the second resist layer;

removing portions of the conductive layer between the first plated conductors and the second plated conductors;

wherein the first plated conductors and the second plated conductors are external to the first substrate;

wherein the first region is disposed at least partially within the second region;

wherein the first plated conductors are of a first height;

wherein the second plated conductors are of a second height greater than the first height;

coupling a second substrate to first ends of the first plated conductors;

the second substrate having at least one electronic component coupled thereto;

coupling a die to second ends of the second plated conductors; and wherein the die is located over the at least one electronic component.]

[20. The method according to claim 19, wherein:

the first conductive layer is a seed layer or an adhesion layer; and the removing of the first resist layer precedes the forming of the second resist layer.]

*21. An apparatus, comprising:*

*an interconnection component;*

*first plated conductors on a first region of a surface of the interconnection component, first ends of the first plated conductors directly coupled to the surface of the interconnection component;*

*second plated conductors on a second region of the surface of the interconnection component, first ends of the second plated conductors directly coupled to the surface of the interconnection component;*

*wherein:*

*the first plated conductors and the second plated conductors are external to the interconnection component;*

*the first region is disposed at least partially within the second region;*

*the first plated conductors are of a first height; and*

*the second plated conductors are of a second height greater than the first height;*

*a die coupled to second ends of the first plated conductors;*

*a laminate substrate coupled to ends of the second plated conductors; and*

*first and second electronic components electrically connected to at least some of the second plated conductors, wherein:*

*the first and second electronic components are disposed side-by-side; and*

*a space between the first and second electronic components overlies the die.*

*22. The apparatus of claim 21, further comprising a support layer disposed on the surface of the interconnection component, wherein at least a portion of the second plated conductors is within the support layer.*

*23. The apparatus of claim 22, further comprising a spacer over a back surface of the die, the spacer being formed separately from the support layer.*

*24. The apparatus of claim 22, further comprising a spacer over a back surface of the die, the spacer being formed of a first material different than a second material used to form the support layer.*

*25. The apparatus of claim 21, further comprising an underfill layer disposed between the die and the first and second electronic components.*

*26. The apparatus of claim 21, further comprising an underfill layer disposed between the die and the laminate substrate.*

*27. The apparatus of claim 21, wherein the first and second electronic components are electrically connected to the die via at least the first plated conductors.*

*28. The apparatus of claim 21, wherein the interconnection component comprises a redistribution layer.*

*29. The apparatus of claim 21, further comprising bump or ball interconnects disposed between and coupling the laminate substrate and the second ends of the second plated conductors.*

*30. An apparatus, comprising:*

*an interconnection component;*

*first plated conductors on a first region of a surface of the interconnection component, the first plated conductors directly coupled to the surface of the interconnection component;*

*second plated conductors on a second region of the surface of the interconnection component, the second plated conductors directly coupled to the surface of the interconnection component;*

*wherein:*

*the first plated conductors and the second plated conductors are external to the interconnection component;*

*the first region is disposed at least partially within the second region;*

*the first plated conductors have a first height; and*

*the second plated conductors have a second height greater than the first height;*

*a die coupled to ends of the first plated conductors;*

*a first electronic component electrically connected to at least some of the second plated conductors and located above the die;*

*a second electronic component electrically connected to at least some of the second plated conductors and located above the die, wherein the first electronic component and the second electronic component are side-by-side and a space between the first electronic component and the second electronic component overlies the die;*

*a first insulating material covering at least a portion of a face of the die;*

*a second insulating material covering at least a portion of a back of the die; and*

*a molding layer encapsulating at least a portion of the second plated conductors and at least a portion of a side surface of the die, wherein the molding layer is formed separately from the first and second insulating material.*

*31. The apparatus of claim 30, wherein the first electronic component is electrically connected to the die via at least the first plated conductors.*

*32. The apparatus of claim 30, wherein the interconnection component comprises a redistribution layer.*

*33. The apparatus of claim 30, wherein the die is electrically connected to the first and second electronic components via at least the first plated conductors.*

*34. An apparatus, comprising:*

*an interconnection component;*

*first plated conductors on a first region of a surface of the interconnection component, first ends of the first plated conductors directly coupled to the surface of the interconnection component;*

*second plated conductors on a second region of the surface of the interconnection component, first ends of the second plated conductors directly coupled to the surface of the interconnection component;*

*wherein:*

*the first plated conductors and the second plated conductors are external to the interconnection component;*

*the first region is disposed at least partially within the second region;*

*the first plated conductors have a first height in a first direction; and*

*the second plated conductors have a second height in the first direction greater than the first height;*

*a first die coupled to second ends of the first plated conductors;*

*a laminate substrate coupled to second ends of the second plated conductors; and*

*a second die electrically connected to at least some of the second plated conductors and located over the first die, wherein a first portion of the second die overlaps the first die and a second portion of the second die extends past an edge of the first die in a second direction perpendicular to the first direction.*

*35. The apparatus of claim 34, wherein the second die is electrically connected to the first die via at least the first plated conductors.*

*36. The apparatus of claim 34, wherein the interconnection component comprises a redistribution layer.*

*37. The apparatus of claim 34, wherein the apparatus further comprises a third die electrically connected to at least some of the second plated conductors and located above the first die.*

*38. The apparatus of claim 37, wherein the second die and the third die are side-by-side and a space between the second die and the third die overlies the first die.*

*39. The apparatus of claim 37, wherein the first die is electrically connected to the second die and the third die via at least the first plated conductors.*

*40. The apparatus of claim 34, further comprising bump or ball interconnects disposed between and coupling the laminate substrate and the second ends of the second plated conductors.*

* * * * *